United States Patent
Kang et al.

(10) Patent No.: US 11,944,002 B2
(45) Date of Patent: Mar. 26, 2024

(54) ORGANIC LIGHT-EMITTING DEVICE AND FLAT DISPLAY APPARATUS INCLUDING THE SAME

(71) Applicant: Samsung Display Co., Ltd., Yongin-si (KR)

(72) Inventors: Namsu Kang, Yongin-si (KR); Jin Kim, Yongin-si (KR); Dongkyu Lee, Yongin-si (KR); Hyunshik Lee, Yongin-si (KR); Jungho Choi, Yongin-si (KR); Jaehoon Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 557 days.

(21) Appl. No.: 17/004,558

(22) Filed: Aug. 27, 2020

(65) Prior Publication Data

US 2021/0066618 A1 Mar. 4, 2021

(30) Foreign Application Priority Data

Sep. 3, 2019 (KR) .......................... 10-2019-0108937

(51) Int. Cl.
*H10K 85/00* (2023.01)
*H10K 85/60* (2023.01)
*H10K 50/11* (2023.01)
*H10K 50/15* (2023.01)
*H10K 50/16* (2023.01)
*H10K 50/19* (2023.01)
*H10K 101/10* (2023.01)
*H10K 101/30* (2023.01)

(52) U.S. Cl.
CPC ......... *H10K 85/631* (2023.02); *H10K 85/626* (2023.02); *H10K 85/654* (2023.02); *H10K 50/11* (2023.02); *H10K 50/15* (2023.02); *H10K 50/16* (2023.02); *H10K 50/19* (2023.02); *H10K 2101/10* (2023.02); *H10K 2101/30* (2023.02)

(58) Field of Classification Search
CPC .. H10K 85/631; H10K 85/626; H10K 85/654; H10K 50/11; H10K 50/15; H10K 50/16; H10K 50/19; H10K 2101/10; H10K 2101/30; H10K 85/324; H10K 85/6572; H10K 59/12; H10K 85/615; H10K 50/14; H10K 85/6574
USPC ....................................................... 428/690
See application file for complete search history.

(56) References Cited

U.S. PATENT DOCUMENTS

| | | |
|---|---|---|
| 6,278,236 B1 | 8/2001 | Madathil et al. |
| 7,075,231 B1 | 7/2006 | Liao et al. |
| 7,273,663 B2 | 9/2007 | Liao et al. |
| 7,683,536 B2 | 3/2010 | Forrest et al. |
| 8,203,264 B2 | 6/2012 | Kang et al. |
| 8,283,054 B2 | 10/2012 | Spindler et al. |
| 8,809,863 B2 | 8/2014 | Kim et al. |
| 8,841,003 B2 | 9/2014 | Arakane et al. |
| 9,761,823 B2 | 9/2017 | Jeon et al. |
| 2011/0133227 A1 | 6/2011 | Lee et al. |
| 2016/0056403 A1 | 2/2016 | Kim et al. |
| 2016/0248034 A1 | 8/2016 | Kim et al. |
| 2017/0279055 A1 | 9/2017 | Jang et al. |
| 2018/0114914 A1* | 4/2018 | Frey ..................... H10K 85/626 |
| 2018/0118742 A1 | 5/2018 | Joo et al. |
| 2018/0123071 A1 | 5/2018 | Kim et al. |
| 2019/0013492 A1 | 1/2019 | Jankus et al. |
| 2019/0019961 A1* | 1/2019 | Heo ..................... C07D 251/24 |
| 2019/0157600 A1 | 5/2019 | Park et al. |
| 2019/0173035 A1 | 6/2019 | Park |
| 2019/0198797 A1 | 6/2019 | Seo et al. |

(Continued)

FOREIGN PATENT DOCUMENTS

| | | |
|---|---|---|
| JP | 2007-164183 | 6/2007 |
| JP | 2011-119251 A | 6/2011 |
| KR | 10-0822569 B1 | 4/2008 |
| KR | 10-2012-0027157 A | 3/2012 |
| KR | 10-1134412 B1 | 4/2012 |
| KR | 10-2013-0014860 A | 2/2013 |
| KR | 10-1255871 B1 | 4/2013 |
| KR | 10-2016-0024349 A | 3/2016 |
| KR | 10-2016-0043891 A | 4/2016 |
| KR | 10-2016-0103596 A | 9/2016 |
| KR | 10-2017-0030364 A | 3/2017 |

(Continued)

OTHER PUBLICATIONS

CAS reg. No. 1916497-71-6, May 23, 2016. (Year: 2016).*
CAS reg. No. 2022935-32-4, Nov. 1, 2016. (Year: 2016).*

*Primary Examiner* — Douglas J McGinty
(74) *Attorney, Agent, or Firm* — Lewis Roca Rothgerber Christie LLP

(57) ABSTRACT

The present application relates to an organic light-emitting device and a flat display apparatus including the same. An organic light-emitting device includes: a first electrode; a second electrode facing the first electrode; light-emitting units in the number of m between the first electrode and the second electrode; and charge generation layers in the number of m−1 respectively between each pair of adjacent light-emitting units among the light-emitting units in the number of m, each charge generation layer including an n-type charge generation layer and a p-type charge generation layer, wherein m is an integer of 3 or more, the light-emitting units in the number of m each include a hole transport region, an emission layer, and an electron transport region, which are sequentially stacked, electron transport regions in the number of m included in the light-emitting units in the number of m each include an electron transport material, and an electron transport material included in at least one electron transport region among the electron transport regions in the number of m is different from an electron transport material included in at least one electron transport region among the other electron transport regions.

15 Claims, 8 Drawing Sheets

(56) References Cited

U.S. PATENT DOCUMENTS

2020/0136053 A1\* 4/2020 Heo .......................... C09B 1/00
2020/0144552 A1  5/2020 Kim et al.
2022/0359830 A1\* 11/2022 Kim .................... H10K 85/615

FOREIGN PATENT DOCUMENTS

| KR | 10-2017-0123068 A | 11/2017 |
| KR | 10-2017-0137141 A | 12/2017 |
| KR | 10-2018-0049322 A | 5/2018 |
| KR | 10-2018-0058032 A | 5/2018 |
| KR | 10-1891168 B1 | 8/2018 |
| KR | 10-2018-0131100 A | 12/2018 |
| KR | 10-2019-0005761 A | 1/2019 |
| KR | 10-2019-0057179 A | 5/2019 |
| KR | 10-2019-0076088 A | 7/2019 |
| KR | 10-2055479 B1 | 12/2019 |
| WO | WO-2022131547 A1 \* | 6/2022 |

\* cited by examiner

ORGANIC LIGHT-EMITTING DEVICE AND FLAT DISPLAY APPARATUS INCLUDING THE SAME

CROSS-REFERENCE TO RELATED APPLICATION

This application claims priority to and the benefit of Korean Patent Application No. 10-2019-0108937, filed on Sep. 3, 2019, in the Korean Intellectual Property Office, the entire content of which is incorporated herein by reference.

BACKGROUND

1. Field

One or more aspects of embodiments of the present disclosure relate to an organic light-emitting device and a flat display apparatus including the same.

2. Description of Related Art

Organic light-emitting devices are self-emission devices that produce full-color images, and may also have wide viewing angles, high contrast ratios, short response times, and/or excellent characteristics in terms of brightness and/or response speed, compared to devices in the related art.

The organic light-emitting device may include a first electrode disposed (positioned) on a substrate, and a hole transport region, an emission layer, an electron transport region, and a second electrode, which are sequentially disposed on the first electrode. Holes provided from the first electrode may move toward the emission layer through the hole transport region, and electrons provided from the second electrode may move toward the emission layer through the electron transport region. Carriers, such as holes and electrons, may then recombine in the emission layer to produce excitons. These excitons may transition from an excited state to a ground state to thereby generate light.

SUMMARY

One or more aspects of embodiments of the present disclosure are directed toward an organic light-emitting device having a low driving voltage, high efficiency, and a long lifespan.

Additional aspects will be set forth in part in the description which follows and, in part, will be apparent from the description, or may be learned by practice of the presented embodiments of the disclosure.

One or more embodiments of the present disclosure provide an organic light-emitting device including: a first electrode;
 a second electrode facing the first electrode;
 light-emitting units in the number of m between the first electrode and the second electrode; and
 charge generation layers in the number of m−1 respectively between each adjacent pair of light-emitting units among the light-emitting units in the number of m, each charge generation layer including an n-type charge generation layer and a p-type charge generation layer,
  wherein m is an integer of 3 or more,
  the light-emitting units in the number of m each include a hole transport region, an emission layer, and an electron transport region, which are sequentially stacked,
  the electron transport regions in the number of m included in the light-emitting units in the number of m each include an electron transport material, and
  the electron transport material included in at least one electron transport region among the electron transport regions in the number of m is different from the electron transport material included in at least one electron transport region among the other electron transport regions.

One or more embodiments of the present disclosure provide a flat display apparatus including: a thin-film transistor including a source electrode, a drain electrode, and an activation layer; and the organic light-emitting device, wherein the first electrode of the organic light-emitting device is in electrical connection with one of the source electrode and the drain electrode of the thin-film transistor.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
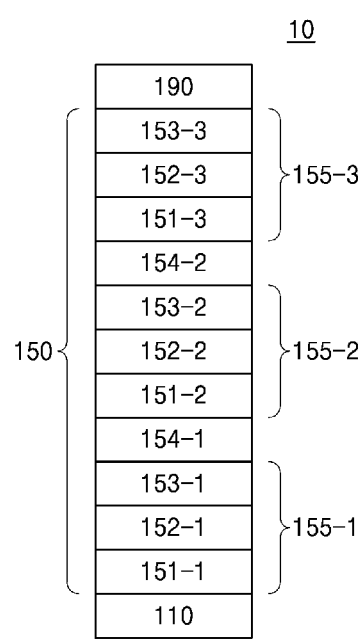
FIGS. 1 and 2 are each a schematic cross-sectional view of an organic light-emitting device according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Throughout the disclosure, the expression "at least one of a, b and c" indicates only a, only b, only c, both a and b, both a and c, both b and c, all of a, b, and c, or variations thereof.

Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention."

An embodiment of the present disclosure provides an organic light-emitting device including: a first electrode; a second electrode facing the first electrode; light-emitting units in the number of m between the first electrode and the second electrode; and charge generation layers in the number of m−1 respectively between each adjacent pair of light-emitting units among the light-emitting units in the number of m, each charge generation layer including an n-type charge generation layer and a p-type charge generation layer, wherein m is an integer of 3 or more, the light-emitting units in the number of m each include a hole transport region, an emission layer, and an electron transport region, which are sequentially stacked, the electron transport regions in the number of m included in the light-emitting units in the number of m each include an electron transport material, and the electron transport material included in at least one electron transport region among the electron transport regions in the number of m is different from the electron transport material included in at least one electron transport region among the other electron transport regions.

FIG. 1 is a schematic cross-sectional view of an organic light-emitting device 10 according to an embodiment. Referring to FIG. 1, the organic light-emitting device 10 may include: a first electrode 110; a second electrode 190 facing the first electrode 110; light-emitting units 155-1, 155-2, and 155-3 in the number of m (here, m=3) stacked between the first electrode 110 and the second electrode 190; and charge generation layers 154-1 and 154-2 in the number of m−1 (here, m−1=2) respectively between each adjacent pair of light-emitting units among the light-emitting units 155-1, 155-2, and 155-3 in the number of m, and each charge generation layer may include an n-type charge generation layer and a p-type charge generation layer.

The light-emitting units are not particularly limited as long as the light-emitting units have a function capable of emitting light. For example, the light-emitting unit may include one or more emission layers. In some embodiments, the light-emitting unit may further include, in addition to the one or more emission layers, an organic layer.

The organic light-emitting device 10 may include the stacked light-emitting units 155-1, 155-2, and 155-3 in the number of m, and m may be an integer of 3 or more. m, which is the number of light-emitting units, may be any suitable integer, and the upper limit of the number is not particularly limited. For example, the organic light-emitting device 10 may include three, four, five, or six light-emitting units.

The organic light-emitting device 10 may include the charge generation layers 154-1 and 154-2 respectively between each adjacent pair of light-emitting units (each two adjacent light-emitting units) among the light-emitting units 155-1, 155-2, and 155-3 in the number of m. The terms "neighboring" or "adjacent" refer to an arrangement relationship between the closest layers among the layers mentioned as the neighboring or adjacent layers. For example, two adjacent light-emitting units refer to an arrangement relationship between two light-emitting units disposed closest to each other among the plurality of light-emitting units. In some cases, the term "adjacent" refers to a case in which two layers are in physical contact with each other, and in some embodiments, another layer that is not mentioned may be disposed between the two adjacent layers. For example, the light-emitting unit adjacent to the second electrode refers to the light-emitting unit closest to the second electrode among the plurality of light-emitting units. Although the second electrode and the light-emitting unit may be in physical contact with each other, layers other than the light-emitting unit may be present between the second electrode and the light-emitting unit. For example, an electron transport layer may be between the second electrode and the light-emitting unit. In some embodiments, a charge generation layer may be between two adjacent light-emitting units.

The charge generation layer is a layer that acts as a cathode by generating electrons with respect to one light-emitting unit among the two adjacent light-emitting units, and acts as an anode by generating holes with respect to the other light-emitting unit. The charge generating layer is not directly connected to the electrode and separates the adjacent light-emitting units. The organic light-emitting device 10 including the light-emitting units in the number of m may include the charge generation layers in the number of m−1.

The charge generation layers 154-1 and 154-2 may each include an n-type charge generation layer and a p-type charge generation layer. The n-type charge generation layer and the p-type charge generation layer may be in direct contact with each other to form an NP junction. In the NP junction, electrons and holes may be simultaneously (or concurrently) generated between the n-type charge generation layer and the p-type charge generation layer. The generated electrons may be transferred to one light-emitting unit among the two adjacent light-emitting units through the n-type charge generation layer. The generated holes may be transferred to the other light-emitting unit among the two adjacent light-emitting units through the p-type charge generation layer. Also, because the charge generation layers 154-1 and 154-2 each include a single n-type charge generation layer and a single p-type charge generation layer, the organic light-emitting device 10 including the charge generation layers 154-1 and 154-2 in the number of m−1 may include n-type charge generation layers in the number of m−1 and p-type charge generation layers in the number of m−1.

The term "n-type" refers to n-type semiconductor characteristics, that is, characteristics of injecting or transporting electron. The term "p-type" refers to p-type semiconductor characteristics, that is, characteristics of injecting or transporting holes.

The light-emitting units 155-1, 155-2, and 155-3 in the number of m may respectively include hole transport regions 151-1, 151-2, and 151-3, emission layers 152-1, 152-2, and 152-3, and electron transport regions 153-1, 153-2, and 153-3, which are sequentially positioned. The electron transport regions 153-1, 153-2, and 153-3 in the number of m included in the light-emitting units 155-1, 155-2, and 155-3 in the number of m may each include an electron transport material.

The electron transport material included in at least one electron transport region among the electron transport regions 153-1, 153-2, and 153-3 in the number of m may be different from the electron transport material included in at least one electron transport region among the other (remaining) electron transport regions.

In one embodiment, the $m^{th}$ electron transport region 153-3 among the electron transport regions 153-1, 153-2, and 153-3 in the number of m may be between the $m^{th}$ emission layer 152-3 and the second electrode 190, and the electron transport material included in the $m^{th}$ electron transport region 153-3 may be different from the electron transport material included in at least one electron transport region among the other electron transport regions 153-1 and 153-2.

In one embodiment, the electron transport materials in the number of m included in the electron transport regions 153-1, 153-2, and 153-3 in the number of m may each independently be selected from a first compound, a second compound, and a third compound, The first compound may be represented by Formula 1, the second compound may be represented by Formula 2, and the third compound may be represented by Formula 3:

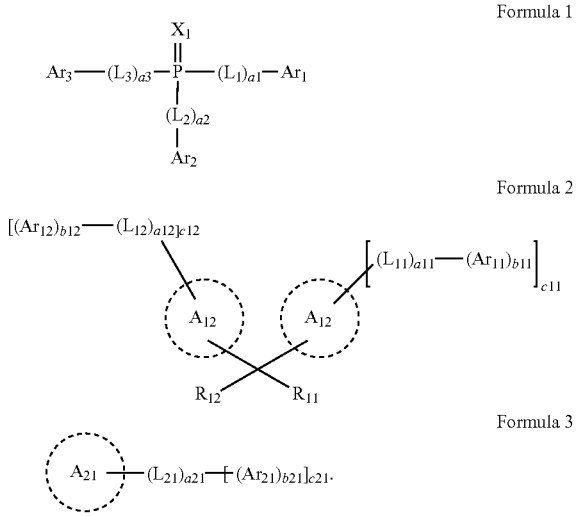

Formula 1

Formula 2

Formula 3

In Formula 1, $X_1$ may be O or S, $L_1$ to $L_3$ may each independently be a substituted or unsubstituted $C_5$-$C_{60}$ carbocyclic group or a substituted or unsubstituted $C_1$-$C_{60}$ heterocyclic group, a1 to a3 may each independently be an integer selected from 0 to 5, $Ar_1$ to $Ar_3$ may each independently be a substituted or unsubstituted $C_5$-$C_{60}$ carbocyclic group or a substituted or unsubstituted $C_1$-$C_{60}$ heterocyclic group, in Formula 2, $A_{11}$ and $A_{12}$ may each independently be a $C_5$-$C_{60}$ carbocyclic group or a $C_1$-$C_{60}$ heterocyclic group, $R_{11}$ and $R_{12}$ may each independently be selected from a group represented by *-$(L_{13})_{a13}$-$Ar_{13}$, hydrogen, deuterium, —F, —Cl, —Br, —I, a hydroxyl group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(=O)($Q_1$), —S(=O)$_2$($Q_1$), and —P(=O)($Q_1$)($Q_2$), $R_{11}$ and $R_{12}$ may optionally be linked to each other to form a substituted or unsubstituted $C_5$-$C_{60}$ carbocyclic group or a substituted or unsubstituted $C_1$-$C_{60}$ heterocyclic group, $L_{11}$ to $L_{13}$ may each independently be a substituted or unsubstituted $C_5$-$C_{60}$ carbocyclic group or a substituted or unsubstituted $C_1$-$C_{60}$ heterocyclic group, a11 to a13 may each independently be an integer selected from 0 to 5, $Ar_{11}$ to $Ar_{13}$ may each independently be a substituted or unsubstituted $C_5$-$C_{60}$ carbocyclic group or a substituted or unsubstituted $C_1$-$C_{60}$ heterocyclic group, b11 and b12 may each independently be an integer selected from 1 to 5, c11 and c12 may each independently be an integer selected from 0 to 20, in Formula 3, $A_{21}$ may be air electron-depleted nitrogen-containing ring, $L_{21}$ may be a substituted or unsubstituted $C_5$-$C_{60}$ carbocyclic group or a substituted or unsubstituted $C_1$-$C_{60}$ heterocyclic group, a21 may be an integer selected from 0 to 5, $Ar_{21}$ may be a substituted or unsubstituted $C_5$-$C_{60}$ carbocyclic group or a substituted or unsubstituted $C_1$-$C_{60}$ heterocyclic group, b21 may be an integer selected from 1 to 5, c21 may be an integer selected from 0 to 20, at least one substituent of the substituted $C_5$-$C_{60}$ carbocyclic group, the substituted $C_1$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group; a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{21}$)($Q_{22}$)($Q_{23}$), —B($Q_{21}$)($Q_{22}$), —C(=O)($Q_{21}$), —S(=O)$_2$($Q_{21}$), and —P(=O)($Q_{21}$)($Q_{22}$); and
—Si($Q_{31}$)($Q_{32}$)($Q_{33}$), —B($Q_{31}$)($Q_{32}$), —C(=O)($Q_{31}$), —S(=O)$_2$($Q_{31}$), and —P(=O)($Q_{31}$)($Q_{32}$), $Q_1$ to $Q_3$, $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, and

* indicates a binding site to a neighboring atom.

The term "π electron-depleted nitrogen-containing ring" as used herein may be understood by referring to the description presented in connection with an electron transport region described below.

For example, $L_1$ to $L_3$, $L_{11}$ to $L_{13}$, and $L_{21}$ may each independently be selected from:

a benzene group, a pentalene group, an indene group, a naphthalene group, an azulene group, a heptalene group, an indacene group, an acenaphthalene group, a fluorene group, a spiro-bifluorene group, a spiro-benzofluorene-fluorene group, a benzofluorene group, a dibenzofluorene group, a phenalene group, a phenanthrene group, an anthracene group, a fluoranthene group, a pyrene group, a chrysene group, a naphthacene group, a picene group, a perylene group, a pyrrole group, a thiophene group, a furan group, a silole group, an imidazole group, a pyrazole group, a thiazole group, an isothiazole group, an oxazole group, an isoxazole group, a pyridine group, a pyrazine group, a pyrimidine group, a pyridazine group, a triazine group, a benzofuran group, a benzothiophene group, a benzosilole group, a dibenzosilole group, a quinoline group, an isoquinoline group, a benzimidazole group, an imidazopyridine group, an imidazopyrimidine group, a carbazole group, a dibenzofuran group, a dibenzothiophene group, and a quinazoline group;

a benzene group, a pentalene group, an indene group, a naphthalene group, an azulene group, a heptalene group, an indacene group, an acenaphthalene group, a fluorene group, a spiro-bifluorene group, a spiro-benzofluorene-fluorene group, a benzofluorene group, a dibenzofluorene group, a phenalene group, a phenanthrene group, an anthracene group, a fluoranthene group, a pyrene group, a chrysene group, a naphthacene group, a picene group, a perylene group, a pyrrole group, a thiophene group, a furan group, a silole group, an imidazole group, a pyrazole group, a thiazole group, an isothiazole group, an oxazole group, an isoxazole group, a pyridine group, a pyrazine group, a pyrimidine group, a pyridazine group, a triazine group, a benzofuran group, a benzothiophene group, a benzosilole group, a dibenzosilole group, a quinoline group, an isoquinoline group, a benzimidazole group, an imidazopyridine group, an imidazopyrimidine group, a carbazole group, a dibenzofuran group, a dibenzothiophene group, and a quinazoline group, each substituted with at least one selected from deuterium, —F, —Cl, —Br, —I, a hydroxyl group, a cyano group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thienyl group, a furanyl group, a pyridinyl group, a pyrazinyl group, a pyrimidinyl group, a pyridazinyl group, a quinolinyl group, an isoquinolinyl group, a benzofuranyl group, a benzothienyl group, a silolyl group, an imidazolyl group, a pyrazolyl group, a thiazolyl group, an isothiazolyl group, an oxazolyl group, an isoxazolyl group, a benzosilolyl group, a dibenzosilolyl group, —Si($Q_{31}$)($Q_{32}$)($Q_{33}$), —N($Q_{31}$)($Q_{32}$), and —B($Q_{31}$)($Q_{32}$), and $Q_{31}$ to $Q_{33}$ may each independently be selected from a $C_1$-$C_{20}$ alkyl group, a $C_1$-$C_{20}$ alkoxy group, a phenyl group, a biphenyl group, a terphenyl group, a naphthyl group, and a pyridinyl group.

For example, $L_1$ to $L_3$, $L_{11}$ to $L_{13}$, and $L_{21}$ may each independently be selected from groups represented by Formulae 4-1 to 4-29:

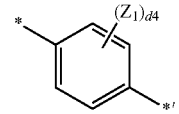

4-1

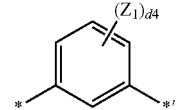

4-2

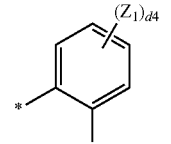

4-3

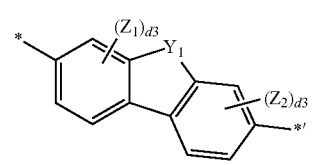

4-4

-continued
4-5
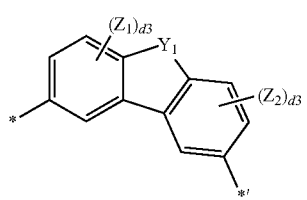
4-6
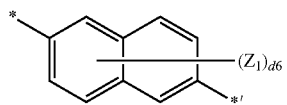
4-7
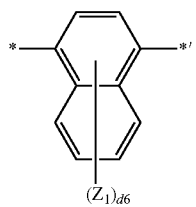
4-8
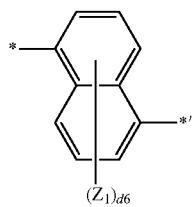
4-9
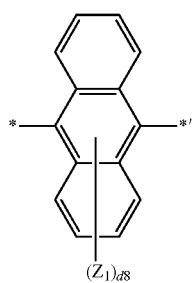
4-10
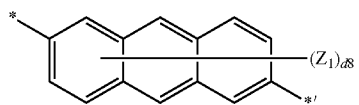
4-11
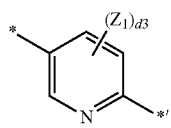
4-12
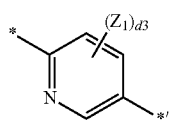
4-13
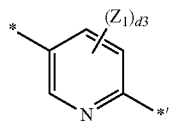
-continued
4-14
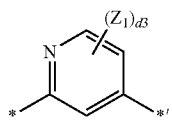
4-15
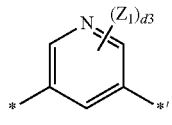
4-16
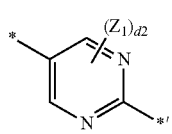
4-17
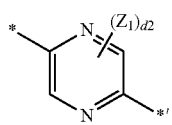
4-18
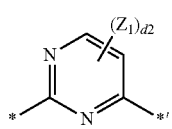
4-19
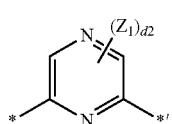
4-20
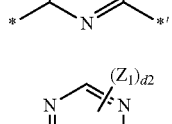
4-21
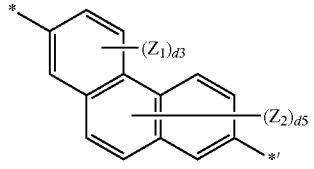
4-22
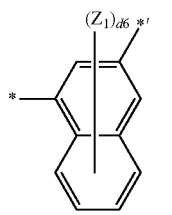
4-23
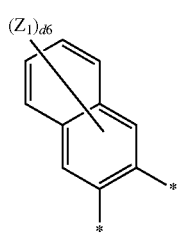

-continued 4-24

<chemical structure (Z₁)_d6>

4-25

<chemical structure (Z₁)_d6>

4-26

<carbazole structure (Z₁)_d4, (Z₂)_d3>

4-27

<carbazole structure (Z₁)_d4, (Z₂)_d3>

4-28

<carbazole structure (Z₁)_d4, (Z₂)_d3>

4-29

<triazine structure with Z₁>

In Formulae 4-1 to 4-29, $Y_1$ may be selected from $C(Z_3)(Z_4)$, $N(Z_5)$, $Si(Z_6)(Z_7)$, O, and S, $Z_1$ to $Z_7$ may each independently be selected from hydrogen, deuterium, —F, —Cl, —Br, —I, a hydroxyl group, a cyano group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a pyrenyl group, a chrysenyl group, a pyrrolyl group, a thienyl group, a furanyl group, a silolyl group, an imidazolyl group, a pyrazolyl group, a thiazolyl group, an isothi- azolyl group, an oxazolyl group, an isoxazolyl group, a pyridinyl group, a pyrazinyl group, a pyrimidinyl group, a pyridazinyl group, a benzofuranyl group, a benzothienyl group, a benzosilolyl group, a dibenzosilolyl group, and —$Si(Q_{31})(Q_{32})(Q_{33})$, $Q_{31}$ to $Q_{33}$ may each independently be selected from $C_1$-$C_{20}$ alkyl group, a $C_1$-$C_{20}$ alkoxy group, a phenyl group, a biphenyl group, a terphenyl group, a naphthyl group, and a pyridinyl group, d2 may be an integer selected from 0 to 2,
d3 may be an integer selected from 0 to 3,
d4 may be an integer selected from 0 to 4,
d5 may be an integer selected from 0 to 5,
d6 may be an integer selected from 0 to 6,
d8 may be an integer selected from 0 to 8, and
* and *' each indicate a binding site to a neighboring atom.

For example, $Ar_1$ to $Ar_3$, $Ar_{11}$ to $Ar_{13}$, and $Ar_{21}$ may each independently be selected from: a benzene group, a pentalene group, an indene group, a naphthalene group, an azulene group, a heptalene group, an indacene group, an acenaphthalene group, a fluorene group, a spiro-bifluorene group, a spiro-benzofluorene-fluorene group, a benzofluorene group, a dibenzofluorene group, a phenalene group, a phenanthrene group, an anthracene group, a fluoranthene group, a pyrene group, a chrysene group, a naphthacene group, a picene group, a perylene group, a pyrrole group, a thiophene group, a furan group, a silole group, an imidazole group, a pyrazole group, a thiazole group, an isothiazole group, an oxazole group, an isoxazole group, a pyridine group, a pyrazine group, a pyrimidine group, a pyridazine group, a triazine group, a benzofuran group, a dibenzofuran group, a benzothiophene group, a benzosilole group, a dibenzosilole group, a quinoline group, an isoquinoline group, a quinazoline group, a benzimidazole group, an imidazopyridine group, and an imidazopyrimidine group; and a benzene group, a pentalene group, an indene group, a naphthalene group, an azulene group, a heptalene group, an indacene group, an acenaphthalene group, a fluorene group, a spiro-bifluorene group, a spiro-benzofluorene-fluorene group, a benzofluorene group, a dibenzofluorene group, a phenalene group, a phenanthrene group, an anthracene group, a fluoranthene group, a pyrene group, a chrysene group, a naphthacene group, a picene group, a perylene group, a pyrrole group, a thiophene group, a furan group, a silole group, an imidazole group, a pyrazole group, a thiazole group, an isothiazole group, an oxazole group, an isoxazole group, a pyridine group, a pyrazine group, a pyrimidine group, a pyridazine group, a triazine group, a benzofuran group, a dibenzofuran group, a benzothiophene group, a benzosilole group, a dibenzosilole group, a quinoline group, an isoquinoline group, a quinazoline group, a benzimidazole group, an imidazopyridine group, and an imidazopyrimidine group, each substituted with at least one selected from deuterium, —F, —Cl, —Br, —I, a hydroxyl group, a cyano group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thienyl group, a furanyl group, a pyridinyl group, a pyrazinyl group, a pyrimidinyl group, a pyridazinyl group, a quinolinyl group, an isoquinolinyl group, a benzofuranyl group, a benzothienyl group, —Si($Q_{31}$)($Q_{32}$)($Q_{33}$), —N($Q_{31}$)($Q_{32}$) and —B($Q_{31}$)($Q_{32}$), and $Q_{31}$ to $Q_{33}$ may each independently be selected from a $C_1$-$C_{20}$ alkyl group, a $C_1$-$C_{20}$ alkoxy group, a phenyl group, a biphenyl group, a terphenyl group, a naphthyl group, and a pyridinyl group.

For example, $A_{11}$ and $A_{12}$ may each independently be selected from: a benzene group, a pentalene group, an indene group, a naphthalene group, an azulene group, a heptalene group, an indacene group, an acenaphthalene group, a fluorene group, a spiro-bifluorene group, a spiro-benzofluorene-fluorene group, a benzofluorene group, a dibenzofluorene group, a phenalene group, a phenanthrene group, an anthracene group, a fluoranthene group, a pyrene group, a chrysene group, a naphthacene group, a picene group, a perylene group, a pyrrole group, a thiophene group, a furan group, a silole group, an imidazole group, a pyrazole group, a thiazole group, an isothiazole group, an oxazole group, an isoxazole group, a pyridine group, a pyrazine group, a pyrimidine group, a pyridazine group, a triazine group, a benzofuran group, a benzothiophene group, a benzosilole group, a dibenzosilole group, a quinoline group, an isoquinoline group, a quinazoline group, a benzimidazole group, an imidazopyridine group, and an imidazopyrimidine group; and a benzene group, a pentalene group, an indene group, a naphthalene group, an azulene group, a heptalene group, an indacene group, an acenaphthalene group, a fluorene group, a spiro-bifluorene group, a spiro-benzofluorene-fluorene group, a benzofluorene group, a dibenzofluorene group, a phenalene group, a phenanthrene group, an anthracene group, a fluoranthene group, a pyrene group, a chrysene group, a naphthacene group, a picene group, a perylene group, a pyrrole group, a thiophene group, a furan group, a silole group, an imidazole group, a pyrazole group, a thiazole group, an isothiazole group, an oxazole group, an isoxazole group, a pyridine group, a pyrazine group, a pyrimidine group, a pyridazine group, a triazine group, a benzofuran group, a benzothiophene group, a benzosilole group, a dibenzosilole group, a quinoline group, an isoquinoline group, a quinazoline group, a benzimidazole group, an imidazopyridine group, and an imidazopyrimidine group, each substituted with at least one selected from deuterium, —F, —Cl, —Br, —I, a hydroxyl group, a cyano group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thienyl group, a furanyl group, a pyridinyl group, a pyrazinyl group, a pyrimidinyl group, a pyridazinyl group, a quinolinyl group, an isoquinolinyl group, a benzofuranyl group, a benzothienyl group, —Si($Q_{31}$)($Q_{32}$)($Q_{33}$), —N($Q_{31}$)($Q_{32}$), and —B($Q_{31}$)($Q_{32}$), and $Q_{31}$ to $Q_{33}$ may each independently be selected from a $C_1$-$C_{20}$ alkyl group, a $C_1$-$C_{20}$ alkoxy group, a phenyl group, a biphenyl group, a terphenyl group, a naphthyl group, and a pyridinyl group.

For example, $A_{21}$ may be selected from a pyridine group, a pyrimidine group, a pyrazine group, a triazine group, an aziridine group, an imidazole group, an indole group, an isoindole group, a purine group, a quinoline group, a quinazoline group, a phenothiazine group, an acridine group, a phenazine group, a phenanthroline group, a carbazole group, an oxadiazole group, a triazole group, an imidazole group, and a benzimidazole group.

For example, in Formula 2, at least one selected from $A_{11}$, $A_{12}$, $L_{11}$(s) in the number of a11, $L_{12}$(s) in the number of a12, $Ar_{11}$(s) in the number of b11, and $Ar_{12}$(s) in the number of b12 may be selected from a pyridine group, a pyrimidine group, a pyrazine group, a triazine group, a quinoline group, and a quinazoline group.

For example, the second compound may be represented by one of Formulae 2-1 and 2-2:

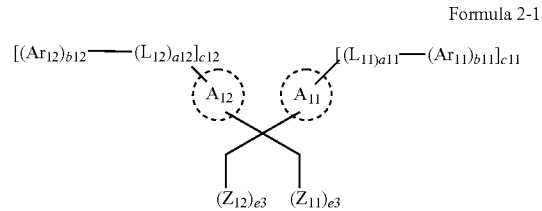

Formula 2-1

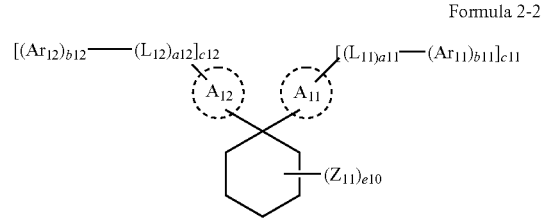

Formula 2-2

In Formulae 2-1 and 2-2, $Z_{11}$ and $Z_{12}$ may each independently be selected from hydrogen, deuterium, —F, —Cl, —Br, —I, a hydroxyl group, a cyano group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a pyrenyl group, a chrysenyl group, a pyrrolyl group, a thienyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a benzofuranyl group, a benzothienyl group, a benzosilolyl group, a dibenzosilolyl group, and —Si($Q_{31}$)($Q_{32}$)($Q_{33}$), $Q_{31}$ to $Q_{33}$ may each independently be selected from a $C_1$-$C_{20}$ alkyl group, a $C_1$-$C_{20}$ alkoxy group, a phenyl group, a biphenyl group, a terphenyl group, a naphthyl group, and a pyridinyl group, e3 may be an integer selected from 0 to 3, and e10 may be an integer selected from 0 to 10.

For example, the first compound may be selected from Compounds 1 to 17 below, and the second compound may be selected from Compounds 101 to 120 below:
1
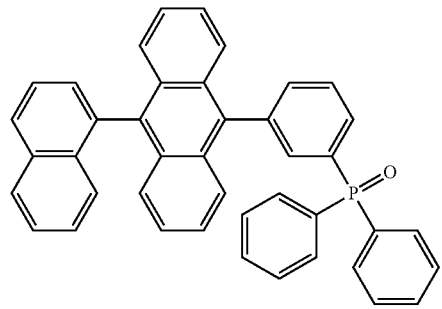
2
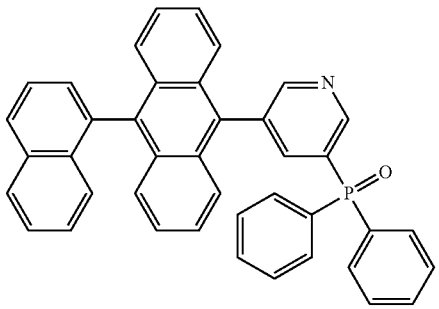
3
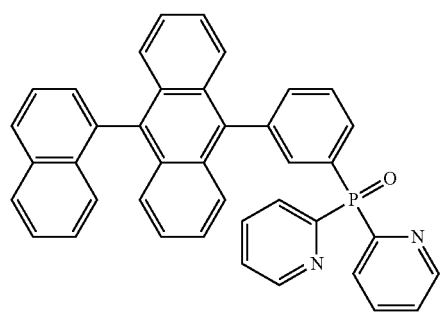
5
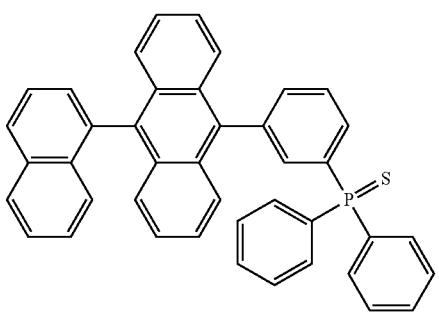
5
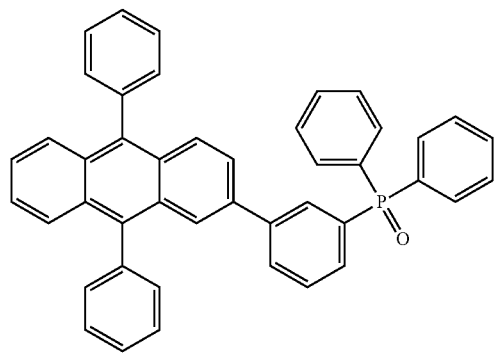
6
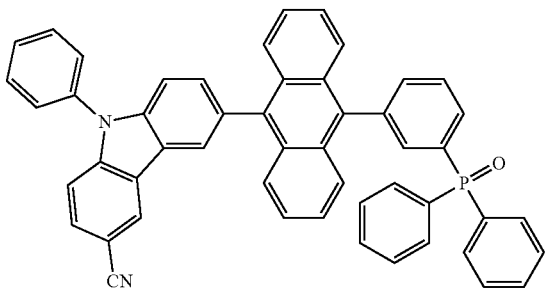
7
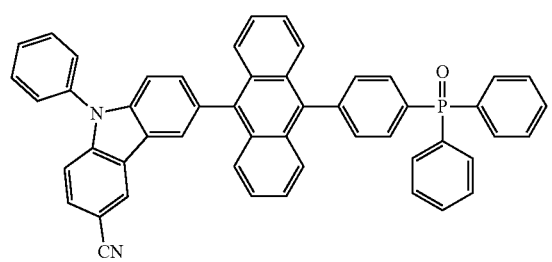
8
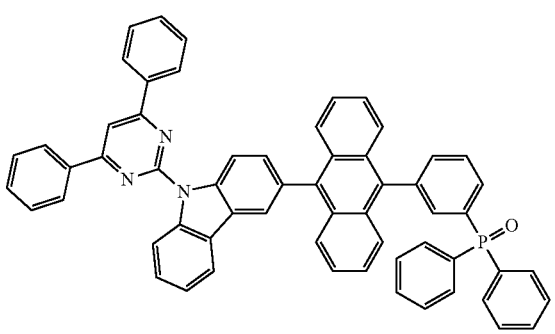

-continued
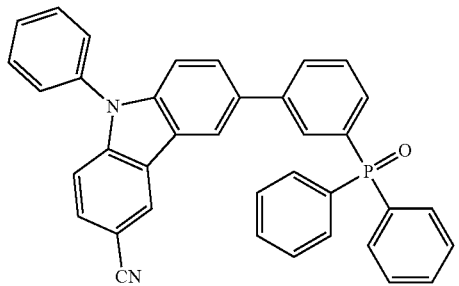
9
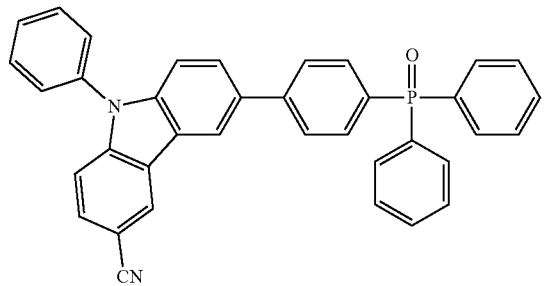
10
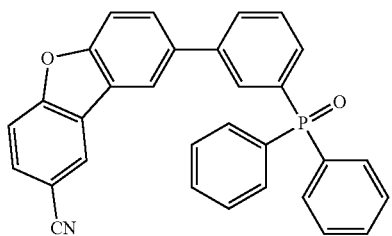
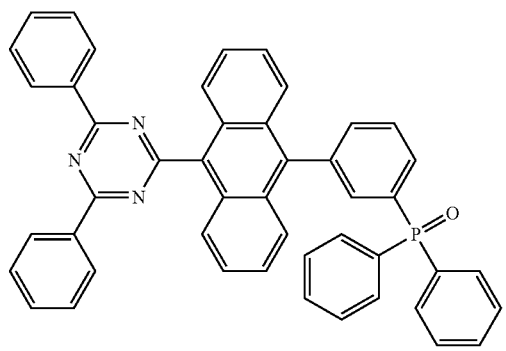
12
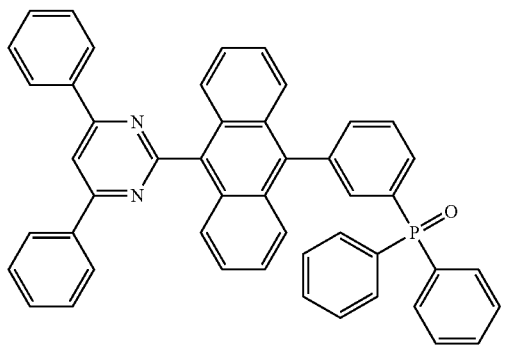
13
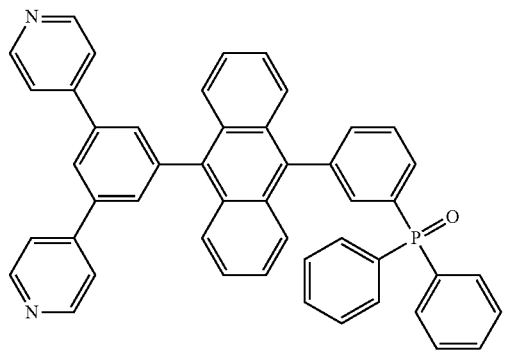
14
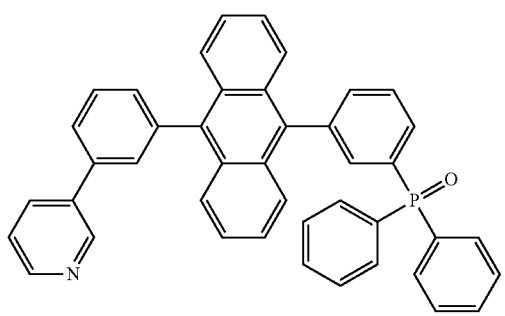
15
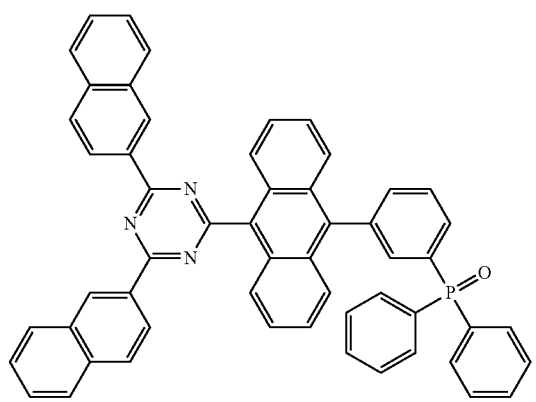
16

-continued
17
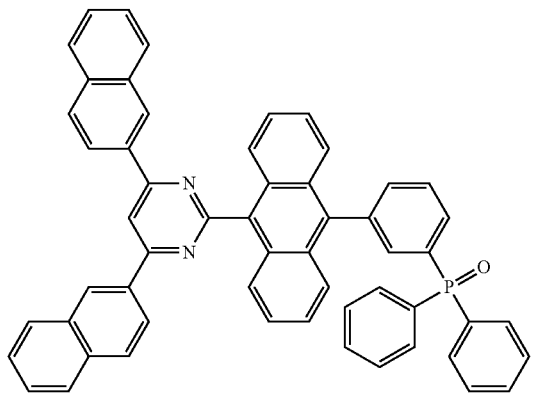
101
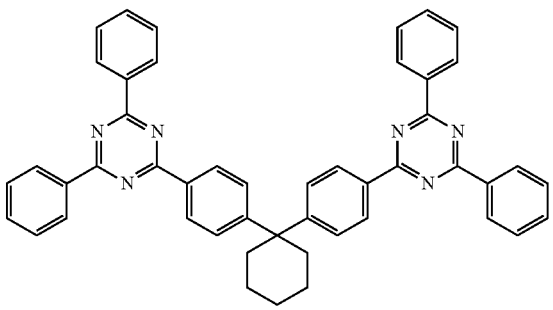
102
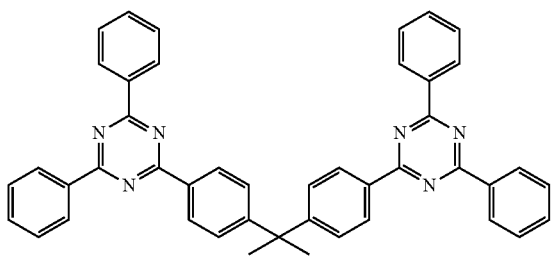
103
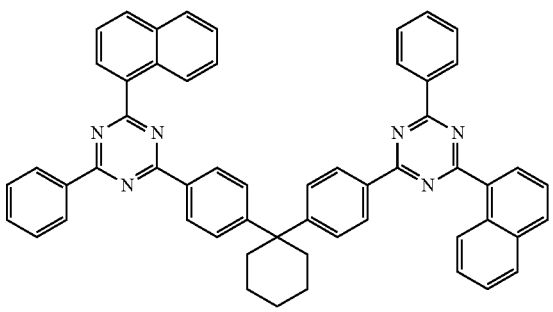
104
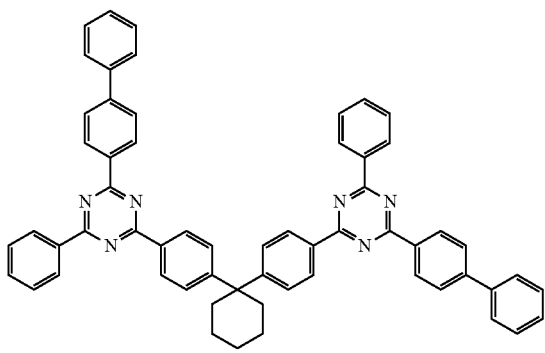
105
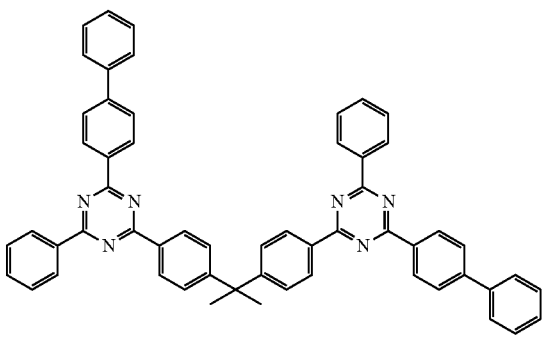
106
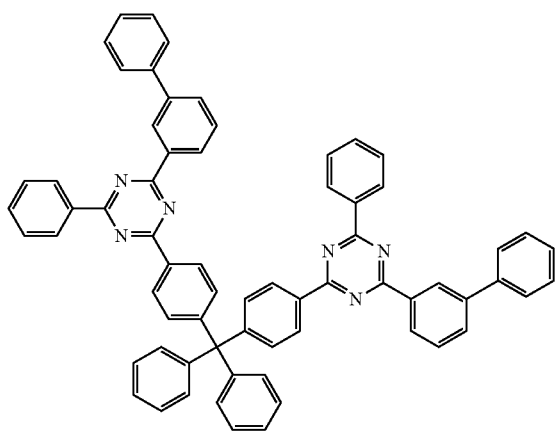
107
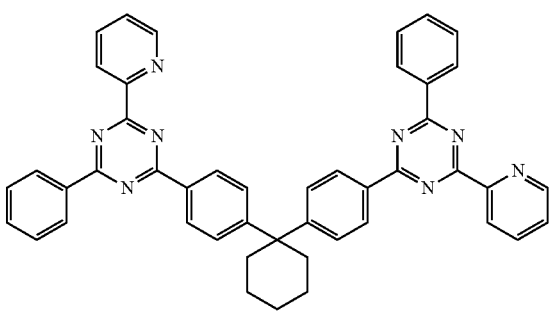

-continued
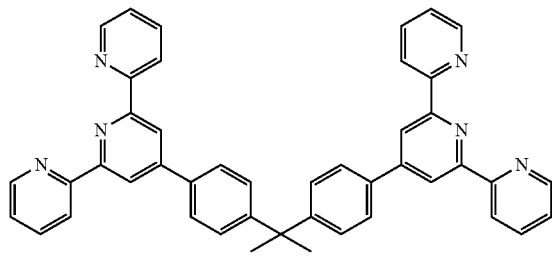
108
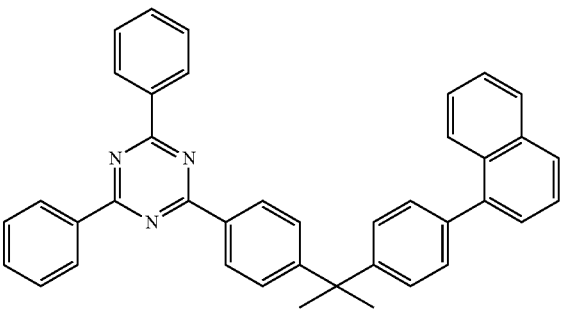
109
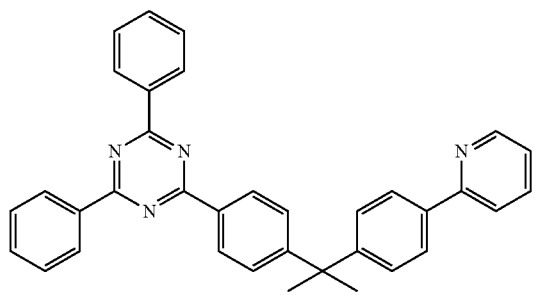
110
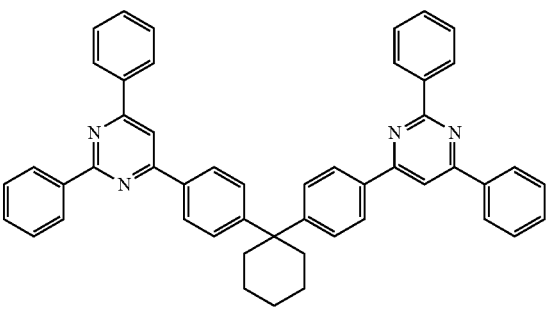
111
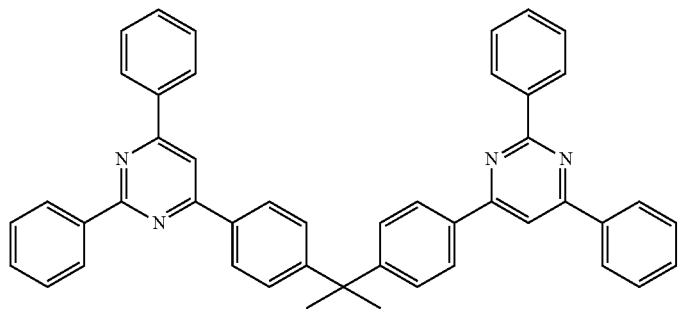
112
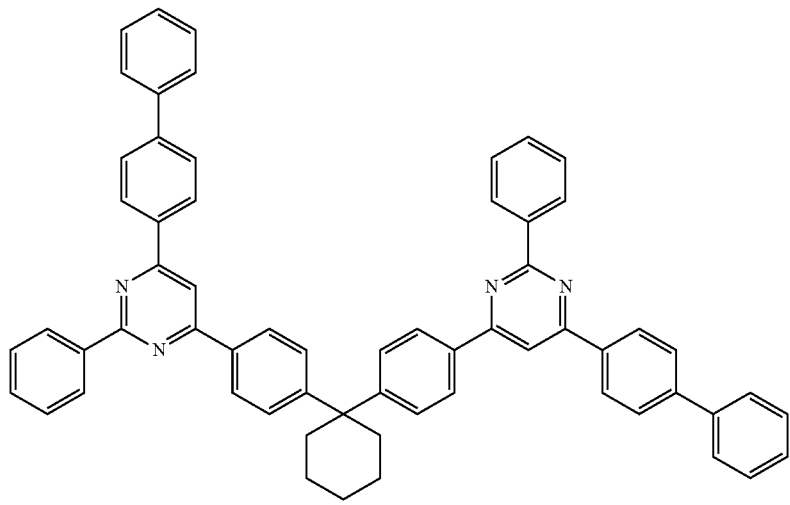
113

114
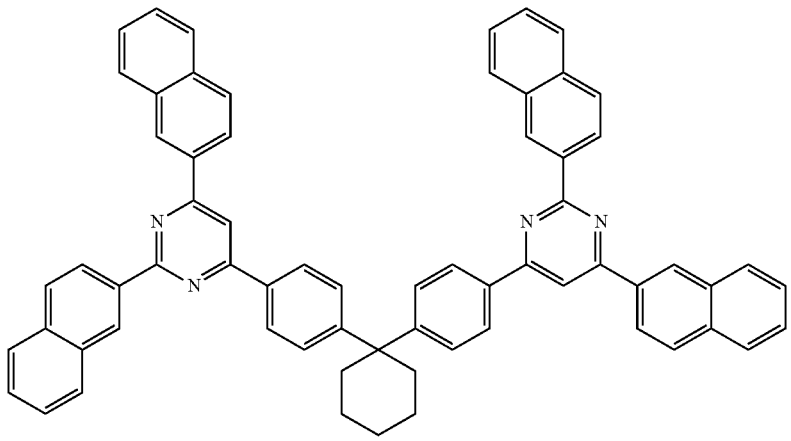
115 116
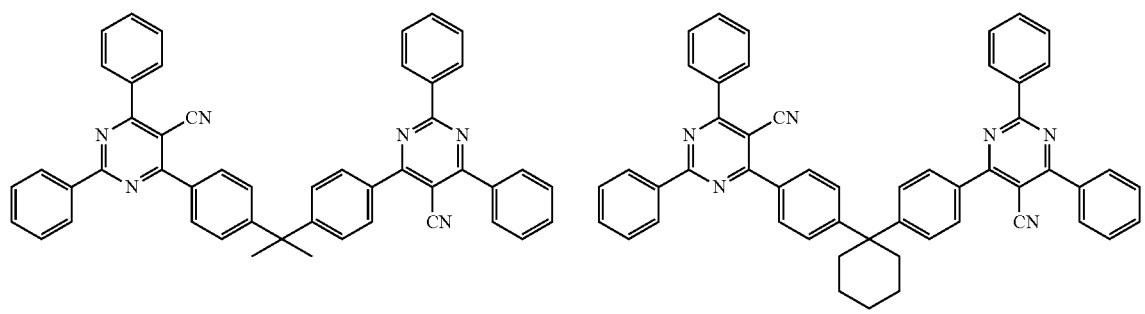
117
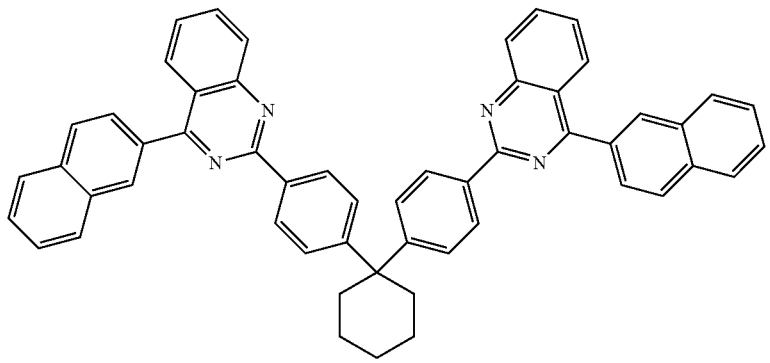
118 119
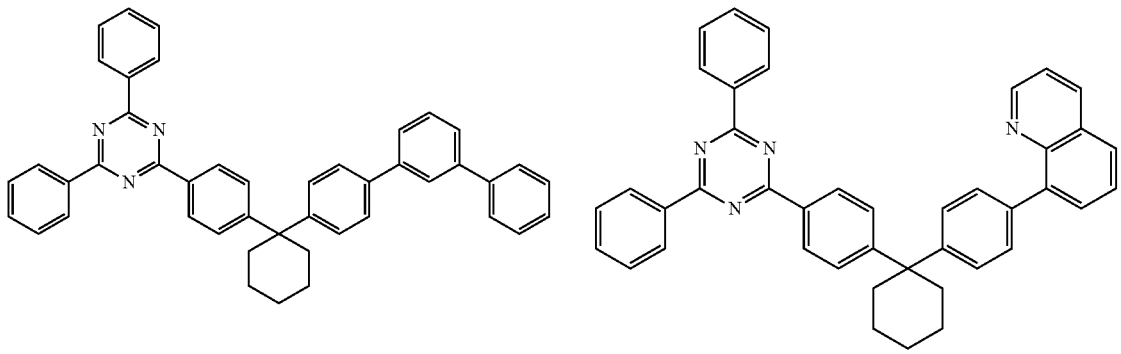

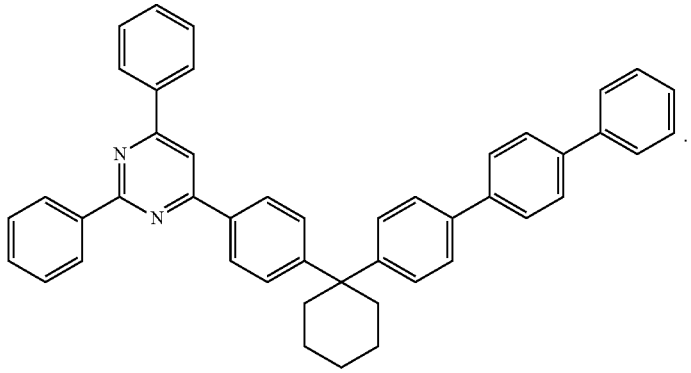

120

In one embodiment, i) one electron transport material among the electron transport materials in the number of m may be the second compound, and the other electron transport materials may each independently be the first compound;

ii) one electron transport material among the electron transport materials in the number of m may be the first compound, and the other electron transport materials may each independently be the second compound;

iii) each of the electron transport materials in the number of m may be the third compound, wherein one electron transport material among the electron transport materials may include a triazine group, and the other electron transport materials may each independently include a carbazole group; or iv) each of the electron transport materials in the number of m may be the third compound, wherein one electron transport material among the electron transport materials may include a carbazole group, and the other electron transport materials may each independently include a triazine group.

In one embodiment, the $m^{th}$ electron transport region 153-3 among the electron transport regions 153-1, 153-2, and 153-3 in the number of m may be disposed between the $m^{th}$ emission layer 152-3 and the second electrode 190, and an absolute value of a lowest unoccupied molecular orbital (LUMO) energy level of the $m^{th}$ electron transport region 153-3 may be in a range between an absolute value of a LUMO energy level of a host included in the $m^{th}$ emission layer 152-3 and an absolute value of a work function of an inorganic material included in the second electrode 190.

In one embodiment, the absolute value of the LUMO energy level of the $m^{th}$ electron transport region 153-3 and the absolute value of the LUMO energy level of the host may satisfy Equation 1:

$$\|E_{LUMO\_ETL(m)}|-|E_{LUMO\_Host}\|\leq 0.2 \text{ eV}. \qquad \text{Equation 1}$$

In Equation 1, $|E_{LUMO\_ETL(m)}|$ is the absolute value of the LUMO energy level of the $m^{th}$ electron transport region, and $|E_{LUMO\_Host}|$ is the absolute value of the LUMO energy level of the host. For example, $\||E_{LUMO\_ETL(m)}|-|E_{LUMO\_Host}\|$ may be about 0.1 eV or less For example, the absolute value of the LUMO energy level of the host may be in a range of about 2.5 eV to about 2.7 eV.

In one embodiment, an $n^{th}$ charge generation layer among the charge generation layers 154-1 and 154-2 in the number of m−1 may be disposed between the electron transport region 153-1 or 153-2 of the $n^{th}$ light-emitting unit among the light-emitting units 155-1, 155-2, and 155-3 in the number of m and the hole transport region 151-2 or 151-3 of the $(n+1)^{th}$ light-emitting unit, and n may be an integer selected from 1 to m−1.

For example, an absolute value of a LUMO energy level of the electron transport region of the $n^{th}$ light-emitting unit ($n^{th}$ electron transport region) 153-1 or 153-2 and an absolute value of a LUMO energy level of $n^{th}$ charge generation layer 154-1 or 154-2 may satisfy Equation 2:

$$\|E_{LUMO\_ETL(n)}|-|E_{LUMO\_CGL(n)}\|\leq 0.15 \text{ eV}. \qquad \text{Equation 2}$$

In Equation 2, $|E_{LUMO\_ETL(n)}|$ is the absolute value of the LUMO energy level of the electron transport region of the $n^{th}$ light-emitting unit, and $|E_{LUMO\_CGL(n)}|$ is the absolute value of the LUMO energy level of the $n^{th}$ charge generation layer. For example, $\||E_{LUMO\_ETL(n)}|-|E_{LUMO\_CGL(n)}\|$ may be about 0.1 eV or less.

For example, the absolute value of the LUMO energy level of the charge generation layer may be in a range of about 2.5 eV to about 2.8 eV.

Figure 2:
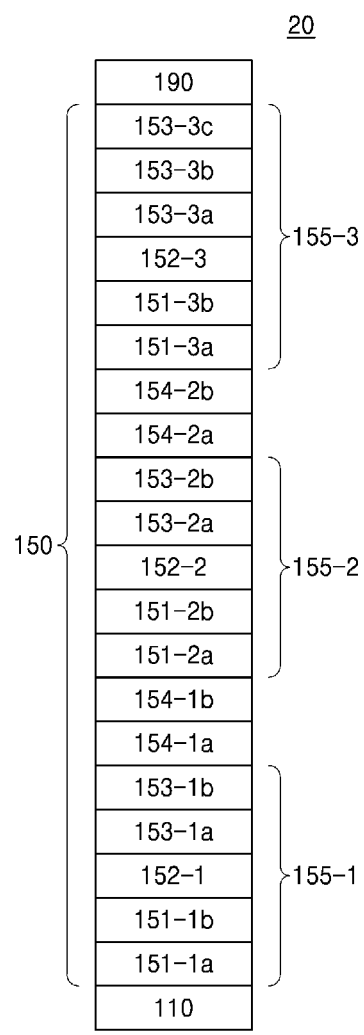

FIG. 2 is a schematic cross-sectional view of an organic light-emitting device 20 according to another embodiment.

As in FIG. 1, the organic light-emitting device 20 of FIG. 2 may include: a first electrode 110; a second electrode 190 facing the first electrode 110; light-emitting units in the number of m stacked between the first electrode 110 and the second electrode 190; and charge generation layers in the number of m−1 respectively positioned between each adjacent pair of light-emitting units among the light-emitting units in the number of m, and each charge generation layer may include an n-type charge generation layer and a p-type charge generation layer.

In the light-emitting units in the number of m, hole transport regions in the number of m may each independently include a hole injection layer, a hole transport layer, an electron blocking layer, or any combination thereof; and electron transport regions in the number of m may each independently include a hole blocking layer, an electron transport layer, an electron injection layer, a buffer layer, or any combination thereof.

Referring to FIG. 2, the hole transport regions in the number of m may respectively include hole injection layers 151-1a, 151-2a, and 151-3a and hole transport layers 151-1b, 151-2b, and 151-3b; and the electron transport regions in the number of m may respectively include buffer layers 153-1a, 153-2a, and 153-3a, electron transport layers 153-1b, 153-2b, and 153-3b, and an electron injection layer 153-3c.

For example, the charge generation layers in the number of m−1 may respectively include n-type charge generation layers 154-1*a* and 154-2*a* in the number of m−1 and p-type charge generation layers 154-1*b* and 154-2*b* in the number of m−1.

In the organic light-emitting device, m may be 3 or 4.

In one embodiment, the first electrode may be an anode, the second electrode may be a cathode, the organic light-emitting device may further include: an $m^{th}$ light-emitting unit between the first electrode and the second electrode;

an $(m-1)^{th}$ light-emitting unit between the first electrode and the $m^{th}$ light-emitting unit; and an $(m-1)^{th}$ charge generation layer between the $m^{th}$ light-emitting unit and the $(m-1)^{th}$ light-emitting unit, the $m^{th}$ light-emitting unit may include an $m^{th}$ emission layer, the $(m-1)^{th}$ light-emitting unit may include an $(m-1)^{th}$ emission layer, the organic light-emitting device may further include an $(m-1)^{th}$ hole transport region between the first electrode and the $(m-1)^{th}$ emission layer, the organic light-emitting device may further include an $(m-1)^{th}$ electron transport region between the $(m-1)^{th}$ emission layer and the $(m-1)^{th}$ charge generation layer, the organic light-emitting device may further include an $m^{th}$ hole transport region between the $(m-1)^{th}$ charge generation layer and the $m^{th}$ emission layer, the organic light-emitting device may further include an $m^{th}$ electron transport region between the $m^{th}$ emission layer and the second electrode, an electron transport material included in the $m^{th}$ electron transport region may be different from the electron transport material included in the $(m-1)^{th}$ electron transport region, the hole transport regions may each include a hole injection layer, a hole transport layer, an electron blocking layer, or any combination thereof, and the electron transport regions may each include a hole blocking layer, an electron transport layer, an electron injection layer, a buffer layer, or any combination thereof.

In one embodiment, maximum emission wavelengths of light emitted from the light-emitting units in the number of m may be identical to each other (or substantially the same).

In one or more embodiments, the light-emitting units in the number of m may emit blue light having a maximum emission wavelength of about 440 nm or more and about 490 nm or less.

In one or more embodiments, the maximum emission wavelength of light emitted from at least one light-emitting unit among the light-emitting units in the number of m may be different from the maximum emission wavelength of light emitted from at least one light-emitting unit among the other light-emitting units. For example, in an organic light-emitting device in which a first light-emitting unit and a second light-emitting unit are stacked, a maximum emission wavelength of light emitted from the first light-emitting unit may be different from a maximum emission wavelength of light emitted from the second light-emitting unit. In this case, emission layers in the first light-emitting unit and the second light-emitting unit may each independently have i) a single-layered structure including a single layer including a single material, ii) a single-layered structure including a single layer including a plurality of different materials, or iii) a multi-layered structure having a plurality of layers including a plurality of different materials. Therefore, light emitted from the first light-emitting unit or the second light-emitting unit may be single color light or mixed color light. In one or more embodiments, in an organic light-emitting device in which a first light-emitting unit, a second light-emitting unit, and a third light-emitting unit are stacked, a maximum emission wavelength of light emitted from the first light-emitting unit may be identical to a maximum emission wavelength of light emitted from the second light-emitting unit, but may be different from a maximum emission wavelength of light emitted from the third light-emitting unit. In one embodiment, the maximum emission wavelength of the light emitted from the first light-emitting unit, the maximum emission wavelength of the light emitted from the second light-emitting unit, and the maximum emission wavelength of the light emitted from the third light-emitting unit may be different from each other.

In a comparable organic light-emitting device having two light-emitting units, points at which electrons and holes are injected are different. Specifically, in the first light-emitting unit, holes are injected from an anode, and electrons are injected from a first charge generation layer. In the second light-emitting unit, holes are injected from a first charge generation layer, and electrons are injected from a cathode.

In contrast, in the organic light-emitting device having the light-emitting units in the number of m or more (wherein m is 3 or more), according to one or more embodiments, in the light-emitting units disposed at both ends, electrons and holes are injected as in the comparable light-emitting device having the two light-emitting units, but in the light-emitting units in the number of m−2 inserted in the middle, both electrons and holes are injected from the charge generation layer.

Referring to FIG. 1, in the first light-emitting unit 155-1, holes are injected from the first electrode 110, for example, the anode, and electrons are injected from the first charge generation layer 154-1. In this case, an amount (number) of electrons generated and injected from the first charge generation layer 154-1 is relatively small, as compared with a single-unit light-emitting device in which electrons are injected from a cathode and an electron transport region. This is because an absolute amount of charges generated in the charge generation layer is insufficient, and internal resistance (for example, an energy band bending difference due to Fermi level alignment) occurs in the process of transferring charges from the charge generation layer to the surrounding light-emitting unit.

In contrast, in the case of the third light-emitting unit 155-3, holes are injected from the second charge generation layer 154-2, and electrons are injected from the second electrode 190, for example, the cathode. Thus, charge injection balance is deteriorated, as compared with the single-unit light-emitting device.

Because the organic light-emitting device according to one or more embodiments has a tandem structure including three or more light-emitting units, a current load flowing through each light-emitting unit is reduced so that luminescence efficiency and a lifespan are increased, as compared with the comparable organic light-emitting device having a tandem structure including two light-emitting units.

Furthermore, in the organic light-emitting device according to one or more embodiments, because an electron transport region that is close to the cathode among the plurality of electron transport regions is different in composition from each of the other electron transport regions, it is possible to effectively (or suitably) control an amount of electrons and holes combined for each unit by adjusting an amount of electrons injected into the light-emitting unit.

In some embodiments, the organic light-emitting device according to one or more embodiments may include, as the electron transport material, i) a compound having an arylanthracene structure including a phosphine oxide-based group or phosphine sulfide-based group, ii) a heterocyclic (heterocyclic) compound including a phosphine oxide-based group or phosphine sulfide-based group, or iii) a ring (cyclic) compound including a triazine and/or a pyrimidine group, or a compound including a heterocyclic (heterocyclic) core selected from a pyridine group, a pyrimidine group, a pyrazine group, a triazine group, an aziridine group, an imidazole group, an indole group, an isoindole group, a purine group, a quinoline group, a quinazoline group, a phenothiazine group, an acridine group, a phenazine group, a phenanthroline group, a carbazole group, an oxadiazole group, a triazole group, an imidazole group, and a benzimidazole group. In this manner, stable (or suitable) electron flow may be controlled, and luminescence efficiency in the emission layer may be effectively (or suitably) controlled.

Figure 4:
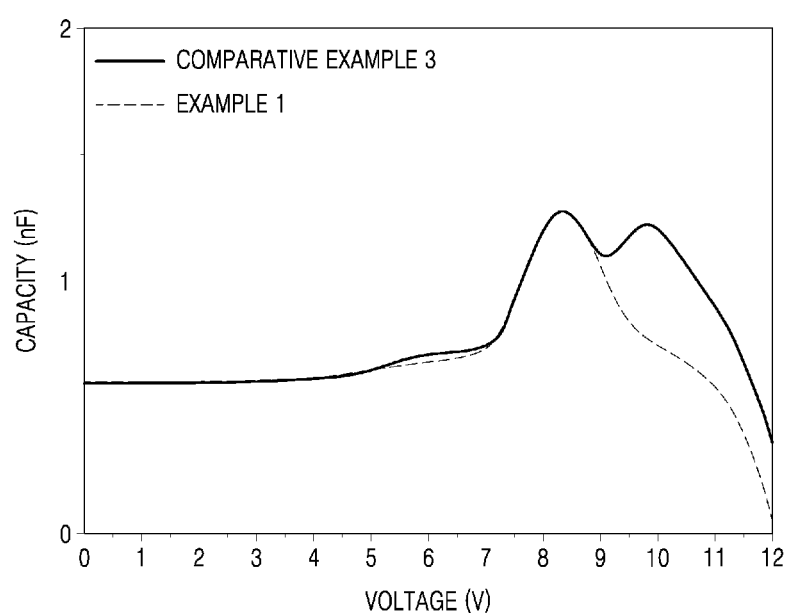
FIG. 4 is a capacitance-voltage graph of organic light-emitting devices manufactured according to Example 1 and Comparative Example 3.

In some embodiments, in the organic light-emitting device according to one or more embodiments, because a difference between a LUMO energy level of the electron transport region contacting the charge generation layer and a LUMO energy level of the charge generation layer is limited to within ±0.15 eV, electrons may be efficiently injected into the emission layer, and accumulation of charges may be prevented or reduced, before electrons are injected into the emission layer, thereby effectively (or suitably) helping long-term reliability of the device (see e.g., FIG. 4).

In some embodiments, in the organic light-emitting device according to one or more embodiments, because a difference between a LUMO energy level of the electron transport region contacting the cathode and a LUMO energy level of the host material in the emission layer is limited to within ±0.2 eV, electrons may be efficiently injected from the cathode to the emission layer, thereby securing effective (or suitable) injection characteristics.

Another embodiment of the present disclosure provides a flat display apparatus including: a thin-film transistor including a source electrode, a drain electrode, and an activation layer; and the organic light-emitting device, wherein the first electrode of the organic light-emitting device is in electrical connection with one of the source electrode and the drain electrode the thin-film transistor.

The term "an organic layer" as used herein refers to a single layer and/or a plurality of layers between the first electrode and the second electrode of an organic light-emitting device. A material included in the "organic layer" is not limited to an organic material.

Hereinafter, the structure of each of the organic light-emitting devices 10 and 20 according to embodiments and a method of manufacturing the same will be described in connection with FIGS. 1 and 2.

First Electrode 110

Referring to FIGS. 1 and 2, a substrate may be additionally positioned (included) under the first electrode 110 or above the second electrode 190. The substrate may be a glass substrate and/or a plastic substrate, each having excellent (suitable) mechanical strength, thermal stability, transparency, surface smoothness, ease of handling, and/or water resistance.

The first electrode 110 may be formed by depositing or sputtering a material for forming the first electrode 110 on the substrate. When the first electrode 110 is an anode, the material for forming the first electrode 110 may be selected from materials with a high work function to facilitate hole injection.

The first electrode 110 may be a reflective electrode, a semi-transmissive electrode, or a transmissive electrode.

When the first electrode 110 is a transmissive electrode, a material for forming the first electrode 110 may be selected from indium tin oxide (ITO), indium zinc oxide (IZO), tin oxide ($SnO_2$), zinc oxide (ZnO), and any combinations thereof, but embodiments of the present disclosure are not limited thereto. In one or more embodiments, when the first electrode 110 is a semi-transmissive electrode or a reflective electrode, a material for forming a first electrode 110 may be selected from magnesium (Mg), silver (Ag), aluminum (Al), aluminum-lithium (Al—Li), calcium (Ca), magnesium-indium (Mg—In), magnesium-silver (Mg—Ag), and any combinations thereof, but embodiments of the present disclosure are not limited thereto.

The first electrode 110 may have a single-layered structure, or a multi-layered structure including two or more layers. For example, the first electrode 110 may have a three-layered structure of ITO/Ag/ITO, but the structure of the first electrode 110 is not limited thereto.

Organic Layer 150

The organic layer 150 may be on the first electrode 110. The organic layer 150 may include light-emitting units 155-1, 155-2, and 155-3.

The organic layer 150 may further include hole transport regions 151-1, 151-2, and 151-3 in the light-emitting units 155-1, 155-2, and 155-3, respectively, and electron transport regions 153-1, 153-2, and 153-3 in the light-emitting units 155-1, 155-2, and 155-3, respectively.

Hole Transport Region 151-1, 151-2, or 151-3 in Organic Layer 150

The hole transport region 151-1, 151-2, or 151-3 may have i) a single-layered structure including a single layer including a single material, ii) a single-layered structure including a single layer including a plurality of different materials, or iii) a multi-layered structure having a plurality of layers including a plurality of different materials.

The hole transport region 151-1, 151-2, or 151-3 may include at least one layer selected from a hole transport layer 151-1b, 151-2b, or 151-3b, a hole injection layer 151-1a, 151-2a, or 151-3a, an emission auxiliary layer, and an electron blocking layer.

For example, the hole transport region 151-1, 151-2, or 151-3 may have a single-layered structure including a single layer including a plurality of different materials, or a multi-layered structure having a hole injection layer/hole transport layer structure, a hole injection layer/hole transport layer/ emission auxiliary layer structure, a hole injection layer/ emission auxiliary layer structure, a hole transport layer/ emission auxiliary layer structure, or a hole injection layer/ hole transport layer/electron blocking layer structure, wherein for each structure, constituting layers are sequentially stacked from the first electrode 110 in this stated order, but the structure of the hole transport region 151-1, 151-2, or 151-3 is not limited thereto.

The hole transport region 151-1, 151-2, or 151-3 may include at least one selected from m-MTDATA, TDATA, 2-TNATA, NPB(NPD), β-NPB, TPD, spiro-TPD, spiro-NPB, methylated NPB, TAPC, HMTPD, 4,4',4"-tris(N-carbazolyl)triphenylamine (TCTA), polyaniline/dodecylbenzenesulfonic acid (PAN I/DBSA), poly(3,4-ethylenedioxythiophene)/poly(4-styrenesulfonate) (PEDOT/PSS), polyaniline/camphor sulfonic acid (PANI/ CSA), polyaniline/poly(4-styrenesulfonate) (PANI/PSS), a compound represented by Formula 201, and a compound represented by Formula 202:

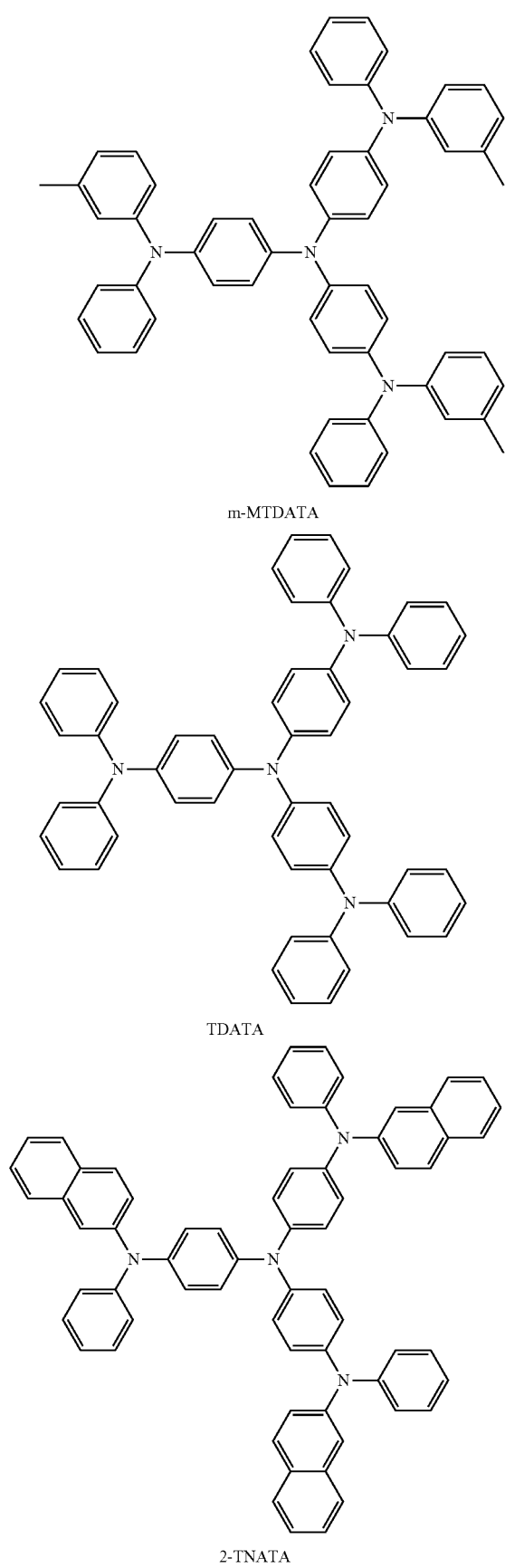
m-MTDATA
TDATA
2-TNATA
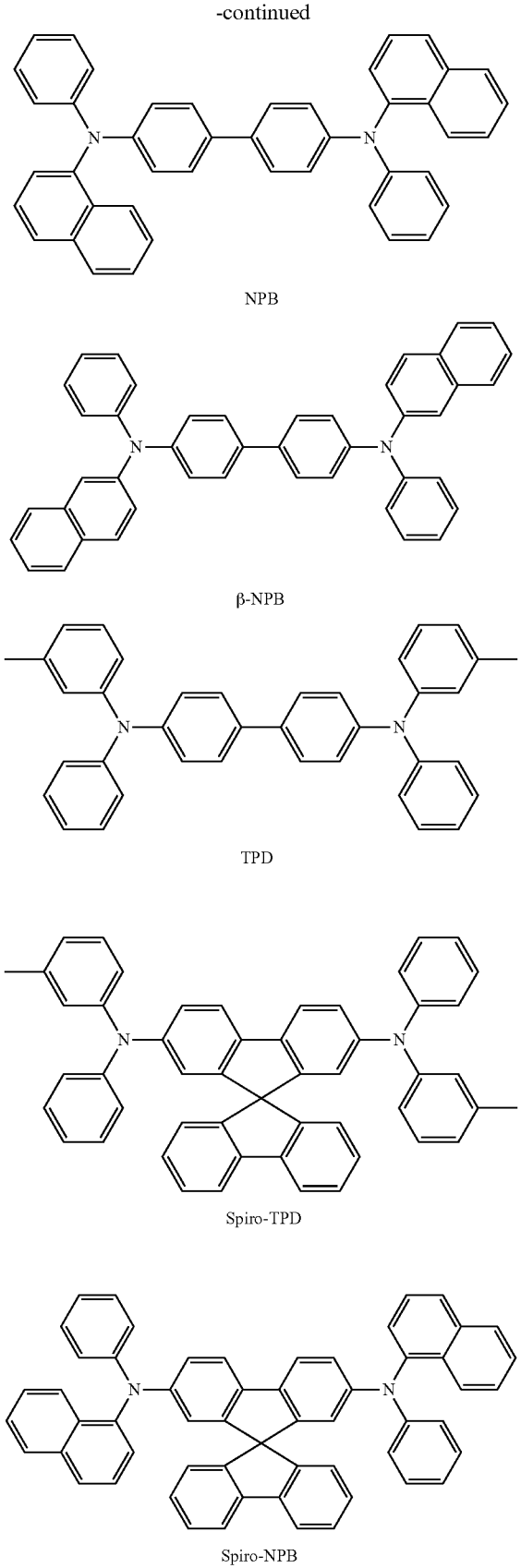
NPB
β-NPB
TPD
Spiro-TPD
Spiro-NPB

-continued

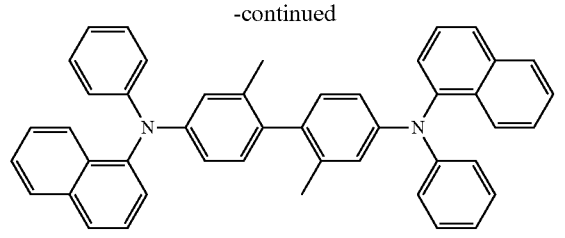
methylated NPB

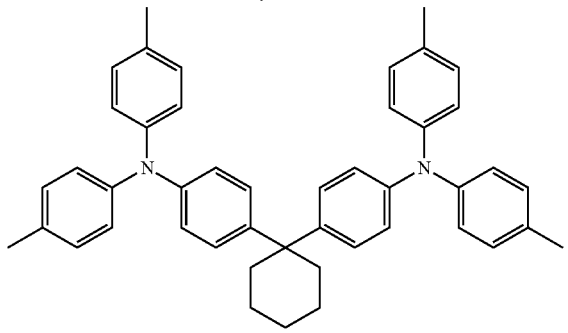
TAPC

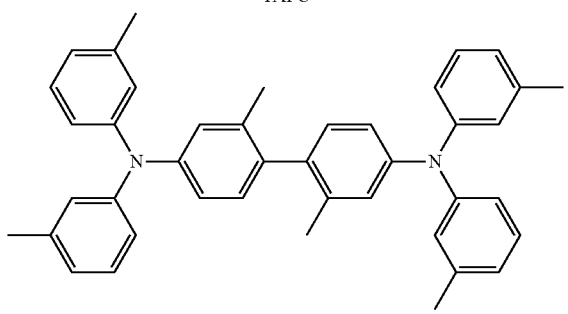
HMTPD

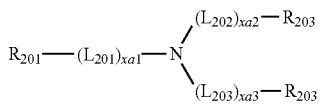
Formula 201

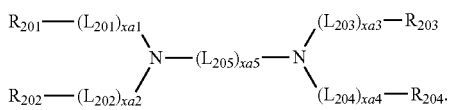
Formula 202

In Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer selected from 0 to 3, xa5 may be an integer selected from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, in Formula 202, $R_{201}$ and $R_{202}$ may optionally be linked to each other via a single bond, a dimethyl-methylene group, or a diphenyl-methylene group, and $R_{203}$ and $R_{204}$ may optionally be linked to each other via a single bond, a dimethyl-methylene group, or a diphenyl-methylene group.

In one embodiment, in Formulae 201 and 202, $L_{201}$ to $L_{205}$ may each independently be selected from:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thienylene group, a furanylene group, a carbazolylene group, an indolylene group, an isoindolylene group, a benzofuranylene group, a benzothienylene group, a dibenzofuranylene group, a dibenzothienylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thienylene group, a furanylene group, a carbazolylene group, an indolylene group, an isoindolylene group, a benzofuranylene group, a benzothienylene group, a dibenzofuranylene group, a dibenzothienylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thienyl group, a furanyl group, a carbazolyl group, an indolyl group, an isoindolyl group, a benzofuranyl group, a benzothienyl group, a dibenzofuranyl group, a dibenzothienyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xa1 to xa4 may each independently be 0, 1, or 2.

In one or more embodiments, xa5 may be 1, 2, 3, or 4.

In one or more embodiments, $R_{201}$ to $R_{204}$ and $Q_{201}$ may each independently be selected from: a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thienyl group, a furanyl group, a carbazolyl group, an indolyl group, an isoindolyl group, a benzofuranyl group, a benzothienyl group, a dibenzofuranyl group, a dibenzothienyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thienyl group, a furanyl group, a carbazolyl group, an indolyl group, an isoindolyl group, a benzofuranyl group, a benzothienyl group, a dibenzofuranyl group, a dibenzothienyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thienyl group, a furanyl group, a carbazolyl group, an indolyl group, an isoindolyl group, a benzofuranyl group, a benzothienyl group, a dibenzofuranyl group, a dibenzothienyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), and $Q_{31}$ to $Q_{33}$ are the same as described above.

In one or more embodiments, at least one selected from $R_{201}$ to $R_{203}$ in Formula 201 may each independently be selected from:

a fluorenyl group, a spiro-bifluorenyl group, a carbazolyl group, a dibenzofuranyl group, and a dibenzothienyl group; and a fluorenyl group, a spiro-bifluorenyl group, a carbazolyl group, a dibenzofuranyl group, and a dibenzothienyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothienyl group, but embodiments of the present disclosure are not limited thereto.

In one or more embodiments, in Formula 202, i) $R_{201}$ and $R_{202}$ may be linked to each other via a single bond, and/or ii) $R_{203}$ and $R_{204}$ may be linked to each other via a single bond.

In one or more embodiments, at least one selected from $R_{201}$ to $R_{204}$ in Formula 202 may be selected from:

a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothienyl group, but embodiments of the present disclosure are not limited thereto.

The compound represented by Formula 201 may be represented by Formula 201A below:

Formula 201A

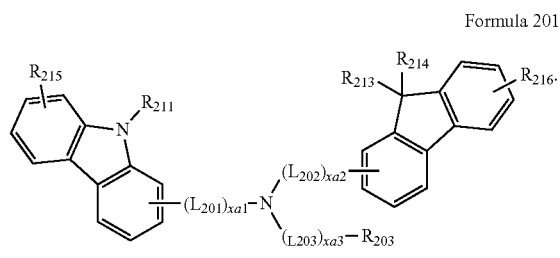

Formula 202A

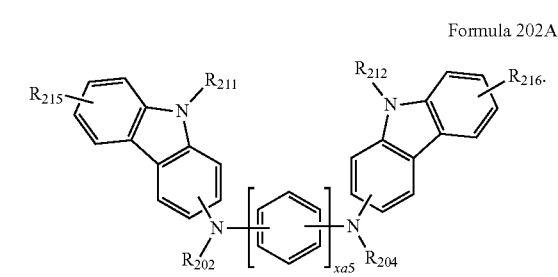

In one embodiment, the compound represented by Formula 201 may be represented by Formula 201A(1) below, but embodiments of the present disclosure are not limited thereto:

Formula 201A(1)

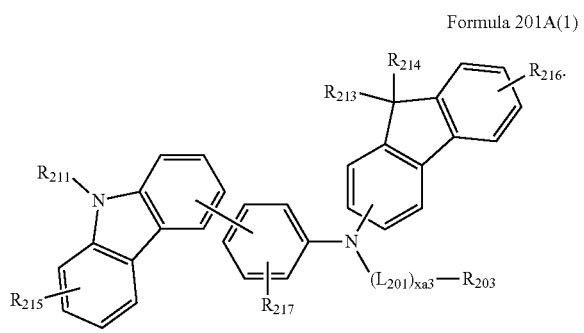

In one or more embodiments, the compound represented by Formula 201 may be represented by Formula 201A-1 below, but embodiments of the present disclosure are not limited thereto:

Formula 201A-1

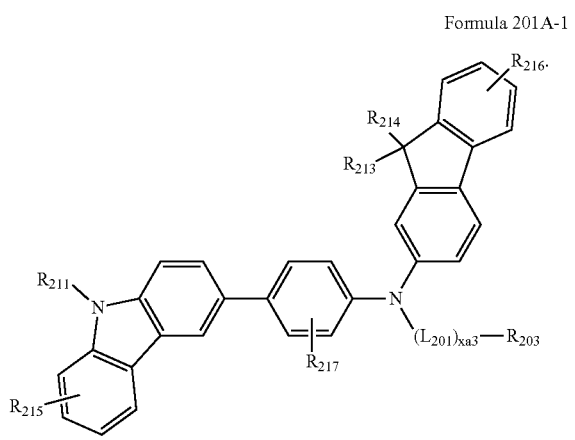

In one embodiment, the compound represented by Formula 202 may be represented by Formula 202A below:

In one embodiment, the compound represented by Formula 202 may be represented by Formula 202A-1 below:

Formula 202A-1

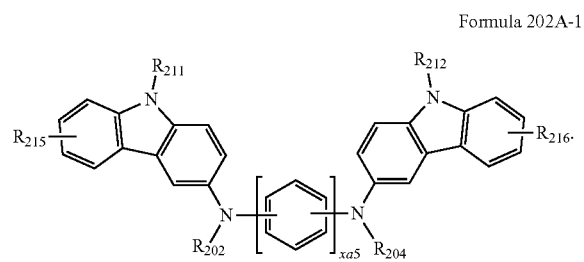

In Formulae 201A, 201A(1), 201A-1, 202A, and 202A-1, $L_{201}$ to $L_{203}$, xa1 to xa3, xa5, and $R_{202}$ to $R_{204}$ are the same as described above, $R_{211}$ and $R_{212}$ may each be understood by referring to the description presented in connection with $R_{203}$, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thienyl group, a furanyl group, a carbazolyl group, an indolyl group, an isoindolyl group, a benzofuranyl group, a benzothienyl group, a dibenzofuranyl group, a dibenzothienyl group, a benzocarbazolyl group, a dibenzocarbazolyl group, a dibenzosilolyl group, and a pyridinyl group.

The hole transport region 151-1, 151-2, or 151-3 may include at least one compound selected from Compounds HT1 to HT39, but embodiments of the present disclosure are not limited thereto:

HT1
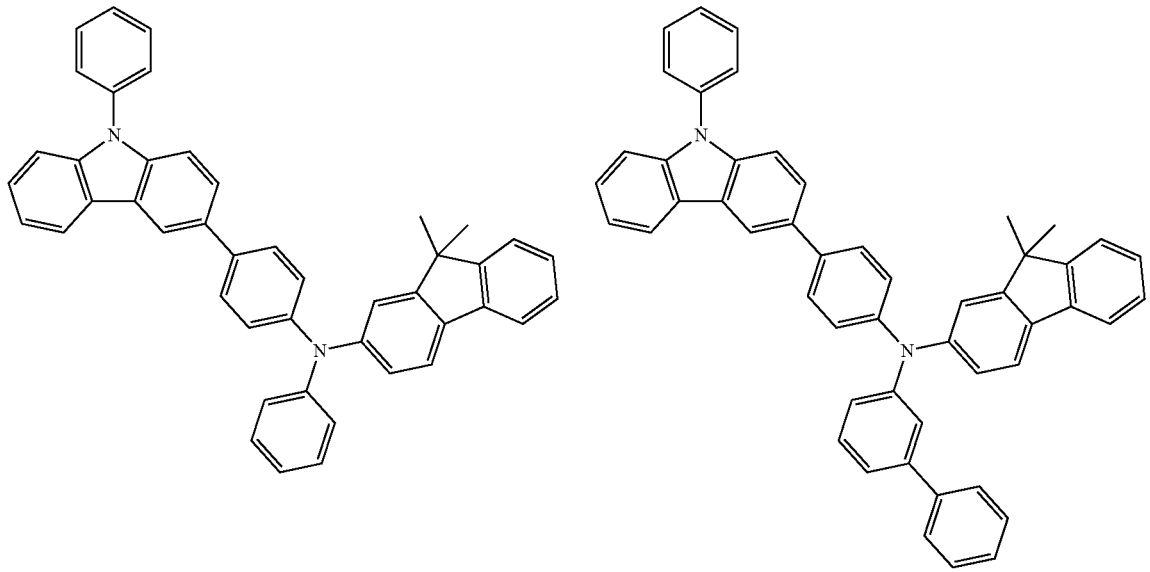
HT2
HT3
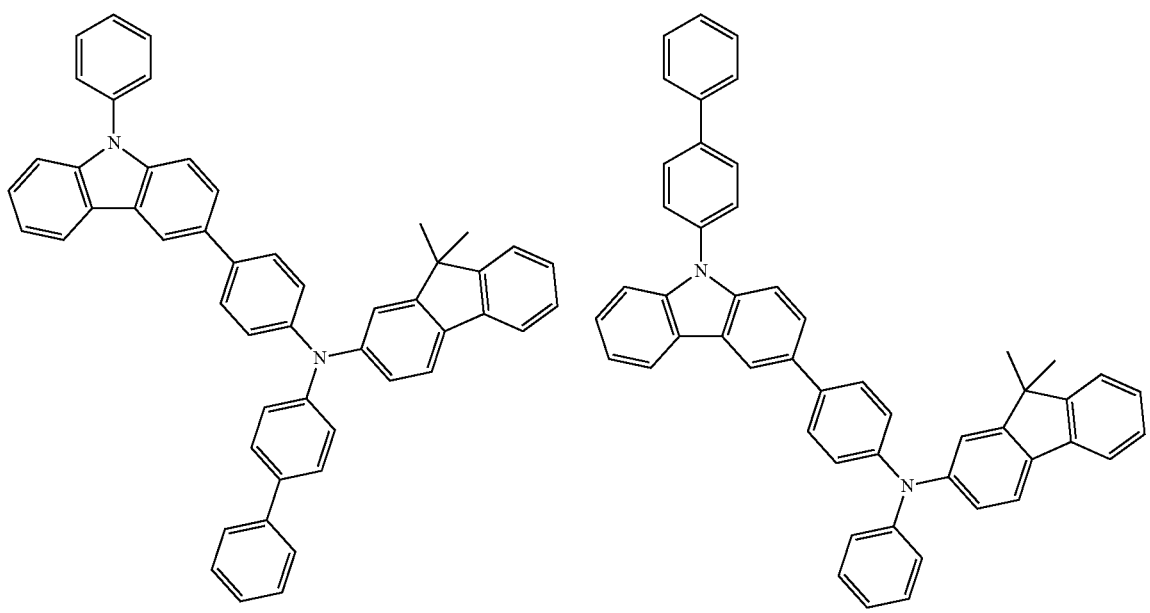
HT4

HT5
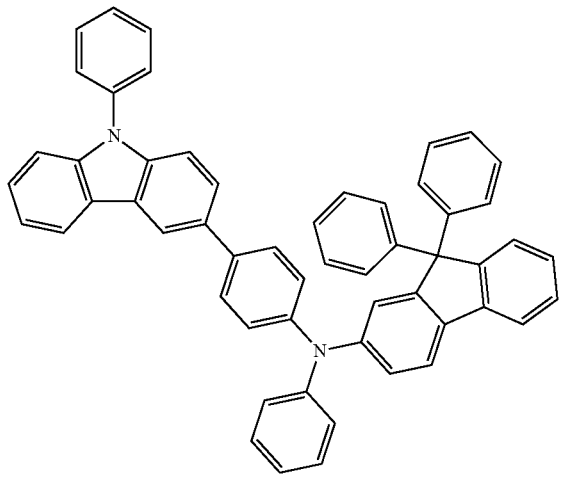
HT6
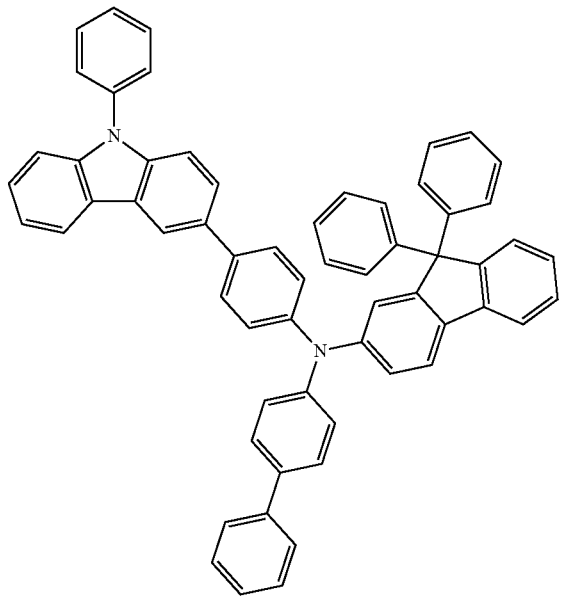
HT7
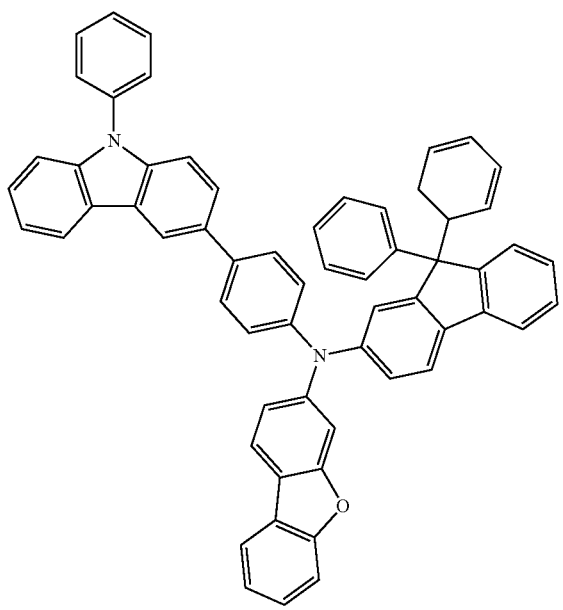
HT8
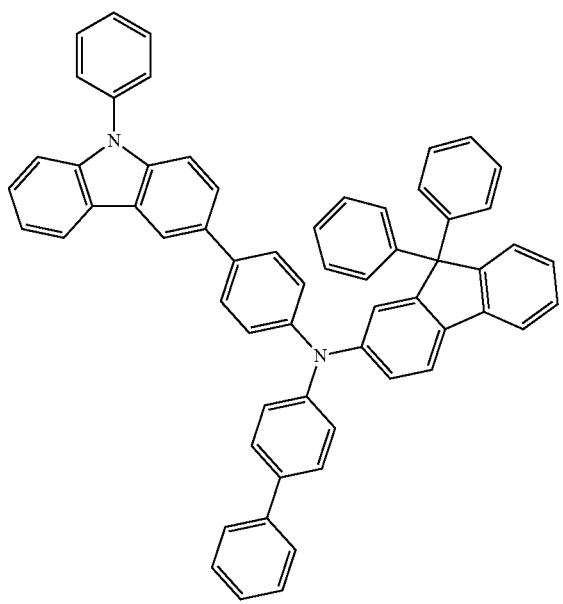

-continued
HT9
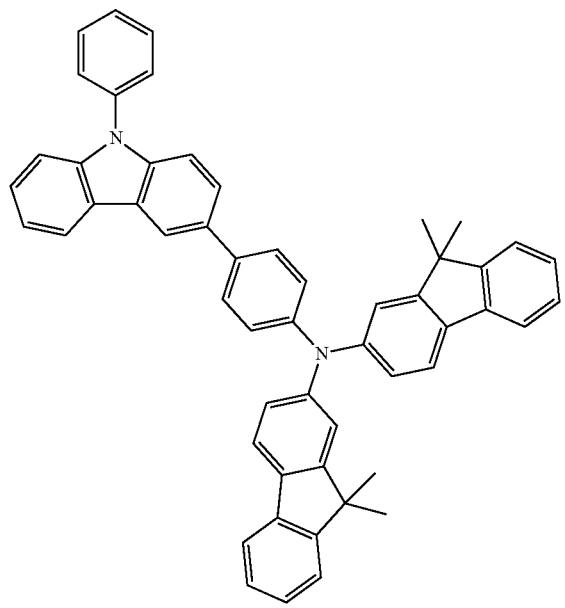
HT10
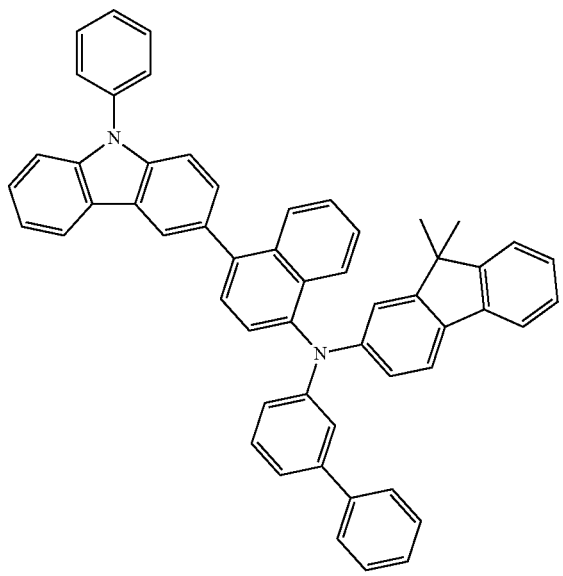
HT11
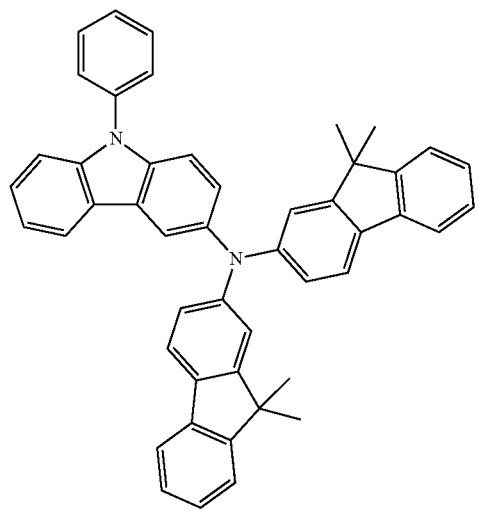
HT12
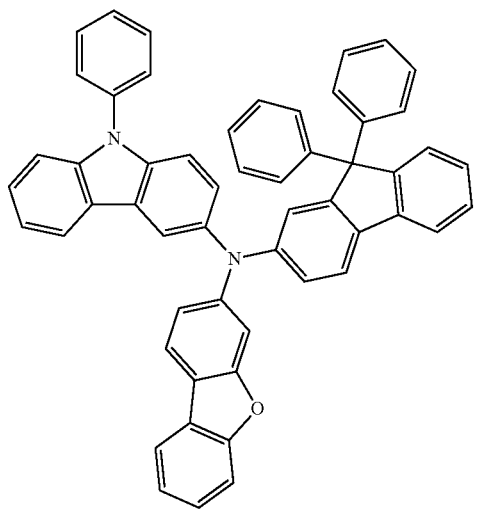

-continued
HT13
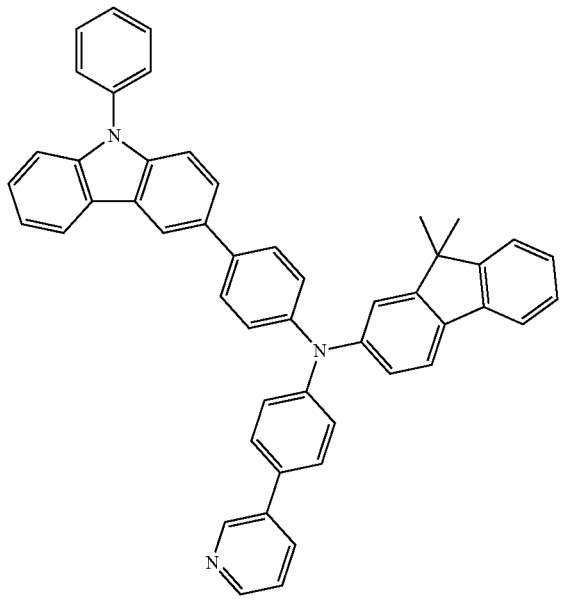
HT14
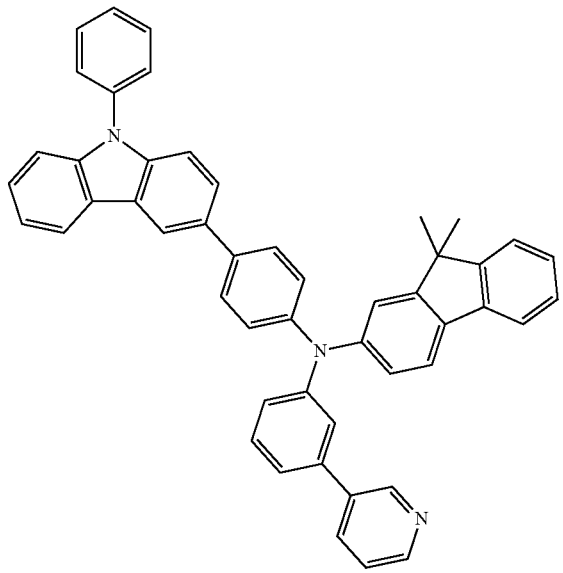
HT15
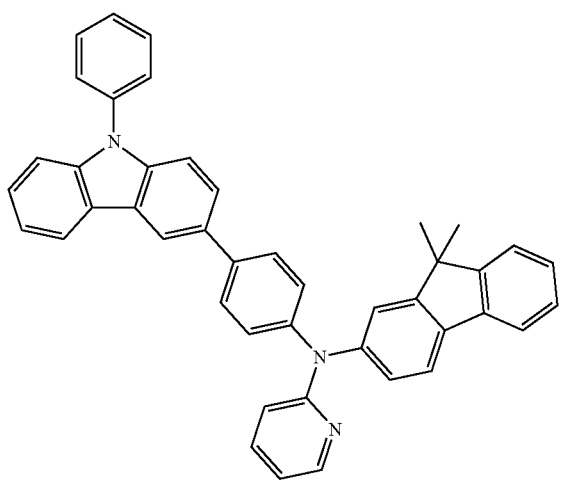
HT16
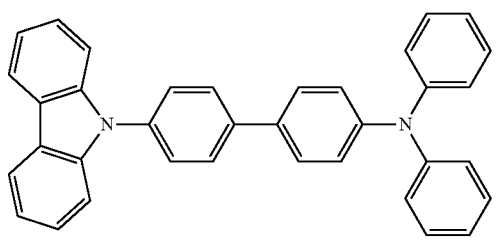
HT17
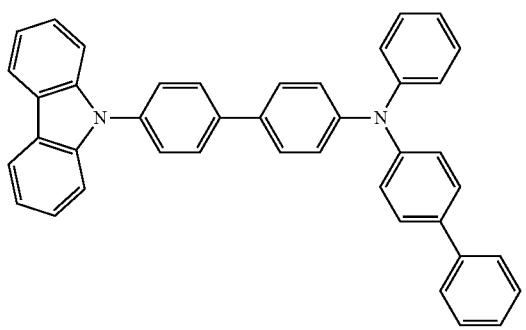
HT18
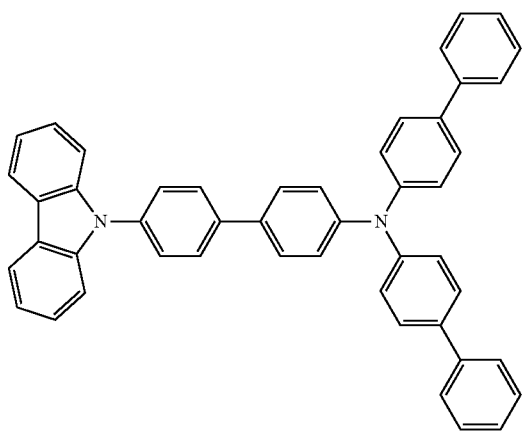

-continued
HT19
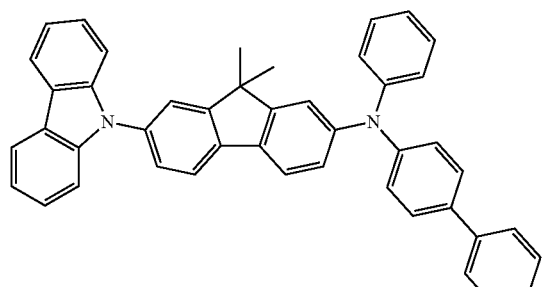
HT20
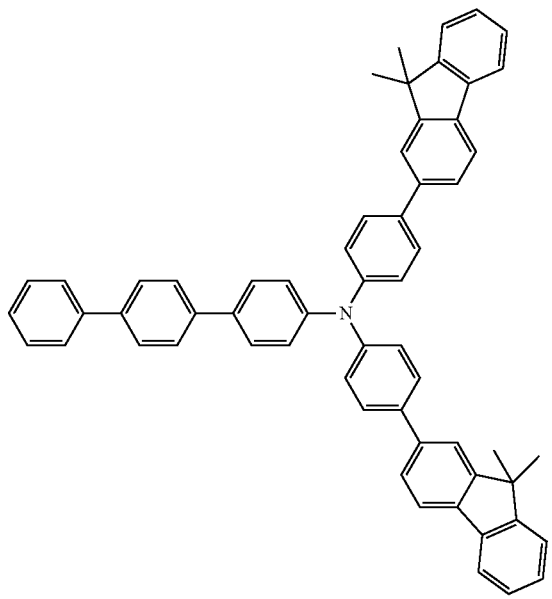
HT21
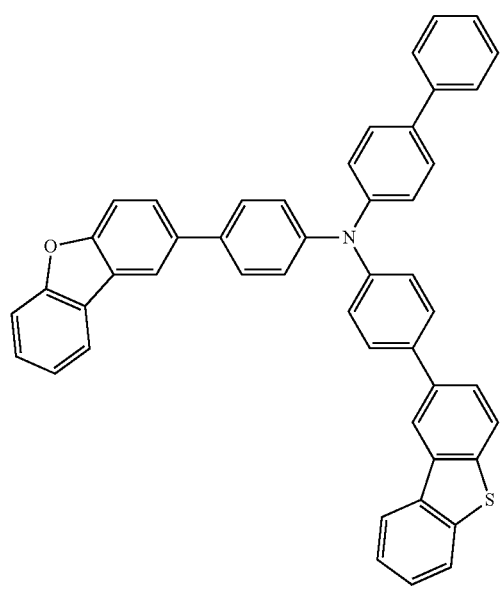
HT22
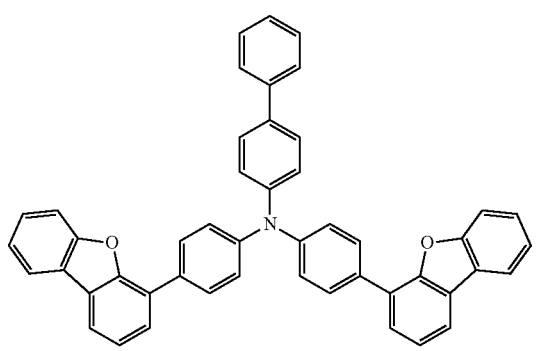

-continued
HT23
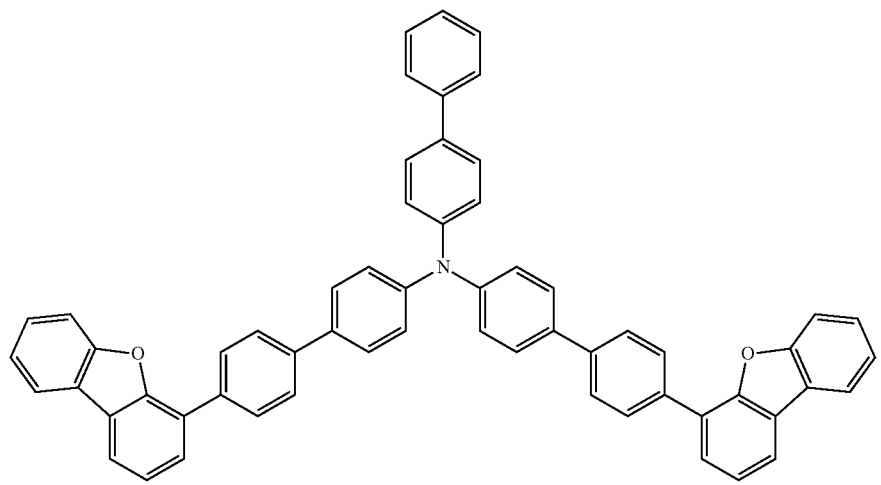
HT24
HT25
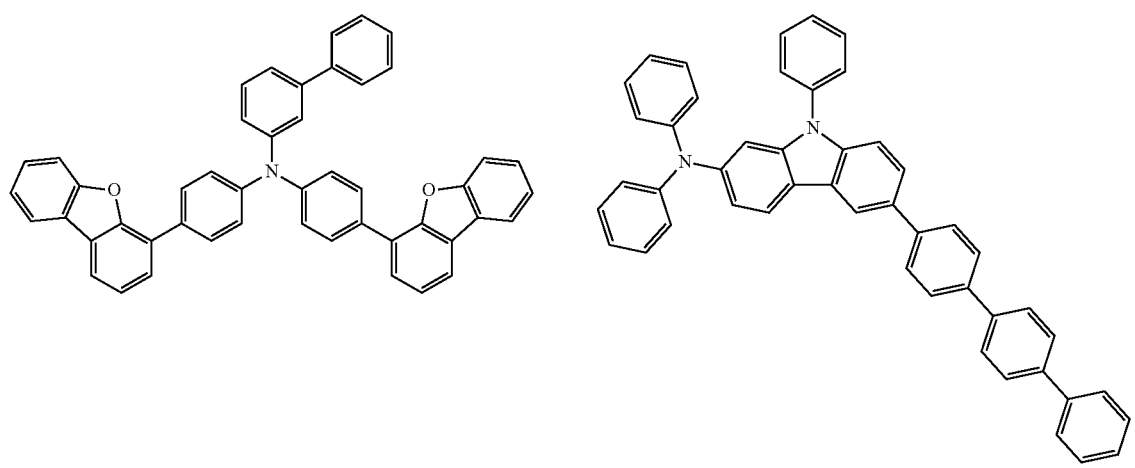
HT26
HT27
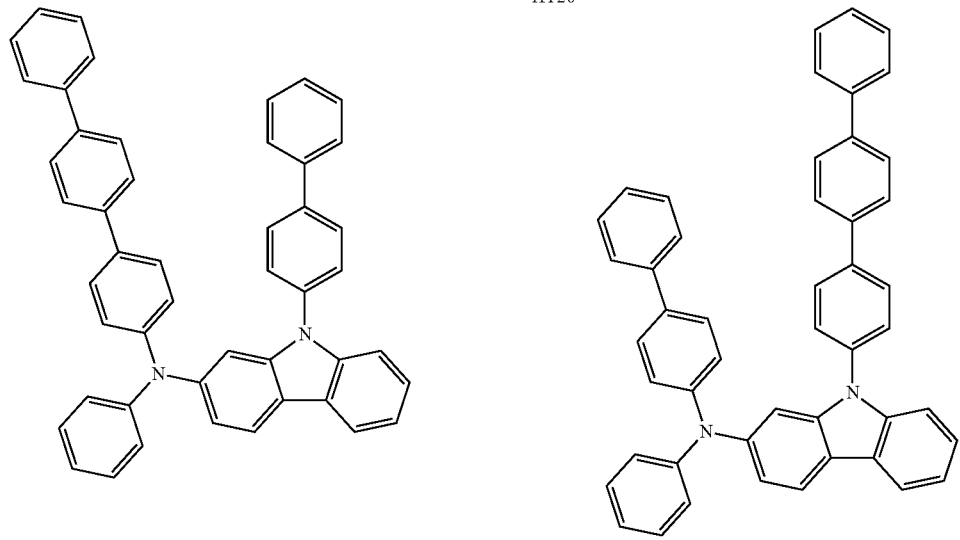

-continued
HT28
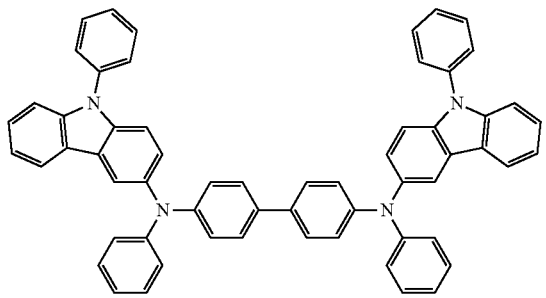
HT29
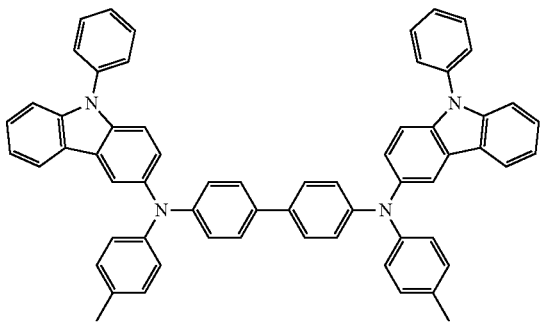
HT30
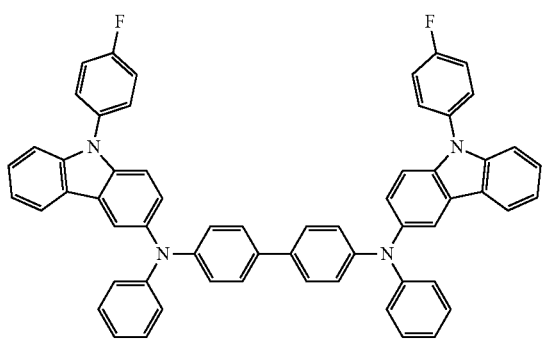
HT31
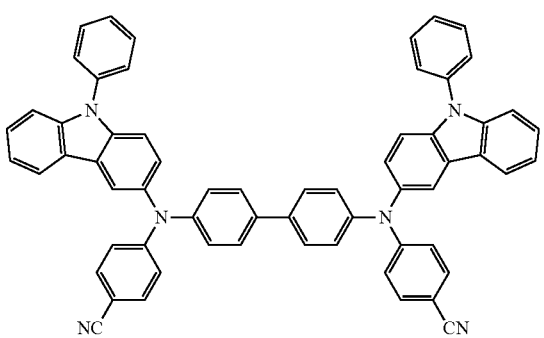
HT32
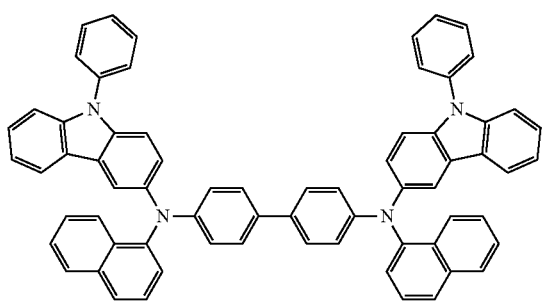
HT33
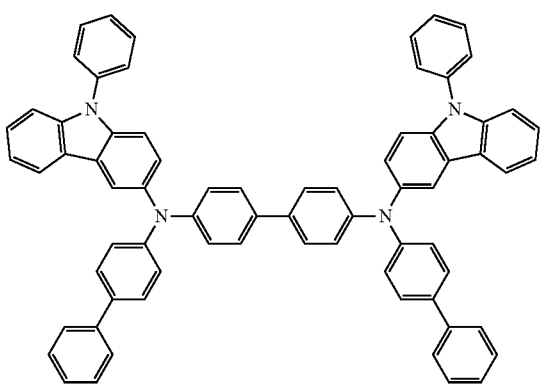
HT34
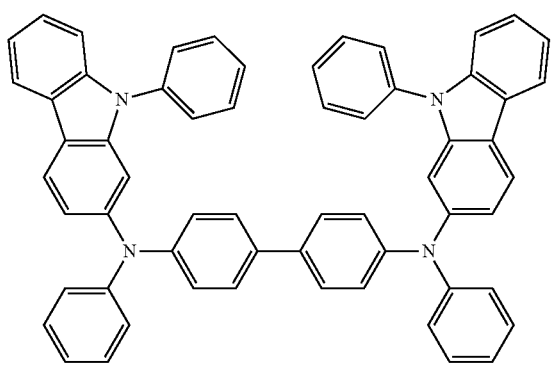
HT35
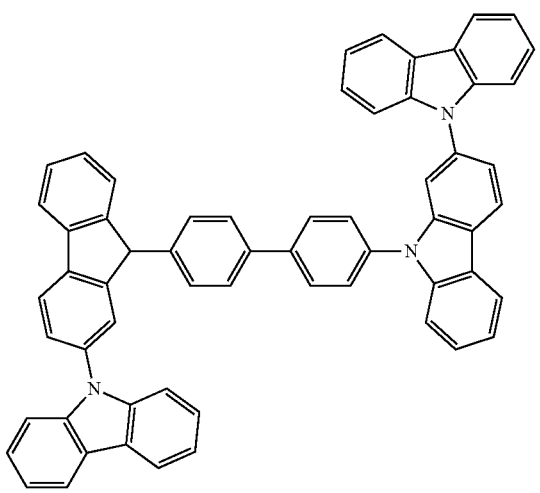

-continued

HT36
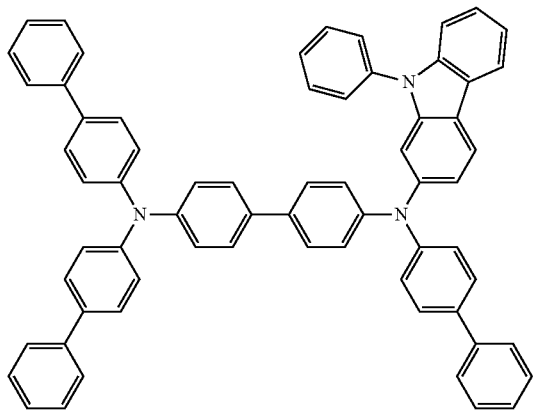

HT37
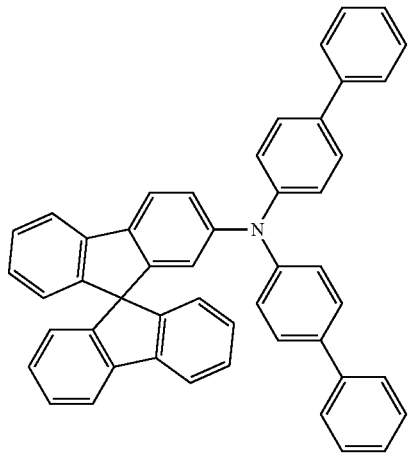

HT38
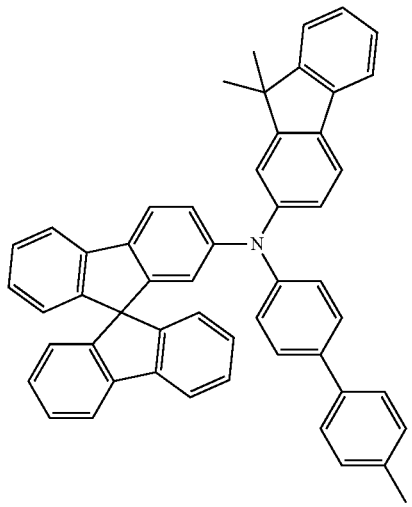

HT39
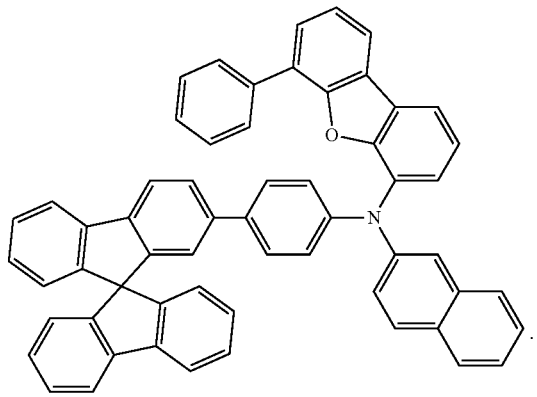

A thickness of the hole transport region 151-1, 151-2, or 151-3 may be in a range of about 100 Å to about 10,000 Å, for example, about 100 Å to about 1,000 Å. When the hole transport region 151-1, 151-2, or 151-3 includes at least one selected from a hole injection layer 151-1a, 151-2a, or 151-3a and a hole transport layer 151-1b, 151-2b, or 151-3b, the thickness of the hole injection layer 151-1a, 151-2a, or 151-3a may be in a range of about 100 Å to about 9,000 Å, and for example, about 100 Å to about 1,000 Å, and the thickness of the hole transport layer 151-1b, 151-2b, or 151-3b may be in a range of about 50 Å to about 2,000 Å, and for example, about 100 Å to about 1,500 Å. When the thicknesses of the hole transport region 151-1, 151-2, or 151-3, the hole injection layer 151-1a, 151-2a, or 151-3a, and the hole transport layer 151-1b, 151-2b, or 151-3b are within any of these ranges, satisfactory (or suitable) hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block or reduce the flow of electrons from an electron transport region. The emission auxiliary layer and the electron blocking layer may each independently include any of the materials as described above.

p-Dopant

The hole transport region 151-1, 151-2, or 151-3 may further include, in addition to the materials described above, a charge-generation material for the improvement of conductive properties.

The charge-generation material may be homogeneously or non-homogeneously dispersed in the hole transport region 151-1, 151-2, or 151-3.

The charge-generation material may be, for example, a p-dopant.

In one embodiment, the p-dopant may have a lowest unoccupied molecular orbital (LUMO) energy level of −3.5 eV or less.

The p-dopant may include at least one selected from a quinone derivative, a metal oxide, and a cyano group-containing compound, but embodiments of the present disclosure are not limited thereto.

In one embodiment, the p-dopant may include at least one selected from:

a quinone derivative, such as tetracyanoquinodimethane (TCNQ) and/or 2,3,5,6-tetrafluoro-7,7,8,8-tetracyanoquinodimethane (F4-TCNQ);

a metal oxide, such as tungsten oxide and/or molybdenum oxide;

1,4,5,8,9,12-hexaazatriphenylene-hexacarbonitrile (HAT-CN); and a compound represented by Formula 221, but embodiments of the present disclosure are not limited thereto:

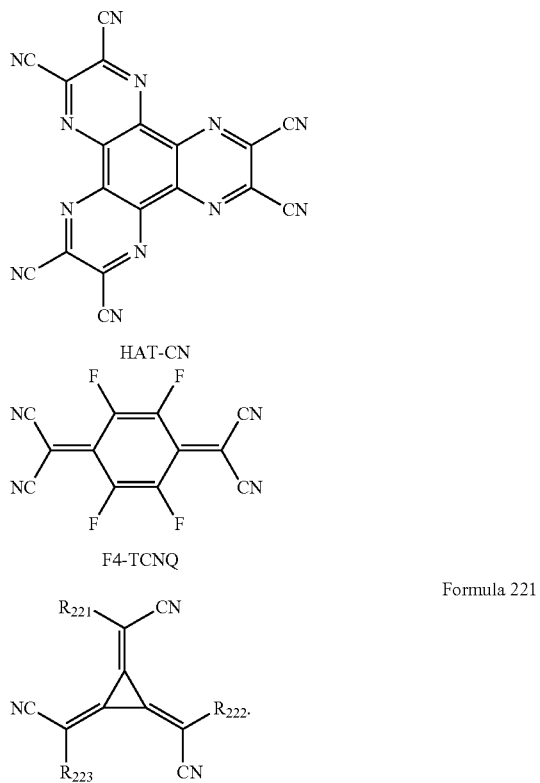

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{221}$ to $R_{223}$ may have at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

Emission Layers 152-1, 152-2, and 152-3 in Organic Layer 150

In the organic light-emitting devices 10 and 20, the light-emitting units 155-1, 155-2, and 155-3 may respectively include the emission layers 152-1, 152-2, and 152-3, and the emission layers 152-1, 152-2, and 152-3 may each have a structure in which two or more layers selected from a red emission layer, a green emission layer, a yellow emission layer, and a blue emission layer are stacked in contact or spaced apart. In addition, the emission layers 152-1, 152-2, and 152-3 may each have a structure in which two or more materials selected from a material for emitting red light, a material for emitting green light, a material for emitting yellow light, and a material for emitting blue light are mixed without layer division.

The light-emitting units 155-1, 155-2, and 155-3 may each further include an electron transport (ET)-auxiliary layer above the emission layer 152-1, 152-2, or 152-3 and/or a hole transport (HT)-auxiliary layer below the emission layer 152-1, 152-2, or 152-3. The HT-auxiliary layer refers to a layer capable of acting as the hole transport layer, the emission auxiliary layer, and/or the electron blocking layer described above, and the ET-auxiliary layer refers to a layer capable of acting as a buffer layer, a hole blocking layer, an electron control layer, and/or an electron transport layer described below. Materials that may be used for the HT-auxiliary layer and the ET-auxiliary layer may be understood by referring to the description presented in connection with the hole transport region described above, and an electron transport region described below.

The emission layers 152-1, 152-2, and 152-3 may each include a host and a dopant. The dopant may include at least one selected from a phosphorescent dopant and a fluorescent dopant.

An amount of the dopant in the emission layers 152-1, 152-2, and 152-3 may each be in a range of about 0.01 parts by weight to about 15 parts by weight based on 100 parts by weight of the host, but embodiments of the present disclosure are not limited thereto.

Thicknesses of the emission layers 152-1, 152-2, and 152-3 may be in a range of about 100 Å to about 1000 Å, for example, about 200 Å to about 600 Å. When the thicknesses of the emission layers 152-1, 152-2, and 152-3 are within the described range, excellent (or suitable) light emission characteristics may be obtained without a substantial increase in driving voltage.

Host in Emission Layer 152-1, 152-2, or 152-3

The host may include a compound represented by Formula 301:

Formula 301

In Formula 301, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $L_{301}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xb1 may be an integer selected from 0 to 5, $R_{301}$ may be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), and —P(=O)($Q_{301}$)($Q_{302}$), xb21 may be an integer selected from 1 to 5, and $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments of the present disclosure are not limited thereto.

In one embodiment, $Ar_{301}$ in Formula 301 may be selected from:

a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group; and a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and $Q_{31}$ to $Q_{33}$ may be selected from a $C_1$-$C_{10}$ alkyl group, a $C_1$-$C_{10}$ alkoxy group, a phenyl group, a biphenyl group, a terphenyl group, and a naphthyl group, but embodiments of the present disclosure are not limited thereto.

When xb11 in Formula 301 is 2 or more, two or more $Ar_{301}$(s) may be linked via a single bond.

In one or more embodiments, the compound represented by Formula 301 may be represented by Formula 301-1 or Formula 301-2:

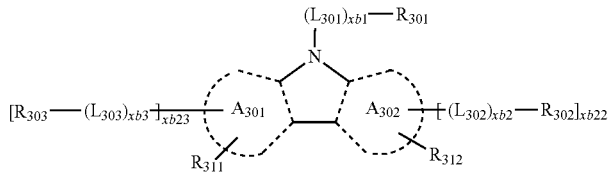

Formula 301-1

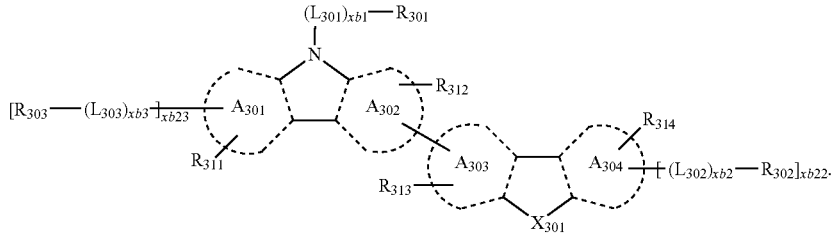

Formula 301-2

In Formulae 301-1 and 301-2, $A_{301}$ to $A_{304}$ may each independently be selected from a benzene group, a naphthalene group, a phenanthrene group, a fluoranthene group, a triphenylene group, a pyrene group, a chrysene group, a pyridine group, a pyrimidine group, an indene group, a fluorene group, a spiro-bifluorene group, a benzofluorene group, a dibenzofluorene group, an indole group, a carbazole group, a benzocarbazole group, a dibenzocarbazole group, a furan group, a benzofuran group, a dibenzofuran group, a naphthofuran group, a benzonaphthofuran group, a dinaphthofuran group, a thiophene group, a benzothiophene group, a dibenzothiophene group, a naphthothiophene group, a benzonaphthothiophene group, and a dinaphthothiophene group, $X_{301}$ may be O, S, or N-[($L_{304}$)$_{xb4}$-$R_{304}$], $R_{311}$ to $R_{314}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), xb22 and xb23 may each independently be 0, 1, or 2, $L_{301}$, xb1, $R_{301}$, and $Q_{31}$ to $Q_{33}$ are the same as described above, $L_{302}$ to $L_{304}$ may each be understood by referring to the description presented in connection with $L_{301}$, xb2 to xb4 may each be understood by referring to the description presented in connection with xb1, and $R_{302}$ to $R_{304}$ may each be understood by referring to the description presented in connection with $R_{301}$.

For example, $L_{301}$ to $L_{304}$ in Formulae 301, 301-1, and 301-2 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thienylene group, a furanylene group, a carbazolylene group, an indolylene group, an isoindolylene group, a benzofuranylene group, a benzothienylene group, a dibenzofuranylene group, a dibenzothienylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an benzoisothiazolylene group, a benzoxazolylene group, an benzoisoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thienylene group, a furanylene group, a carbazolylene group, an indolylene group, an isoindolylene group, a benzofuranylene group, a benzothienylene group, a dibenzofuranylene group, a dibenzothienylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an benzoisothiazolylene group, a benzoxazolylene group, an benzoisoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thienyl group, a furanyl group, a carbazolyl group, an indolyl group, an isoindolyl group, a benzofuranyl group, a benzothienyl group, a dibenzofuranyl group, a dibenzothienyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an benzoisothiazolyl group, a benzoxazolyl group, an benzoisoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and $Q_{31}$ to $Q_{33}$ are the same as described above.

In one embodiment, $R_{301}$ to $R_{304}$ in Formulae 301, 301-1, and 301-2 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thienyl group, a furanyl group, a carbazolyl group, an indolyl group, an isoindolyl group, a benzofuranyl group, a benzothienyl group, a dibenzofuranyl group, a dibenzothienyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an benzoisothiazolyl group, a benzoxazolyl group, an benzoisoxazolyl group, a triazolyl group, a tetrazolyl group, an imidazopyridinyl group, an imidazopyrimidinyl group, and an azacarbazolyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thienyl group, a furanyl group, a carbazolyl group, an indolyl group, an isoindolyl group, a benzofuranyl group, a benzothienyl group, a dibenzofuranyl group, a dibenzothienyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an benzoisothiazolyl group, a benzoxazolyl group, an benzoisoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thienyl group, a furanyl group, a carbazolyl group, an indolyl group, an isoindolyl group, a benzofuranyl group, a benzothienyl group, a dibenzofuranyl group, a dibenzothienyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an benzoisothiazolyl group, a benzoxazolyl group, an benzoisoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and $Q_{31}$ to $Q_{33}$ are the same as described above.

In one or more embodiments, the host may include an alkaline earth metal complex. For example, the host may be selected from a Be complex (for example, Compound H55), a Mg complex, and a Zn complex.

The host may include at least one selected from 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), and Compounds H1 to H55, but embodiments of the present disclosure are not limited thereto:

H1

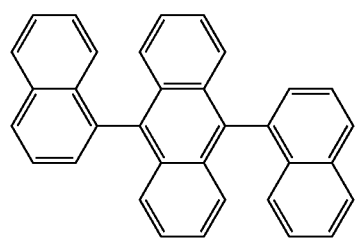

H2

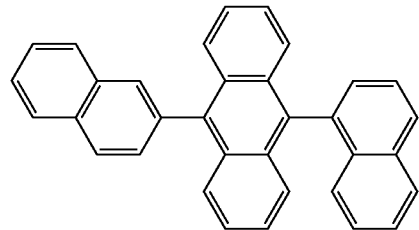

H3

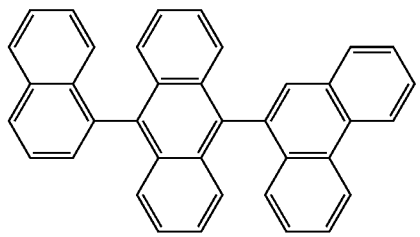

H4

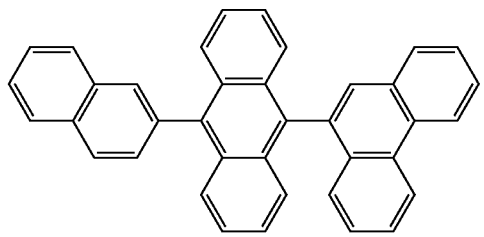

H5

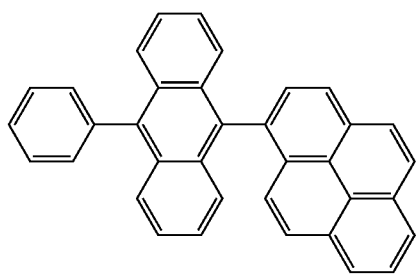

H6

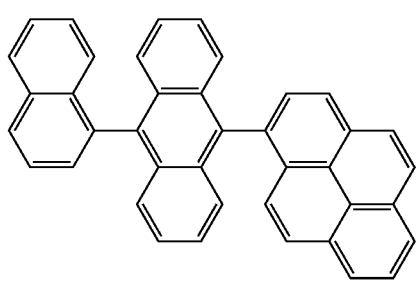

H7

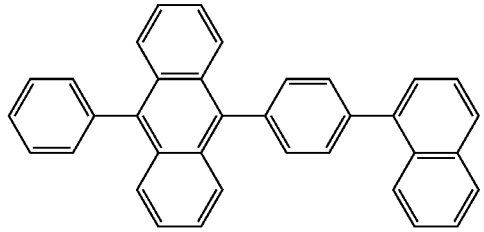

H8

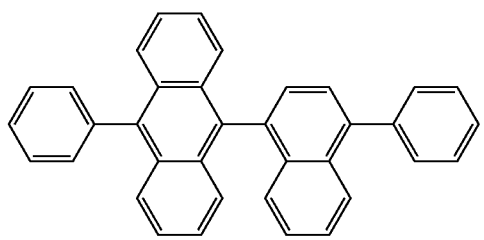

H9
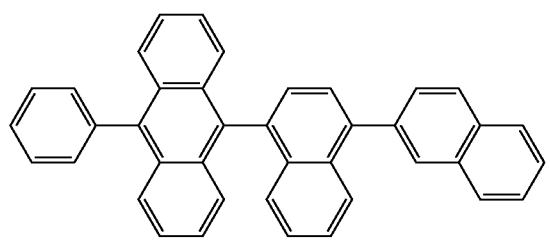
H10
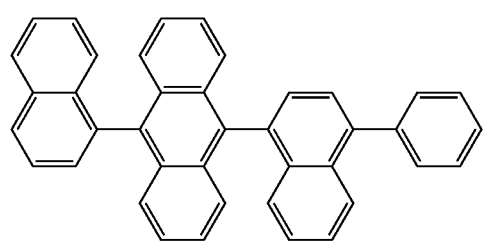
H11
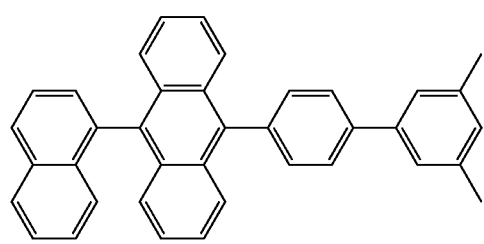
H12
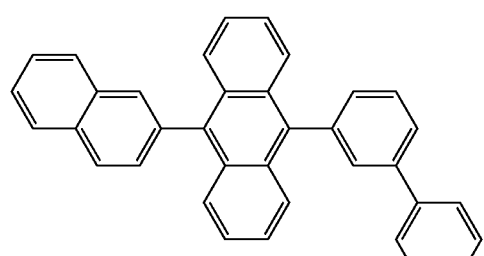
H13
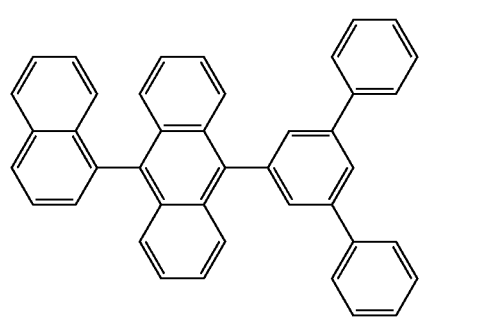
H14
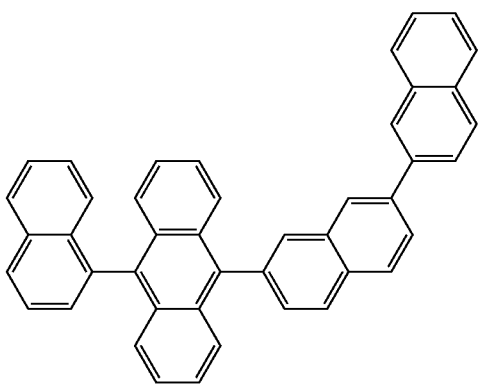
H15
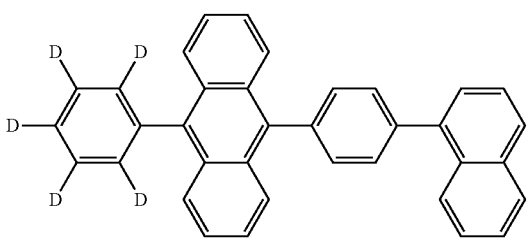
H16
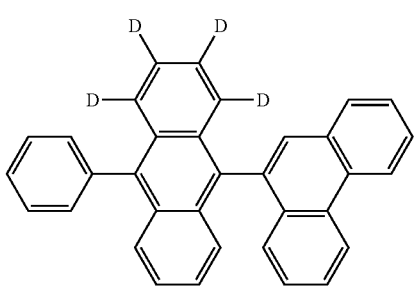
H17
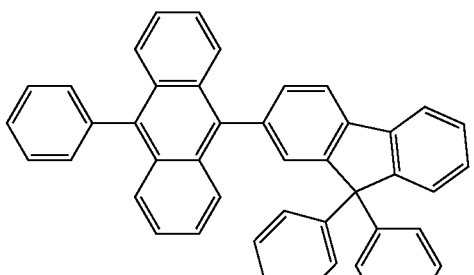
H18
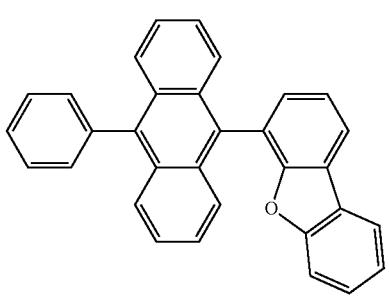

H19
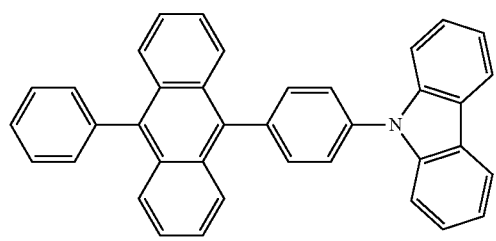
H20
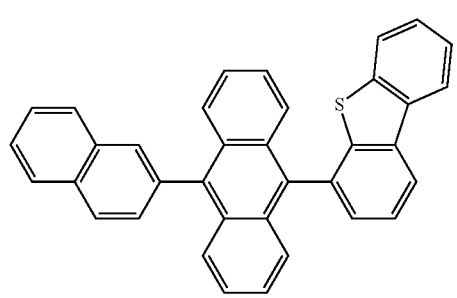
H21
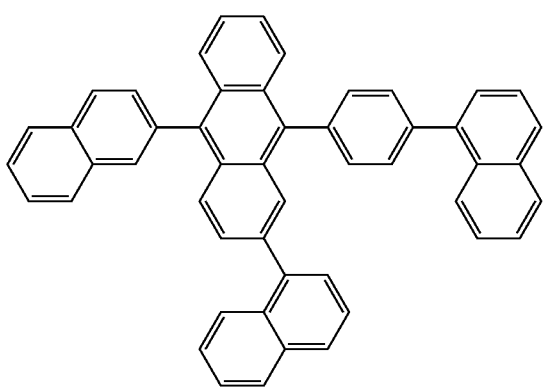
H22
H23
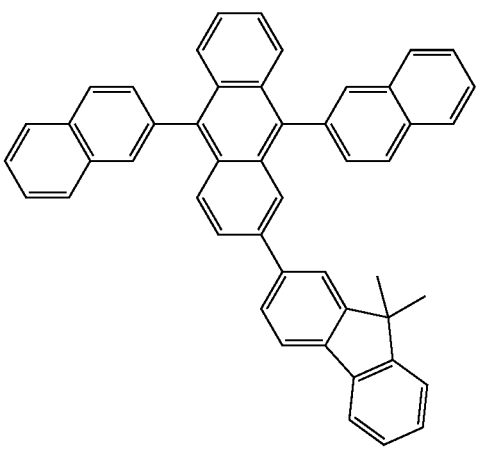
H24
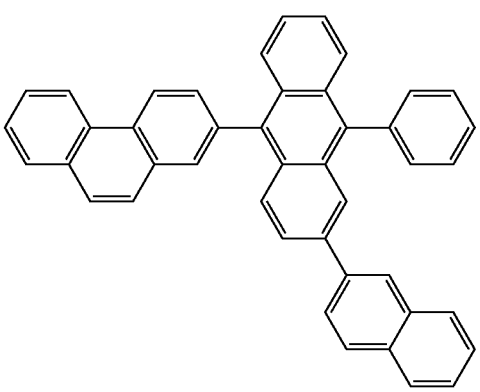
H25
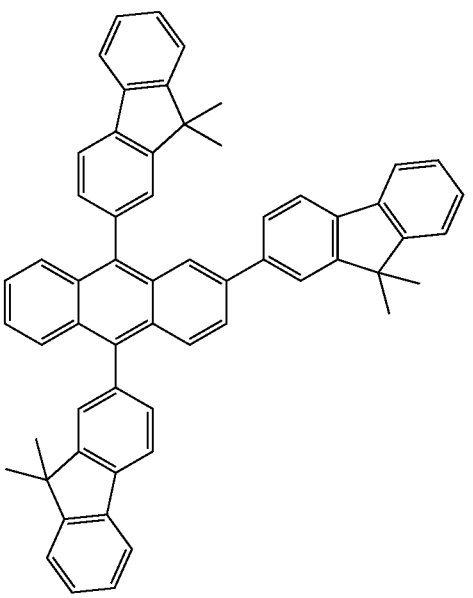

H26
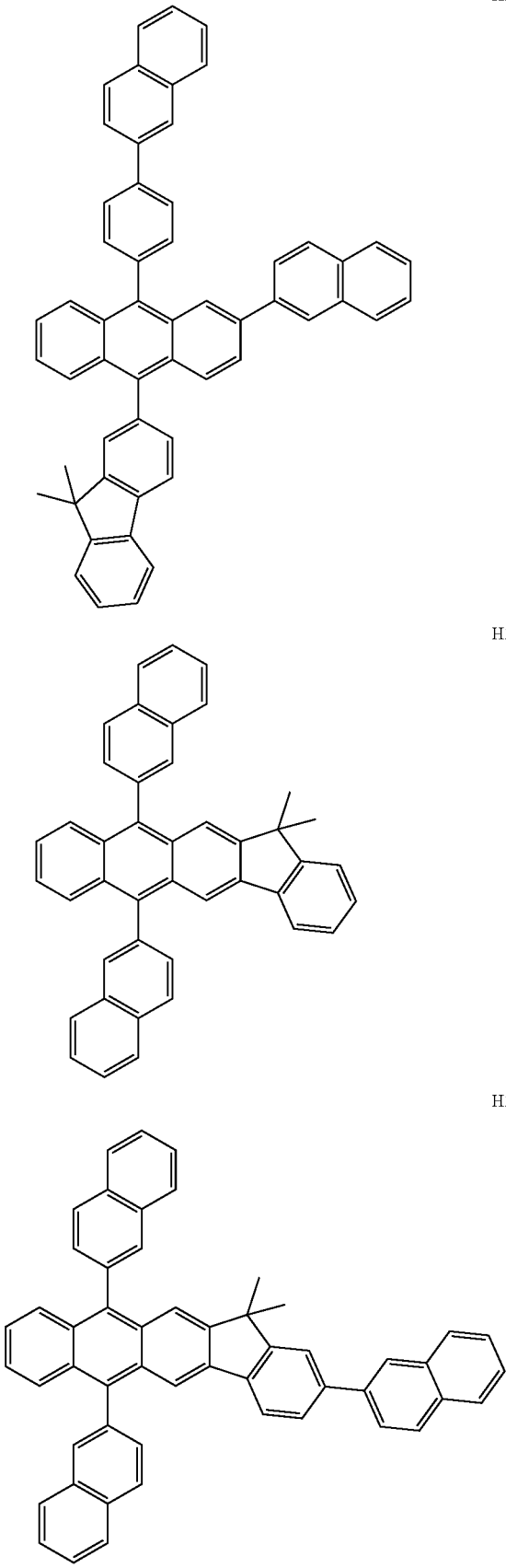
H27
H28
H29
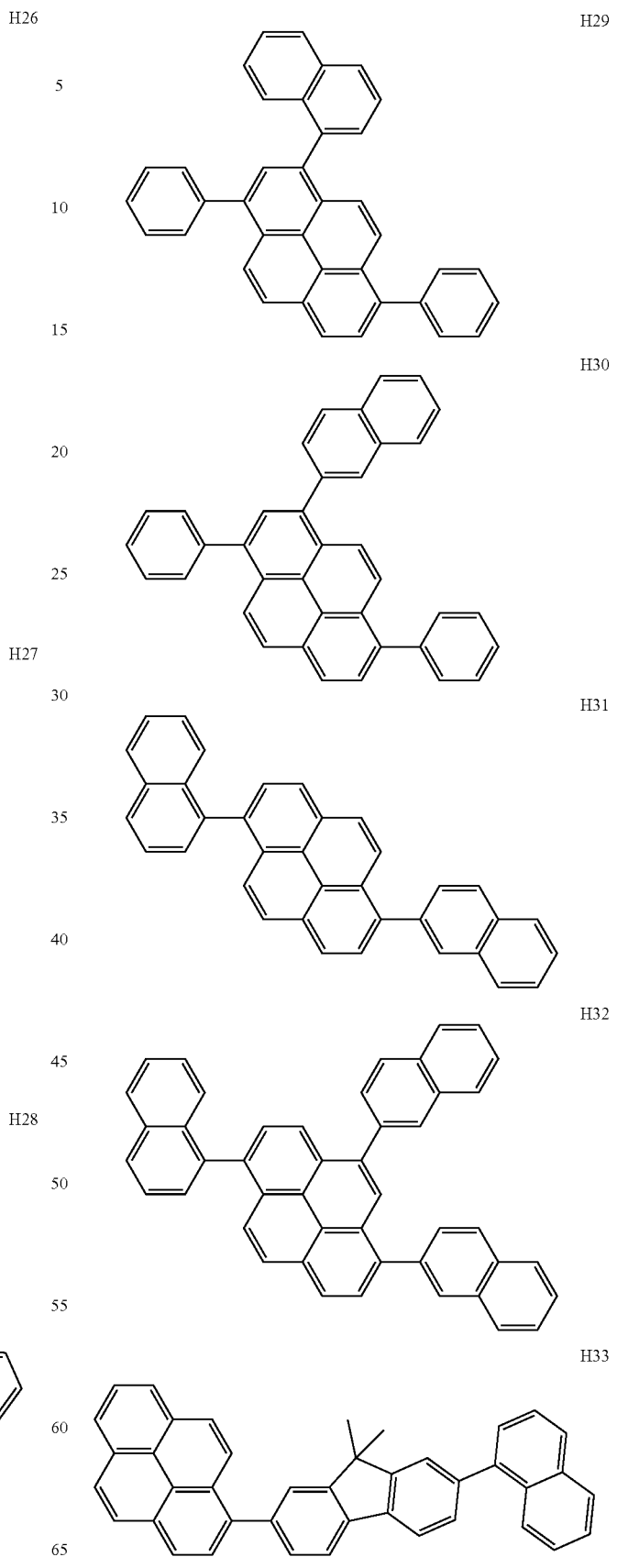
H30
H31
H32
H33

H34
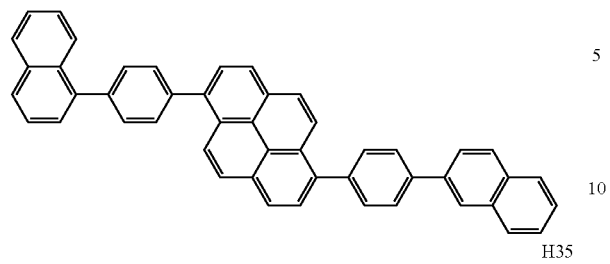
H35
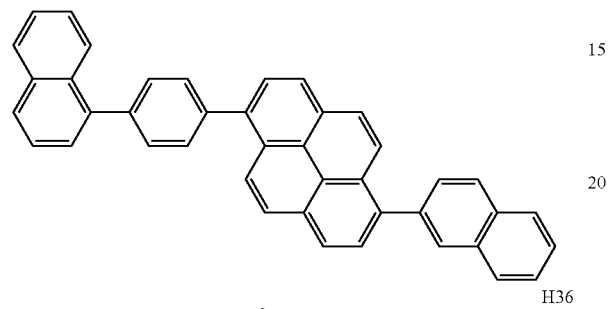
H36
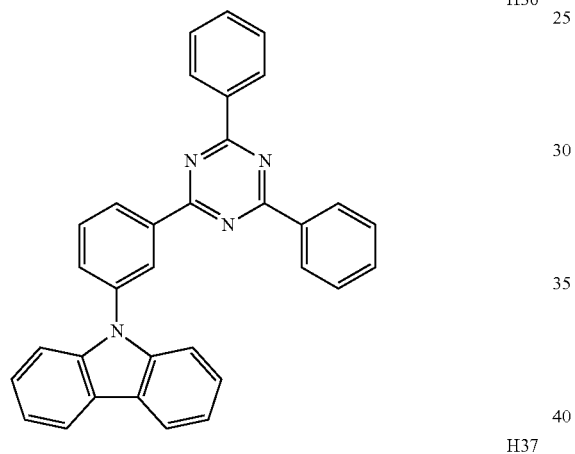
H37
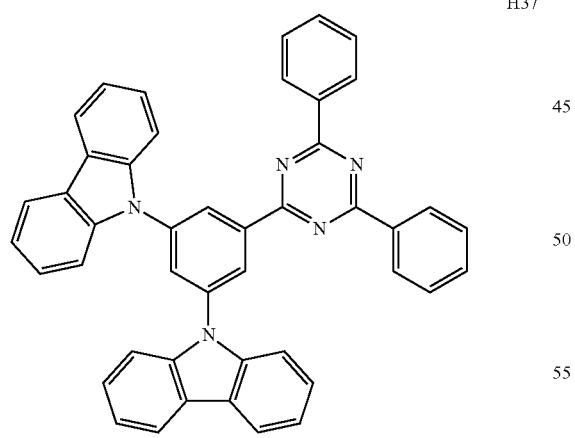
H38
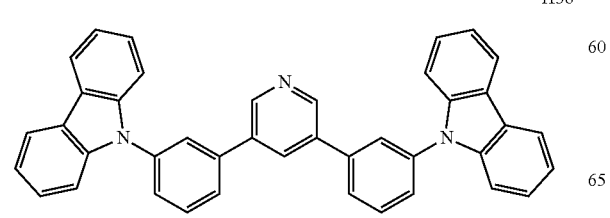
H39
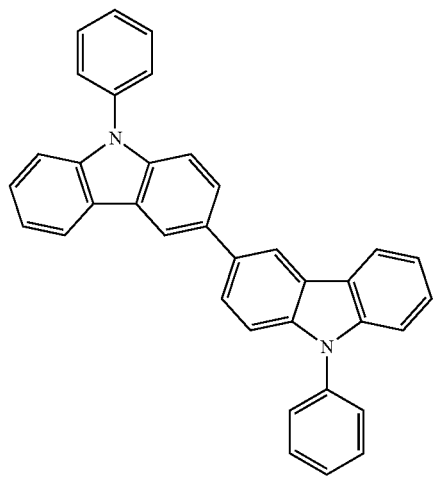
H40
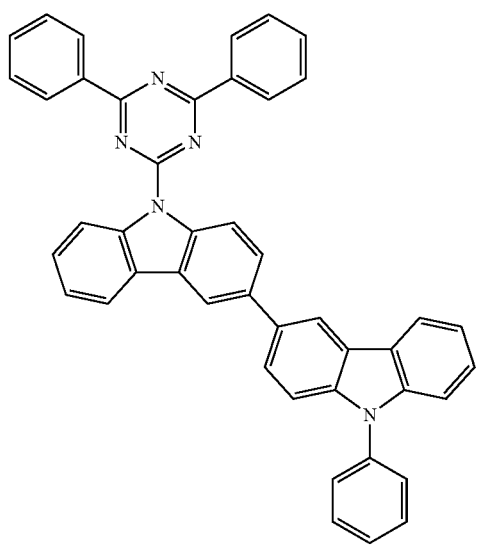
H41
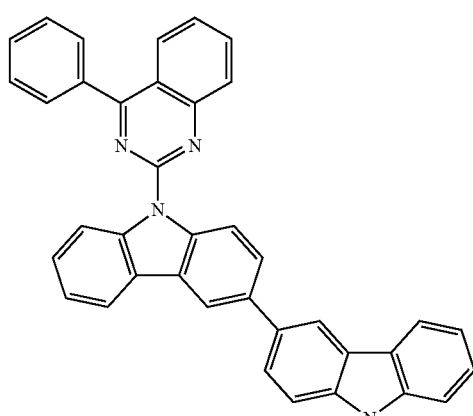
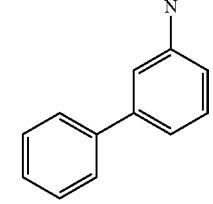

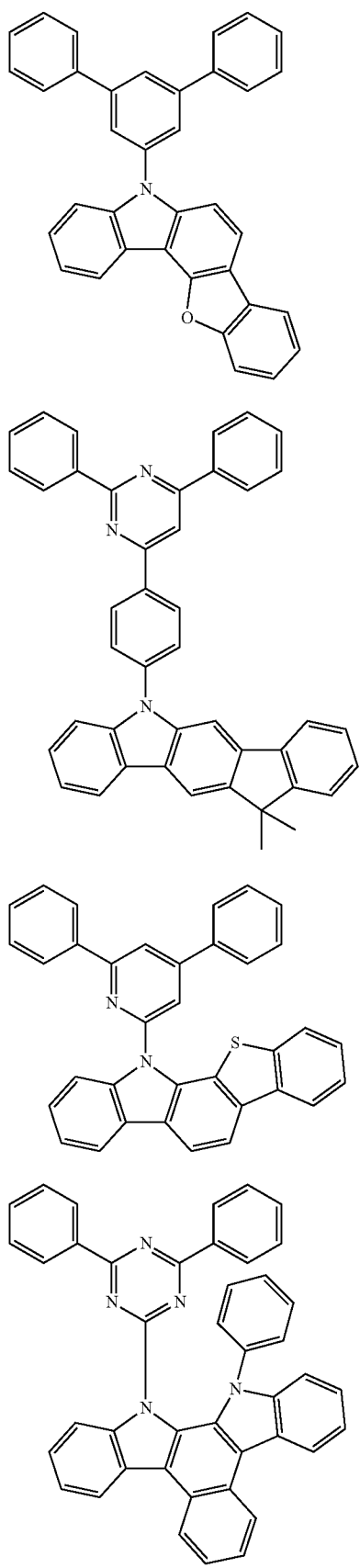
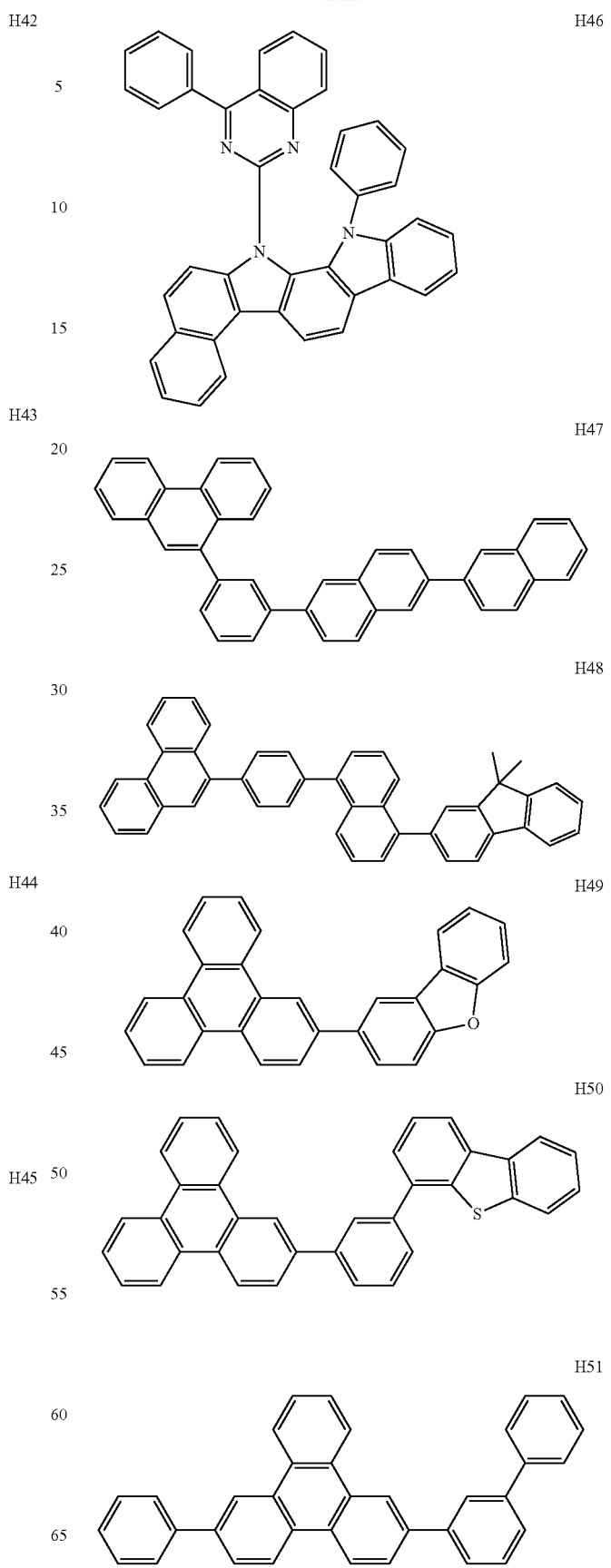

H52

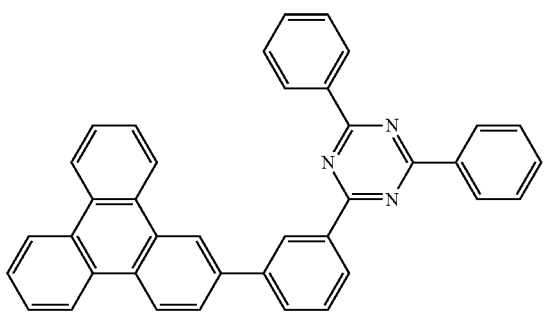

H53

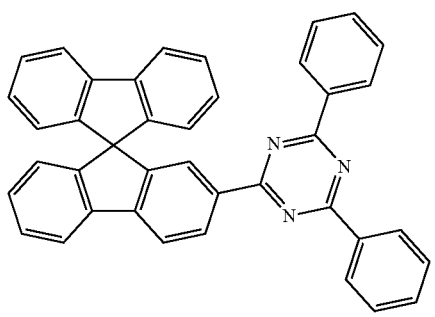

H54

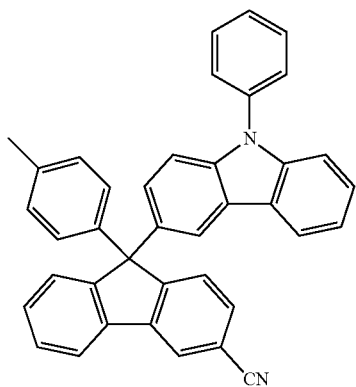

H55

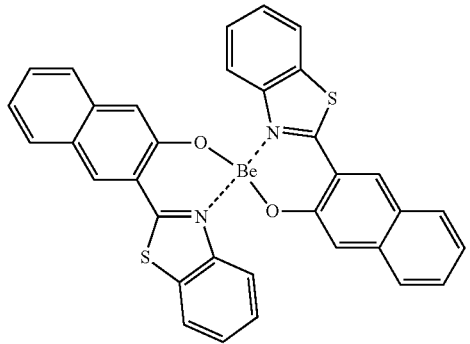

Phosphorescent Dopant Included in Emission Layer 152-1, 152-2, or 152-3 in Organic Layer 150

The phosphorescent dopant may include an organometallic complex represented by Formula 401 below:

$$M(L_{401})_{xc1}(L_{402})_{xc2}.\qquad \text{Formula 401}$$

In Formula 401,

M may be selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), $L_{401}$ may be selected from ligands represented by Formula 402, and xc1 may be 1, 2, or 3, wherein, when xc1 is two or more, two or more $L_{401}$(s) may be identical to or different from each other,

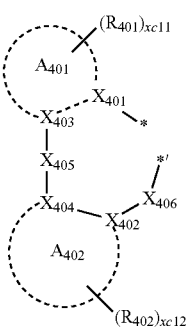

Formula 402

$L_{402}$ may be an organic ligand, and xc2 may be an integer selected from 0 to 4, wherein, when xc2 is two or more, two or more $L_{402}$(s) may be identical to or different from each other, In Formula 402, $X_{401}$ to $X_{404}$ may each independently be nitrogen or carbon, $X_{401}$ and $X_{403}$ may be linked via a single bond or a double bond, and $X_{402}$ and $X_{404}$ may be linked via a single bond or a double bond, $A_{401}$ and $A_{402}$ may each independently be selected from a $C_5$-$C_{60}$ carbocyclic group and a $C_1$-$C_{60}$ heterocyclic group, $X_{405}$ may be a single bond, *—O—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C=*', wherein $Q_{411}$ and $Q_{412}$ may be hydrogen, deuterium, a $C_1$-$C_{20}$ alkyl group, a $C_1$-$C_{20}$ alkoxy group, a phenyl group, a biphenyl group, a terphenyl group, or a naphthyl group, $X_{406}$ may be a single bond, O, or S, $R_{401}$ and $R_{402}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), and —P(=O)($Q_{401}$)($Q_{402}$), wherein $Q_{401}$ to $Q_{403}$ may each independently be selected from a $C_1$-$C_{10}$ alkyl group, a $C_1$-$C_{10}$ alkoxy group, a $C_6$-$C_{20}$ aryl group, and a $C_1$-$C_{20}$ heteroaryl group, xc11 and xc12 may each independently be an integer selected from 0 to 10, and

* and *' in Formula 402 each indicate a binding site to M in Formula 401.

In one embodiment, $A_{401}$ and $A_{402}$ in Formula 402 may each independently be selected from a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an benzoisothiophene group, a benzoxazole group, an benzoisoxazole group, a triazole group, a tetrazole group, an oxadiazole group, a triazine group, a dibenzofuran group, and a dibenzothiophene group.

In one or more embodiments, in Formula 402, i) $X_{401}$ may be nitrogen, and $X_{402}$ may be carbon, or ii) $X_{401}$ and $X_{402}$ may each be nitrogen at the same time.

In one or more embodiments, $R_{401}$ and $R_{402}$ in Formula 402 may each independently be selected from:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a phenyl group, a naphthyl group, a cyclopentyl group, a cyclohexyl group, an adamantanyl group, a norbornanyl group, and a norbornenyl group;

a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothienyl group;

a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothienyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothienyl group; and —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), and —P(=O)($Q_{401}$)($Q_{402}$), and $Q_{401}$ to $Q_{403}$ may each independently be selected from a $C_1$-$C_{10}$ alkyl group, a $C_1$-$C_{10}$ alkoxy group, a phenyl group, a biphenyl group, and a naphthyl group, but embodiments of the present disclosure are not limited thereto.

In one or more embodiments, when xc1 in Formula 401 is 2 or more, two $A_{401}$(s) in two or more $L_{401}$(s) may optionally be linked via $X_{407}$, which is a linking group, and/or two $A_{402}$(s) in two or more $L_{401}$(s) may optionally be linked via $X_{408}$, which is a linking group (see e.g., Compounds PD1 to PD4 and PD7). $X_{407}$ and $X_{408}$ may each independently be a single bond, *—C(=O)—*', *—N($Q_{413}$)-*', *—C($Q_{413}$)($Q_{414}$)-*', or *—C($Q_{413}$)=C($Q_{414}$)-*' (wherein $Q_{413}$ and $Q_{414}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group), but are not limited thereto.

$L_{402}$ in Formula 401 may be a monovalent, divalent, or trivalent organic ligand. For example, $L_{402}$ may be selected from halogen, diketone (for example, acetylacetonate), carboxylic acid (for example, picolinate), —C(=O), isonitrile, —CN, and phosphorus-containing ligand (for example, phosphine and/or phosphite), but embodiments of the present disclosure are not limited thereto.

In one or more embodiments, the phosphorescent dopant may be selected from, for example, Compounds PD1 to PD25, but embodiments of the present disclosure are not limited thereto:

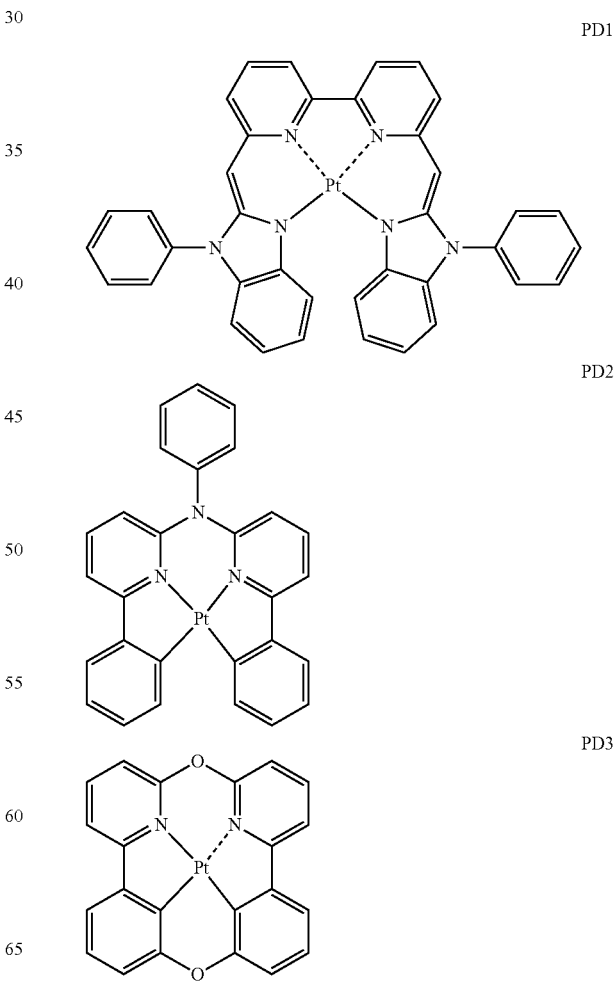

PD1

PD2

PD3

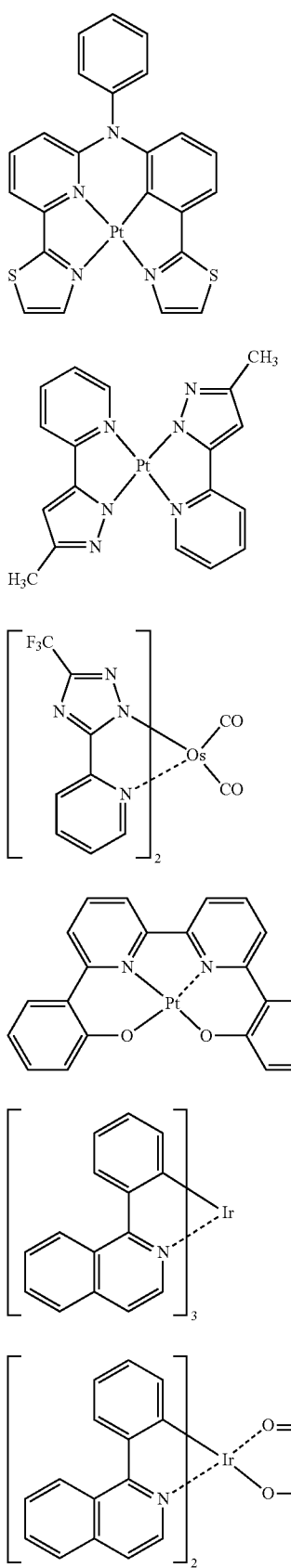
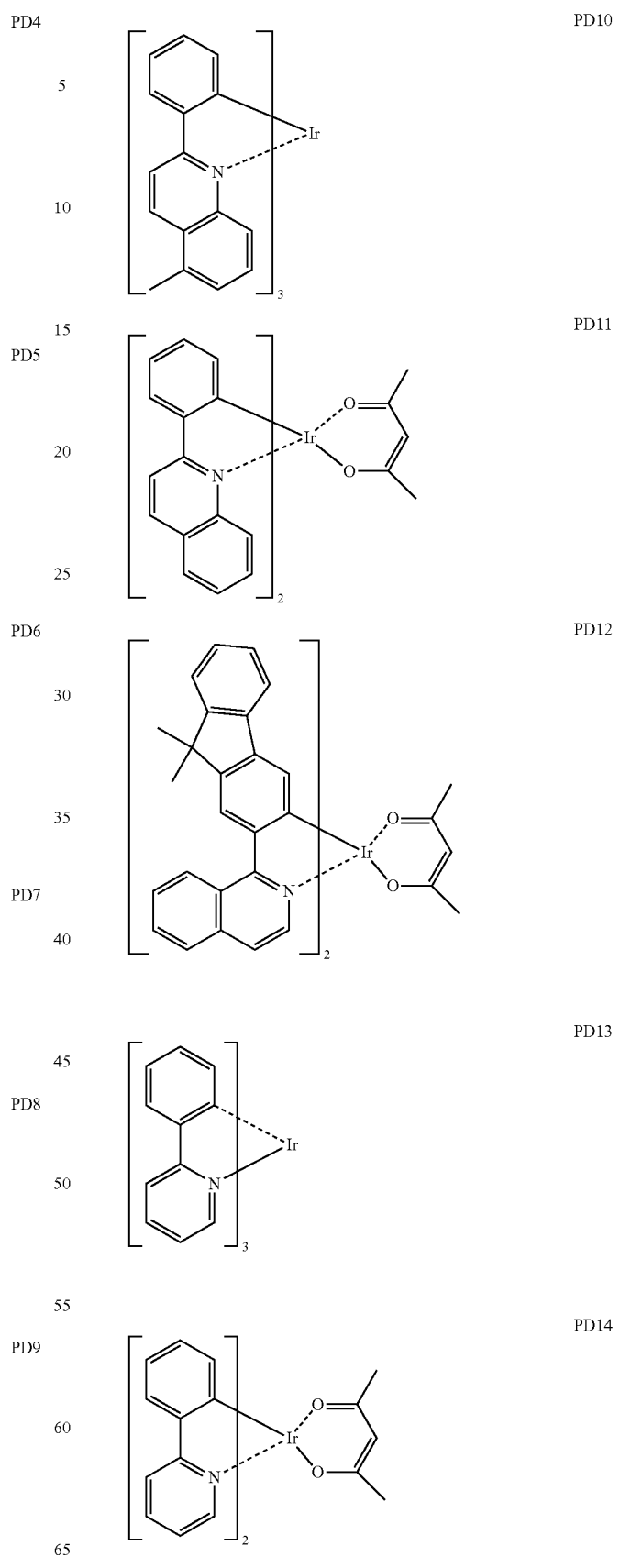

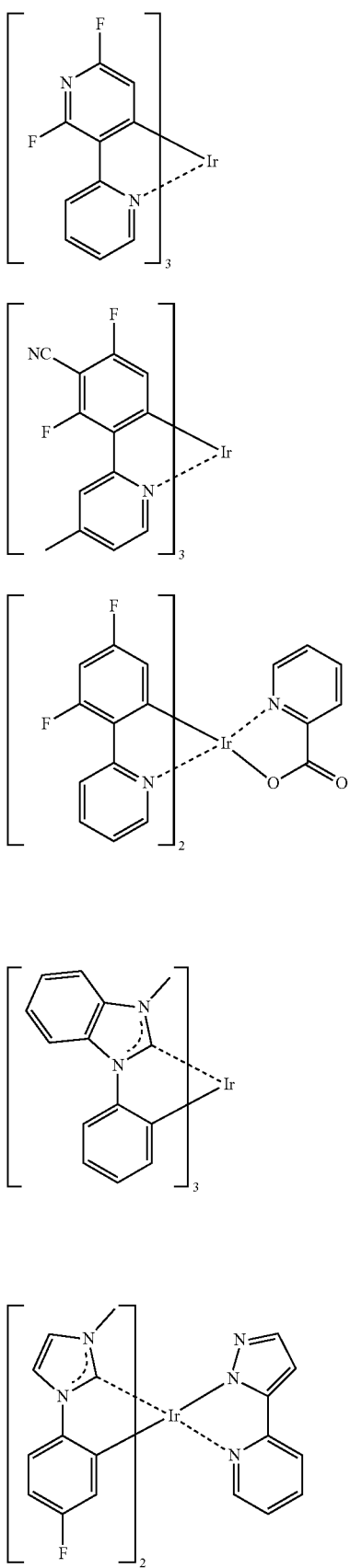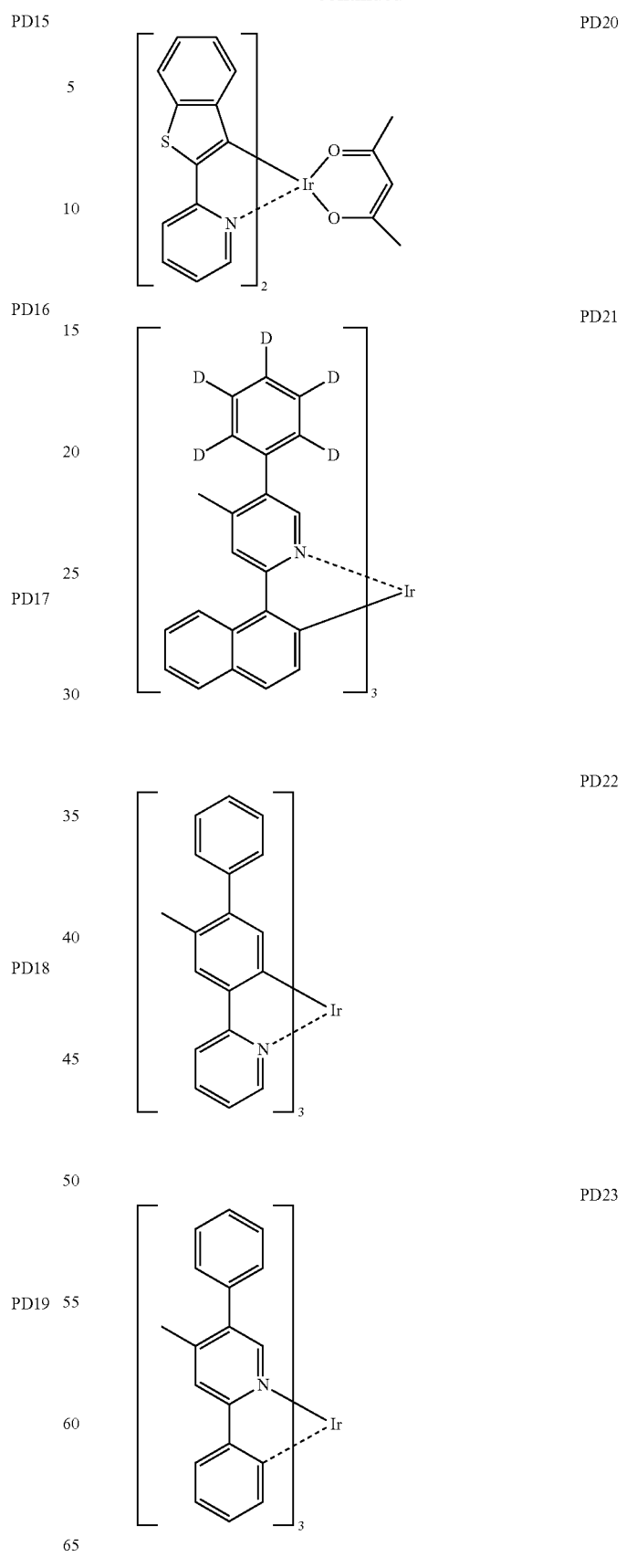

-continued

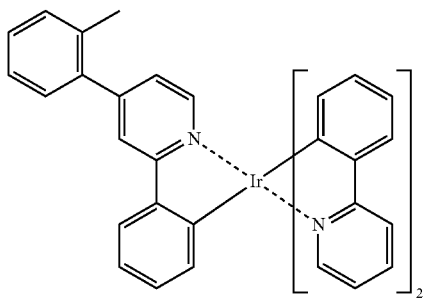
PD24

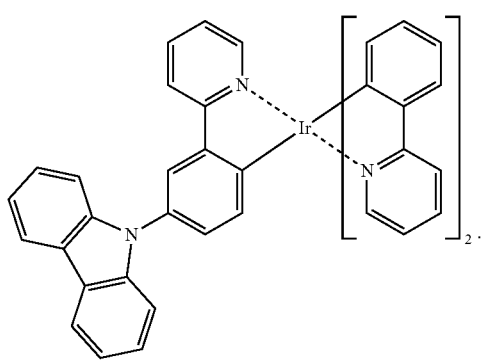
PD25

Fluorescent Dopant in Emission Layer 152-1, 152-2, or 152-3

The fluorescent dopant may include an arylamine compound and/or a styrylamine compound.

The fluorescent dopant may include a compound represented by Formula 501 below:

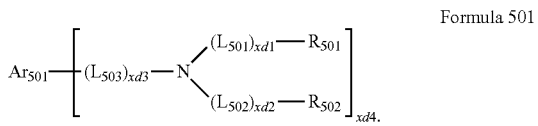
Formula 501

In Formula 501, $Ar_{501}$ may be a substituted or unsubstituted $C_5$-$C_{60}$ carbocyclic group or a substituted or unsubstituted $C_1$-$C_{60}$ heterocyclic group, $L_{501}$ to $L_{503}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xd1 to xd3 may each independently be an integer selected from 0 to 3, $R_{501}$ and $R_{502}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and xd4 may be an integer selected from 1 to 6.

In one embodiment, $Ar_{501}$ in Formula 501 may be selected from:

a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group; and a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

$L_{501}$ to $L_{503}$ may each independently be selected from a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thienylene group, a furanylene group, a carbazolylene group, an indolylene group, an isoindolylene group, a benzofuranylene group, a benzothienylene group, a dibenzofuranylene group, a dibenzothienylene group, a benzocarbazolylene group, a dibenzocarbazolylene group, a dibenzosilolylene group, and a pyridinylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thienylene group, a furanylene group, a carbazolylene group, an indolylene group, an isoindolylene group, a benzofuranylene group, a benzothienylene group, a dibenzofuranylene group, a dibenzothienylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thienyl group, a furanyl group, a carbazolyl group, an indolyl group, an isoindolyl group, a benzofuranyl group, a benzothienyl group, a dibenzofuranyl group, a dibenzothienyl group, a benzocarbazolyl group, a dibenzocarbazolyl group, a dibenzosilolyl group, and a pyridinyl group.

In one or more embodiments, $R_{501}$ and $R_{502}$ in Formula 501 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thienyl group, a furanyl group, a carbazolyl group, an indolyl group, an isoindolyl group, a benzofuranyl group, a benzothienyl group, a dibenzofuranyl group, a dibenzothienyl group, a benzocarbazolyl group, a dibenzocarbazolyl group, a dibenzosilolyl group, and a pyridinyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thienyl group, a furanyl group, a carbazolyl group, an indolyl group, an isoindolyl group, a benzofuranyl group, a benzothienyl group, a dibenzofuranyl group, a dibenzothienyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thienyl group, a furanyl group, a carbazolyl group, an indolyl group, an isoindolyl group, a benzofuranyl group, a benzothienyl group, a dibenzofuranyl group, a dibenzothienyl group, a benzocarbazolyl group, a dibenzocarbazolyl group, a dibenzosilolyl group, a pyridinyl group, and —Si($Q_{31}$)($Q_{32}$)($Q_{33}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xd4 in Formula 501 may be 2, but embodiments of the present disclosure are not limited thereto.

For example, the fluorescent dopant may be selected from Compounds FD1 to FD77:

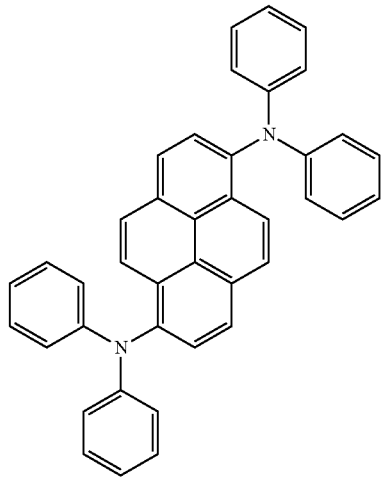

FD1

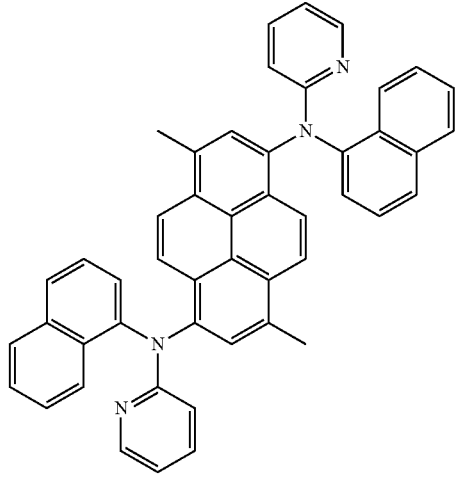

FD2

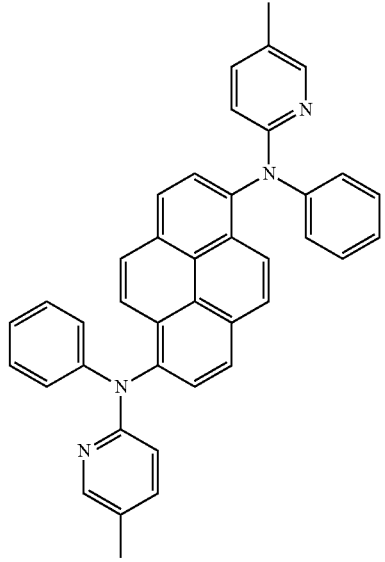

FD3

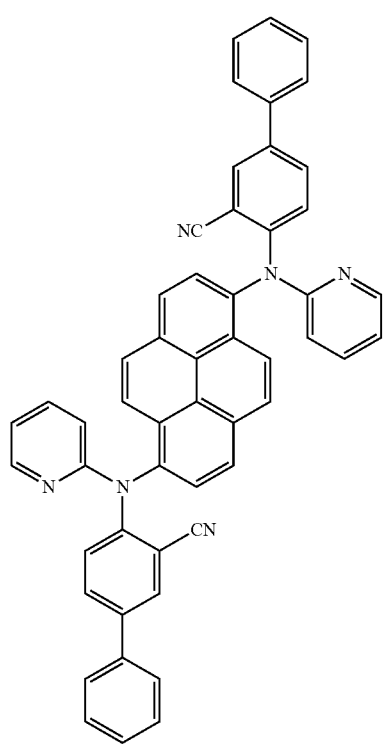
FD4
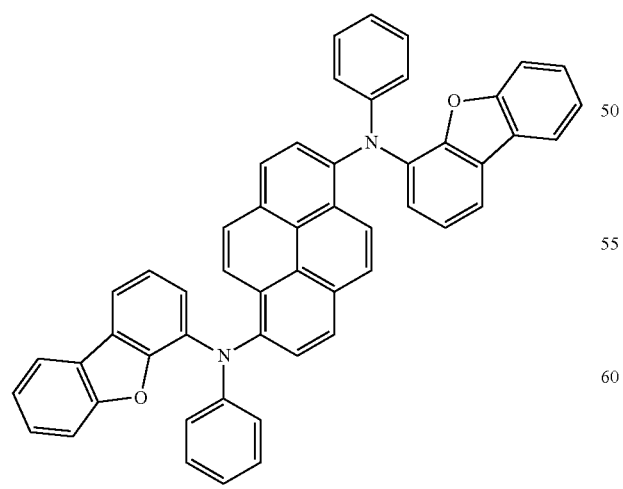
FD5
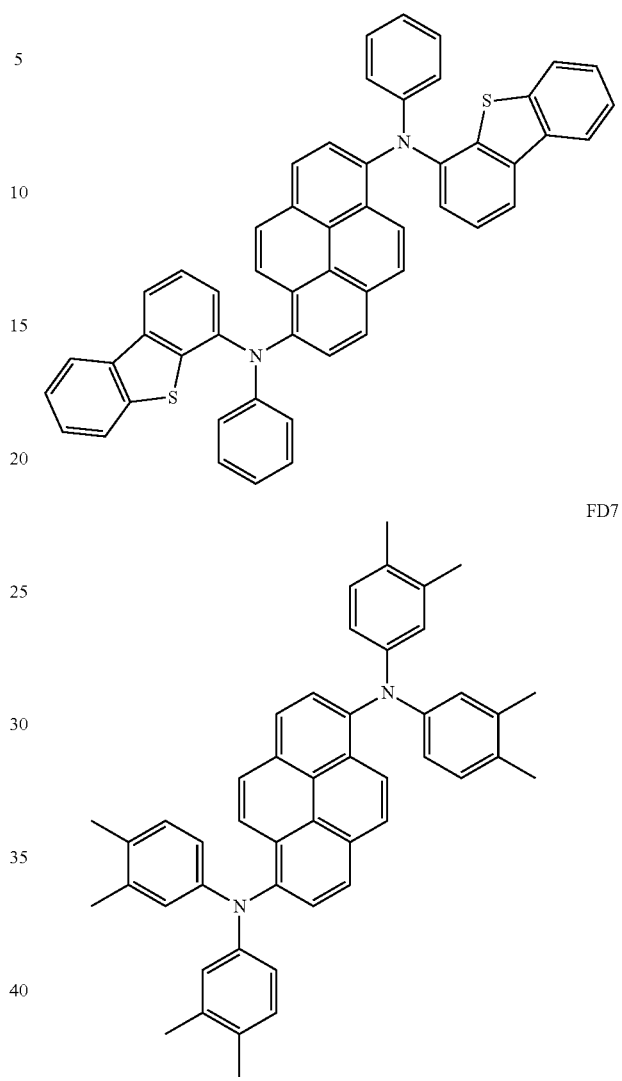
FD6
FD7
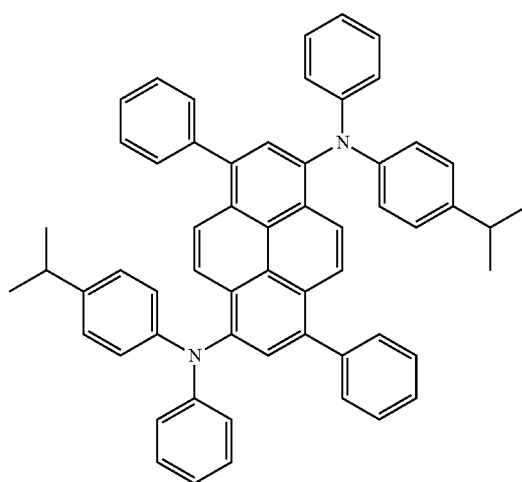
FD8

FD9
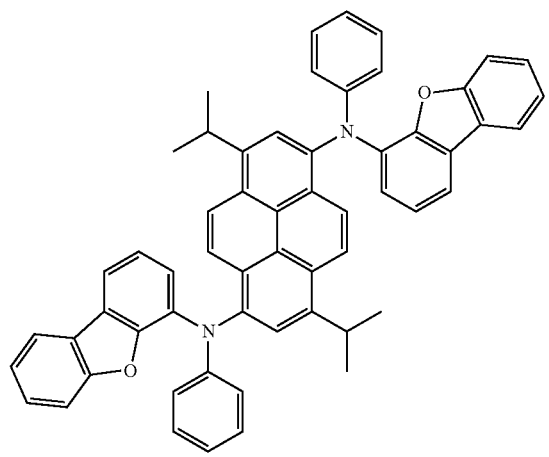
FD10
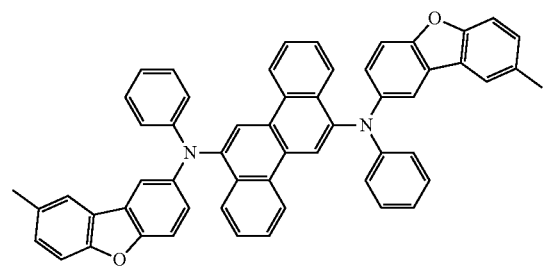
FD11
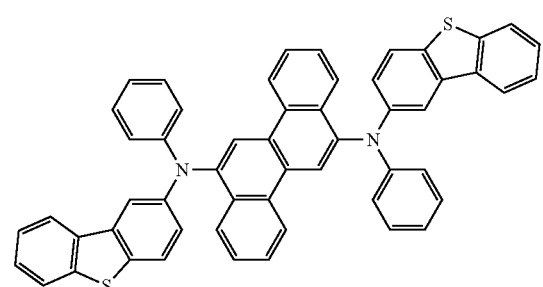
FD12
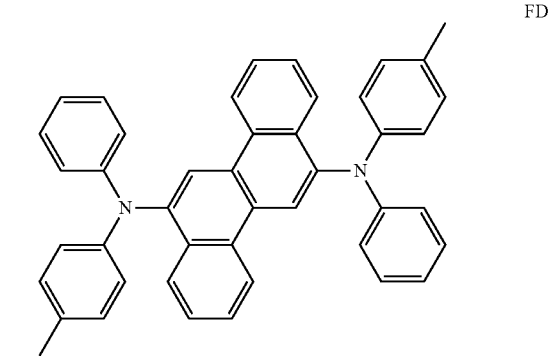
FD13
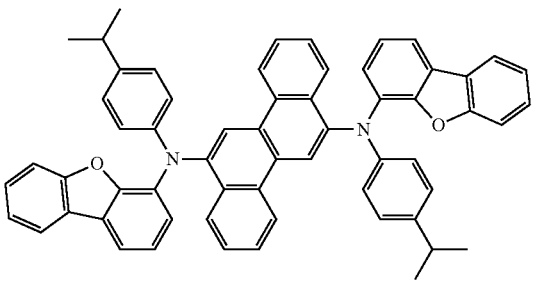
FD14
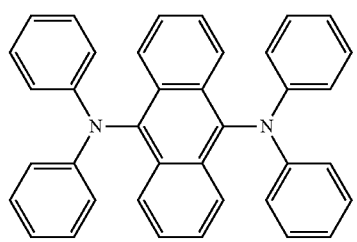
FD15
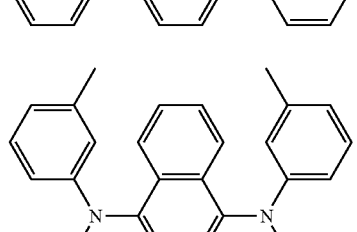
FD16
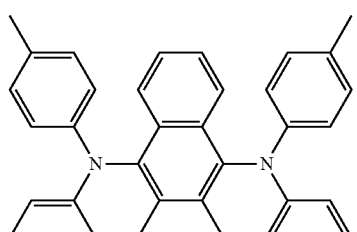
FD17
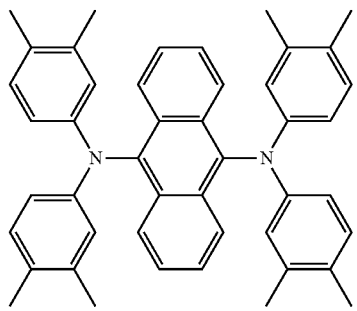

FD18
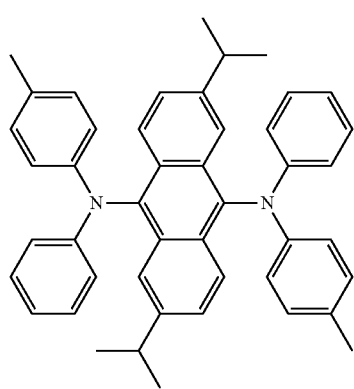
FD21
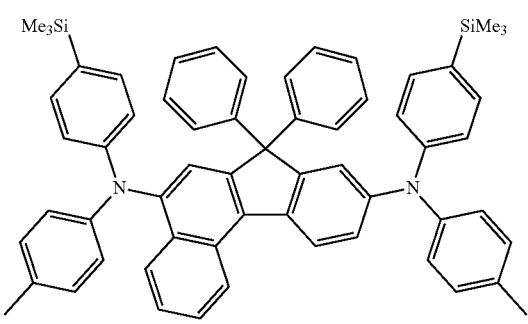
FD19
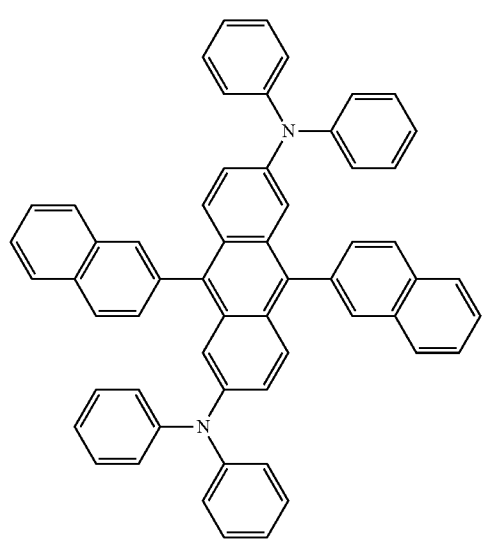
FD22
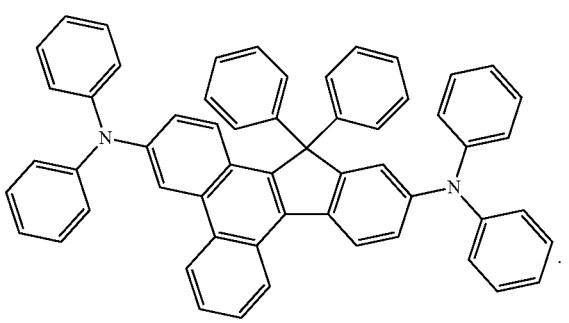
FD20
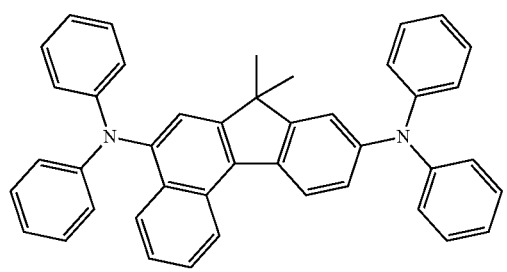
In one or more embodiments, the fluorescent dopant may be selected from the following compounds, but embodiments of the present disclosure are not limited thereto:
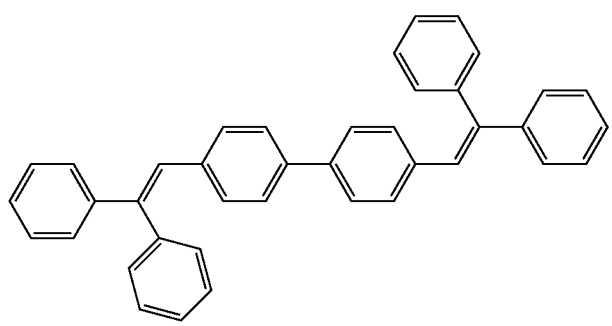
DPVBi

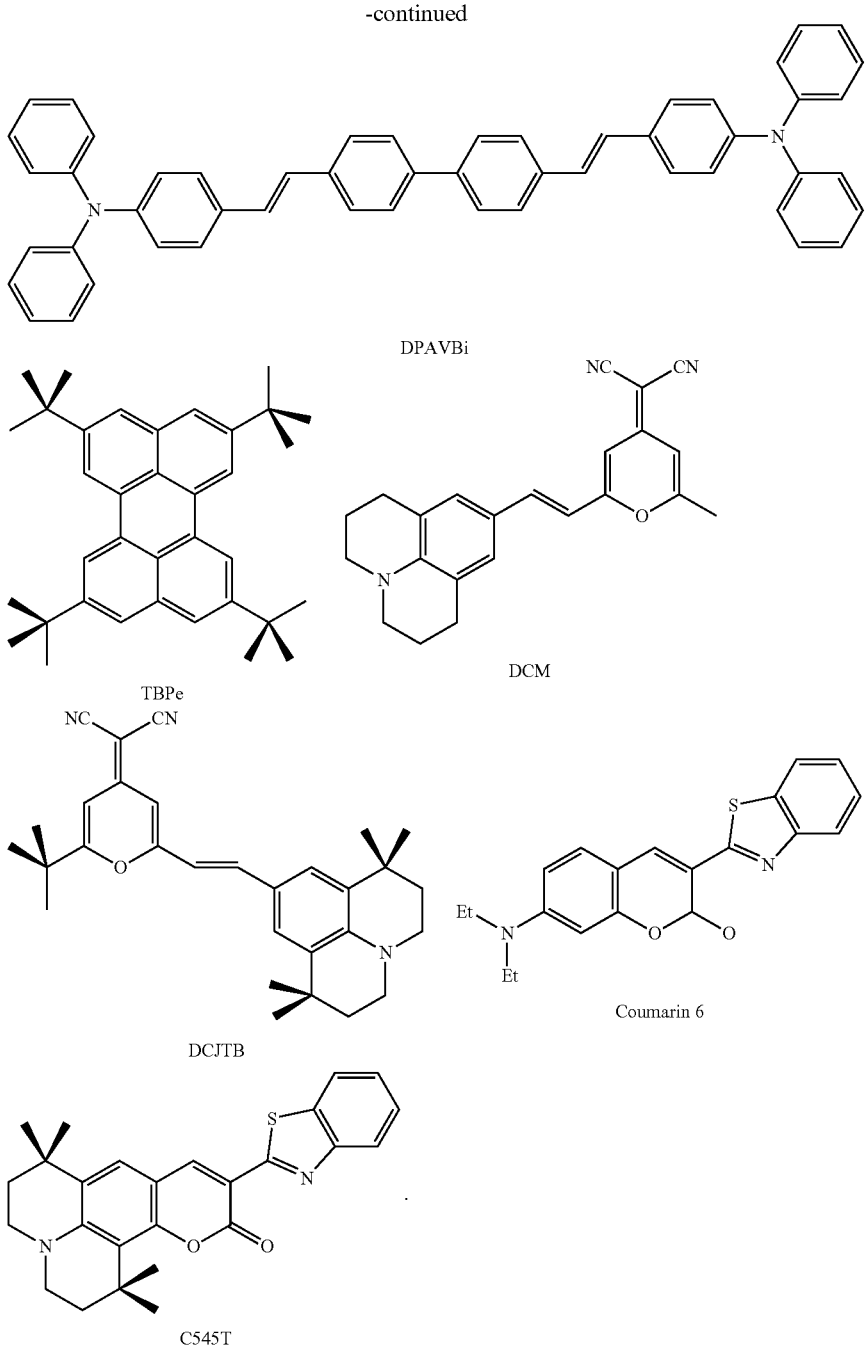

Electron Transport Region 153-1, 153-2, or 153-3 in Organic Layer 150

The electron transport region 153-1, 153-2, or 153-3 may have i) a single-layered structure including a single layer including a single material, ii) a single-layered structure including a single layer including a plurality of different materials, or iii) a multi-layered structure having a plurality of layers including a plurality of different materials.

The electron transport region 153-1, 153-2, or 153-3 may include at least one layer selected from a buffer layer 153-1*a*, 153-2*a*, or 153-3*a*, a hole blocking layer, an electron control layer, an electron transport layer 153-1*b*, 153-2*b*, or 153-3*b*, and an electron injection layer 153-3*c*, but embodiments of the present disclosure are not limited thereto.

For example, the electron transport region 153-1, 153-2, or 153-3 may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein for each structure, constituting layers are sequentially stacked from the emission layer 152-1, 152-2, or 152-3. However, embodiments of the structure of the electron transport region 153-1, 153-2, or 153-3 are not limited thereto.

The electron transport region 153-1, 153-2, or 153-3 (for example, a buffer layer 153-1*a*, 153-2*a*, or 153-3*a*, a hole blocking layer, an electron control layer, and/or an electron transport layer 153-1b, 153-2b, or 153-3b in the electron transport region 153-1, 153-2, or 153-3) may include a metal-free compound containing at least one π electron-depleted nitrogen-containing ring.

The "π electron-depleted nitrogen-containing ring" indicates a $C_1$-$C_{60}$ heterocyclic group having at least one *—N=*' moiety as a ring-forming moiety.

For example, the "π electron-depleted nitrogen-containing ring" may be i) a 5-membered to 7-membered heteromonocyclic group having at least one *—N=*' moiety, ii) a heteropolycyclic group in which two or more 5-membered to 7-membered heteromonocyclic groups, each having at least one *—N=*' moiety, are condensed with each other, or iii) a heteropolycyclic group in which at least one of 5-membered to 7-membered heteromonocyclic groups, each having at least one *—N=*' moiety, is condensed with at least one $C_5$-$C_{60}$ carbocyclic group.

Examples of the π electron-depleted nitrogen-containing ring include an imidazole, a pyrazole, a thiazole, an isothiazole, an oxazole, an isoxazole, a pyridine, a pyrazine, a pyrimidine, a pyridazine, an indazole, a purine, a quinoline, an isoquinoline, a benzoquinoline, a phthalazine, a naphthyridine, a quinoxaline, a quinazoline, a cinnoline, a phenanthridine, an acridine, a phenanthroline, a phenazine, a benzimidazole, an benzoisothiazole, a benzoxazole, an benzoisoxazole, a triazole, a tetrazole, an oxadiazole, a triazine, a thiadiazole, an imidazopyridine, an imidazopyrimidine, and an azacarbazole, but are not limited thereto.

For example, the electron transport region 153-1, 153-2, or 153-3 may include a compound represented by Formula 601:

$$[Ar_{601}]_{xe11}\text{-}[(L_{601})_{xe1}\text{-}R_{601}]_{xe21} \quad \text{Formula 601}$$

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer selected from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(=O)($Q_{601}$), —S(=O)$_2$($Q_{601}$), and —P(=O)($Q_{601}$)($Q_{602}$), $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer selected from 1 to 5.

In one embodiment, at least one of $Ar_{601}$(s) in the number of xe11 and $R_{601}$(s) in the number of xe21 may include the π electron-depleted nitrogen-containing ring.

In one embodiment, $Ar_{601}$ in Formula 601 may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an benzoisothiazole group, a benzoxazole group, an benzoisoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an benzoisothiazole group, a benzoxazole group, an benzoisoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), and —P(=O)($Q_{31}$)($Q_{32}$), and $Q_{31}$ to $Q_{33}$ may each independently be selected from a $C_1$-$C_{10}$ alkyl group, a alkoxy group, a phenyl group, a biphenyl group, a terphenyl group, and a naphthyl group.

When xe11 in Formula 601 is 2 or more, two or more $Ar_{601}$(s) may be linked via a single bond.

In one or more embodiments, $Ar_{601}$ in Formula 601 may be an anthracene group.

In one or more embodiments, a compound represented by Formula 601 may be represented by Formula 601-1 below:

Formula 601-1

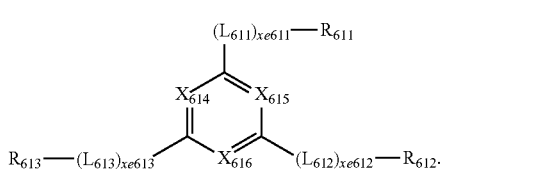

In Formula 601-1, $X_{614}$ may be N or $C(R_{614})$, $X_{615}$ may be N or $C(R_{615})$, $X_{616}$ may be N or $C(R_{616})$, and at least one selected from $X_{614}$ to $X_{616}$ may be N, $L_{611}$ to $L_{613}$ may each independently be the same as described in connection with $L_{601}$, xe611 to xe613 may each independently be understood by referring to the description presented in connection with xe1, $R_{611}$ to $R_{613}$ may each independently be understood by referring to the description presented in connection with $R_{601}$, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one embodiment, $L_{601}$ and $L_{611}$ to $L_{613}$ in Formulae 601 and 601-1 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thienylene group, a furanylene group, a carbazolylene group, an indolylene group, an isoindolylene group, a benzofuranylene group, a benzothienylene group, a dibenzofuranylene group, a dibenzothienylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an benzoisothiazolylene group, a benzoxazolylene group, an benzoisoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thienylene group, a furanylene group, a carbazolylene group, an indolylene group, an isoindolylene group, a benzofuranylene group, a benzothienylene group, a dibenzofuranylene group, a dibenzothienylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an benzoisothiazolylene group, a benzoxazolylene group, an benzoisoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thienyl group, a furanyl group, a carbazolyl group, an indolyl group, an isoindolyl group, a benzofuranyl group, a benzothienyl group, a dibenzofuranyl group, a dibenzothienyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an benzoisothiazolyl group, a benzoxazolyl group, an benzoisoxazolyl group, a triazolyl group, a tetrazolyl group, an imidazopyridinyl group, an imidazopyrimidinyl group, and an azacarbazolyl group, but embodiments of the present disclosure are not limited thereto.

In one or more embodiments, xe1 and xe611 to xe613 in Formulae 601 and 601-1 may each independently be 0, 1, or 2.

In one or more embodiments, $R_{601}$ and $R_{611}$ to $R_{613}$ in Formulae 601 and 601-1 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thienyl group, a furanyl group, a carbazolyl group, an indolyl group, an isoindolyl group, a benzofuranyl group, a benzothienyl group, a dibenzofuranyl group, a dibenzothienyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an benzoisothiazolyl group, a benzoxazolyl group, an benzoisoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thienyl group, a furanyl group, a carbazolyl group, an indolyl group, an isoindolyl group, a benzofuranyl group, a benzothienyl group, a dibenzofuranyl group, a dibenzothienyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an benzoisothiazolyl group, a benzoxazolyl group, an benzoisoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thienyl group, a furanyl group, a carbazolyl group, an indolyl group, an isoindolyl group, a benzofuranyl group, a benzothienyl group, a dibenzofuranyl group, a dibenzothienyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an benzoisothiazolyl group, a benzoxazolyl group, an benzoisoxazolyl group, a triazolyl group, a tetrazolyl group, an imidazopyridinyl group, an imidazopyrimidinyl group, and an azacarbazolyl group; and —S(=O)$_2$(Q$_{601}$), and —P(=O)(Q$_{601}$)(Q$_{602}$), and Q$_{601}$ and Q$_{602}$ are the same as described above.

The electron transport region 153-1, 153-2, or 153-3 may include at least one compound selected from Compounds ET1 to ET36, but embodiments of the present disclosure are not limited thereto:

ET1

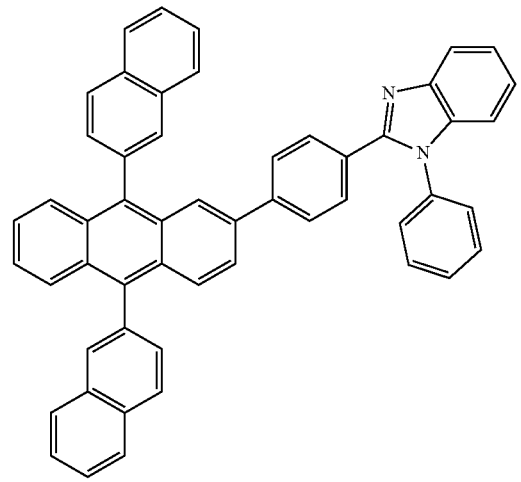

ET2

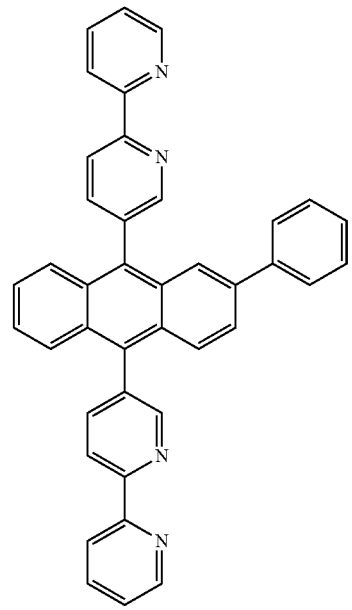

ET3
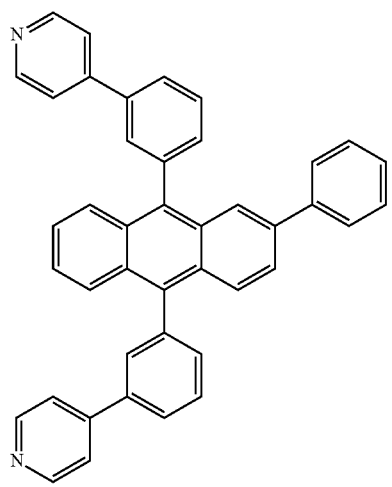
ET6
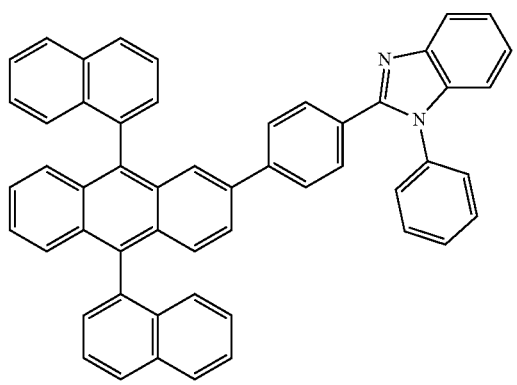
ET7
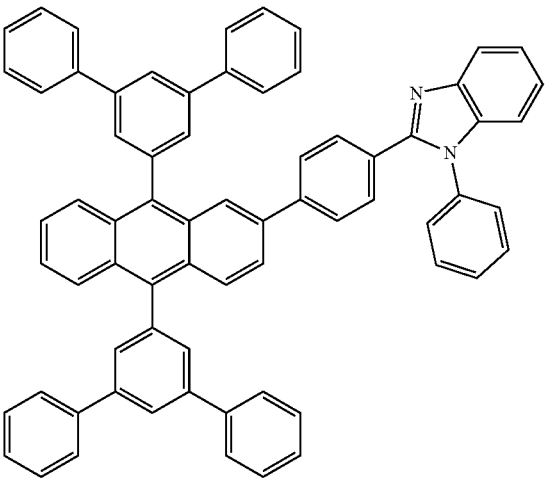
ET4
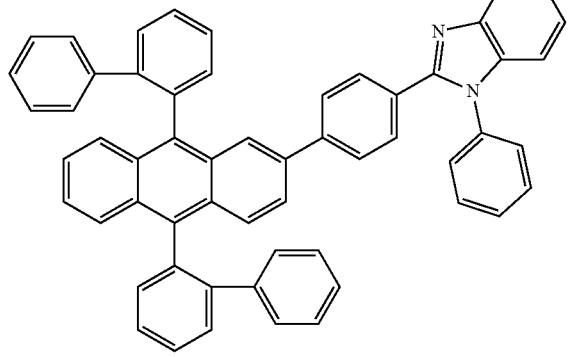
ET5
ET8
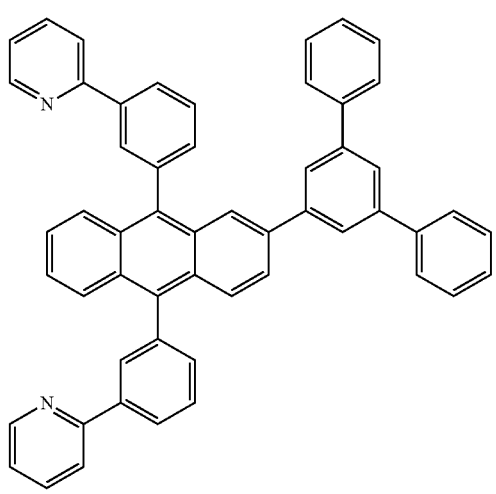

101
-continued
ET9
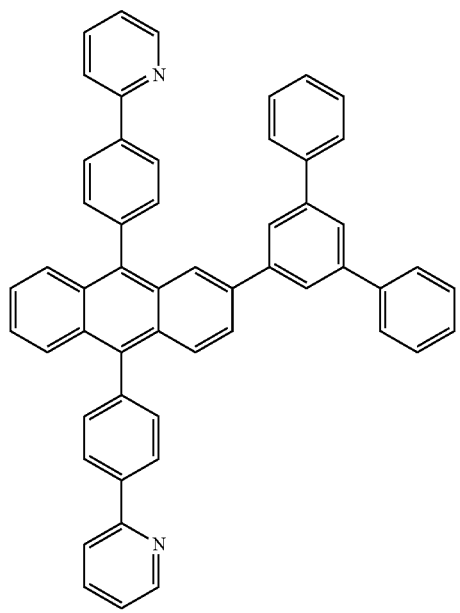
ET10
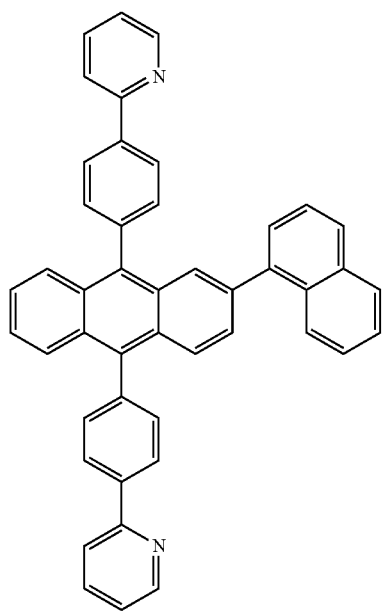
102
-continued
ET11
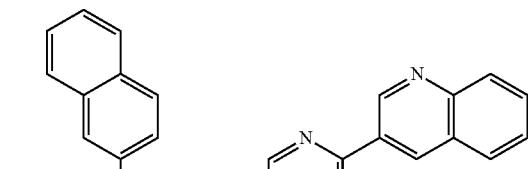
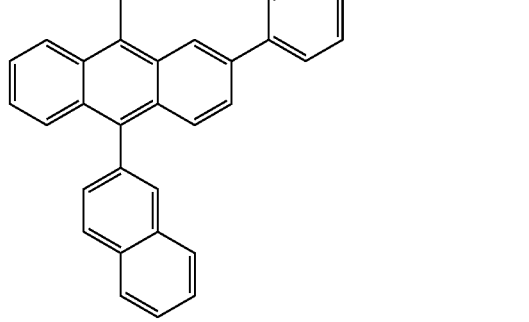
ET12
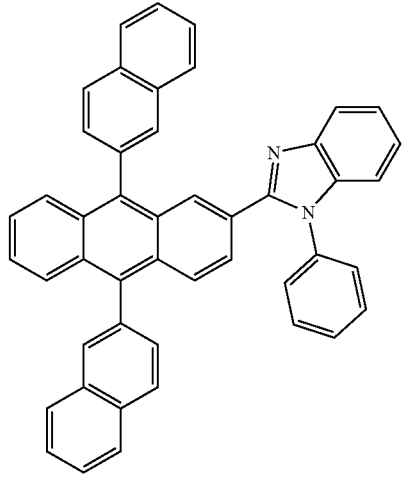
ET13
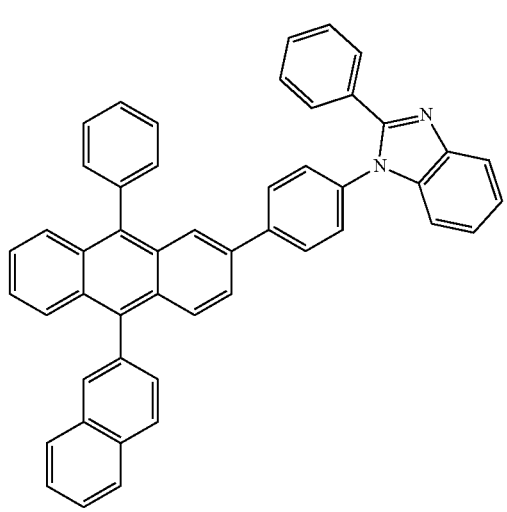

ET14
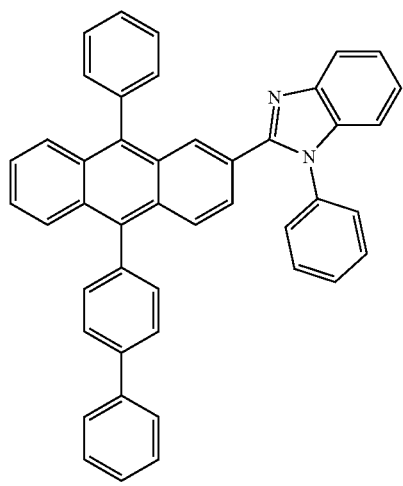
ET15
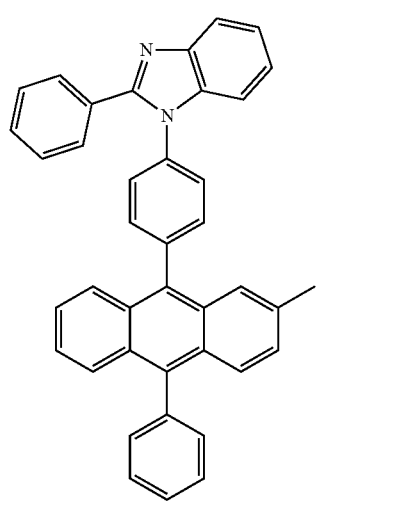
ET16
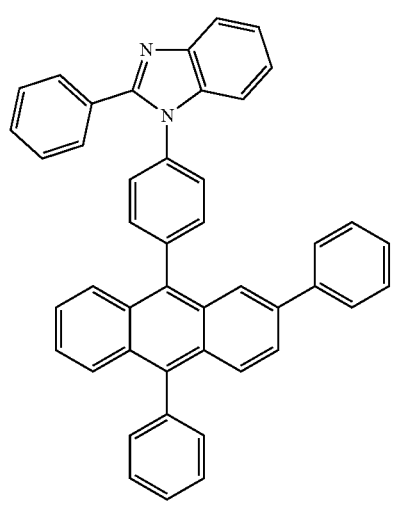
ET17
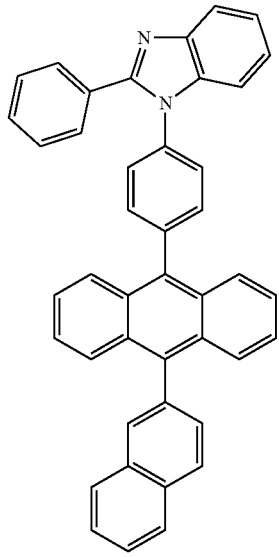
ET18
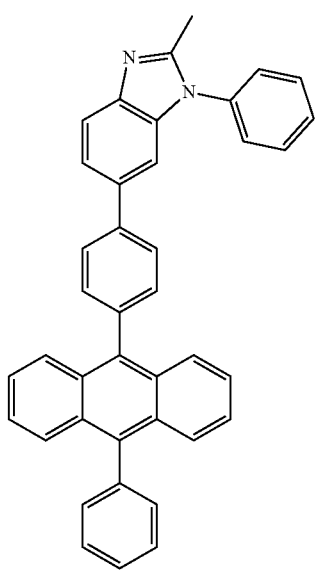
ET19
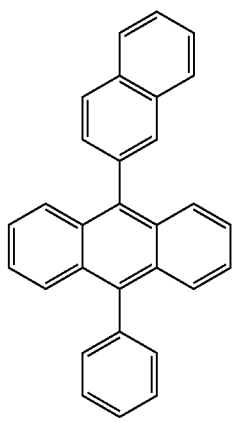

ET20
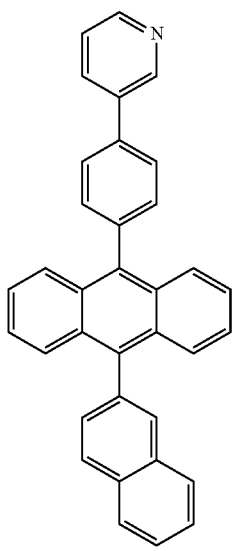
ET23
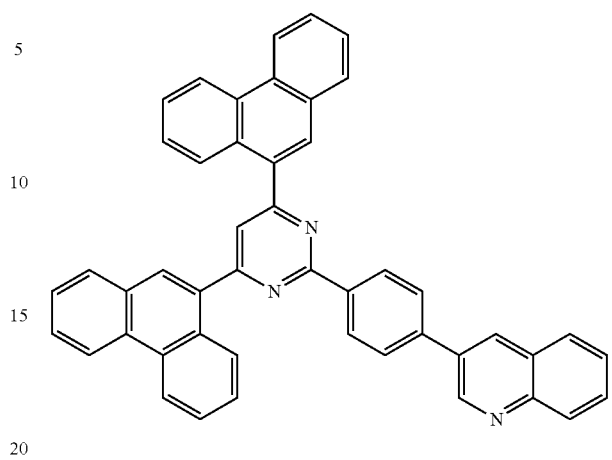
ET21
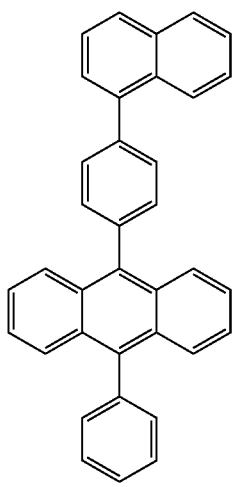
ET24
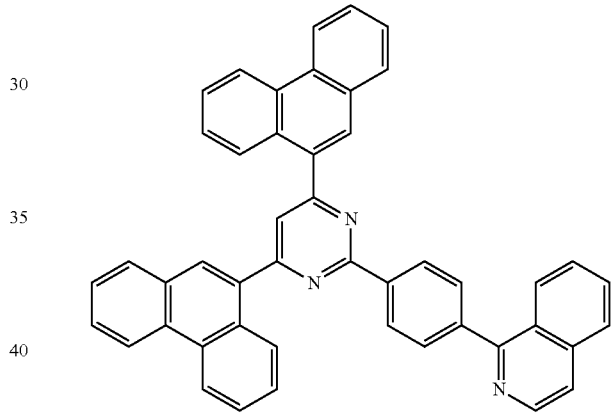
ET22
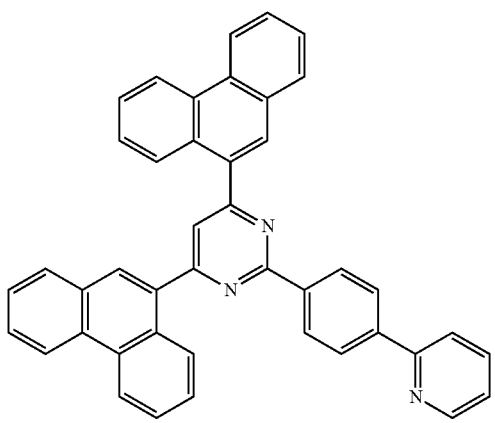
ET25
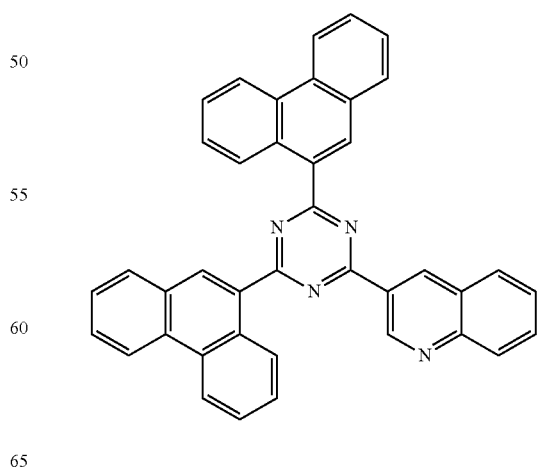

ET26
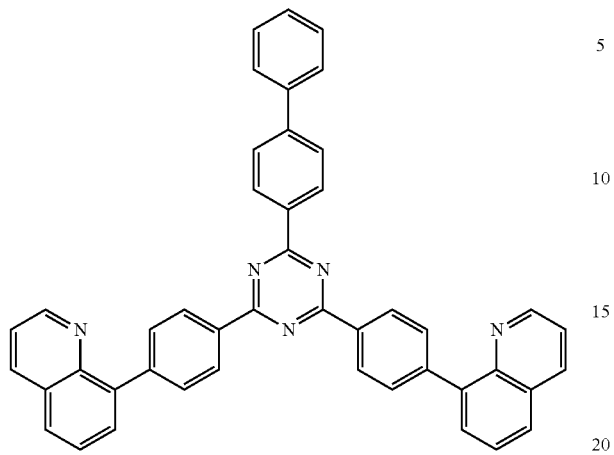
ET29
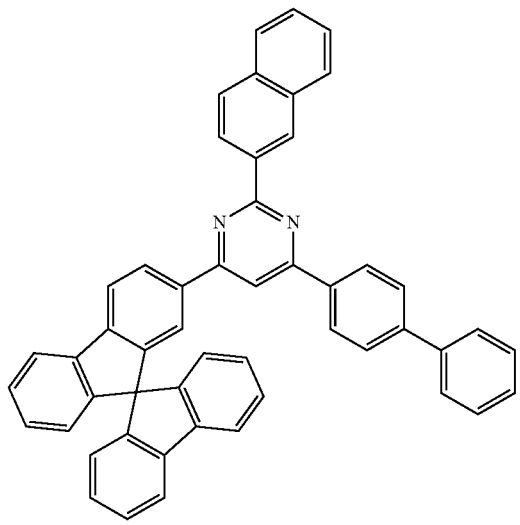
ET27
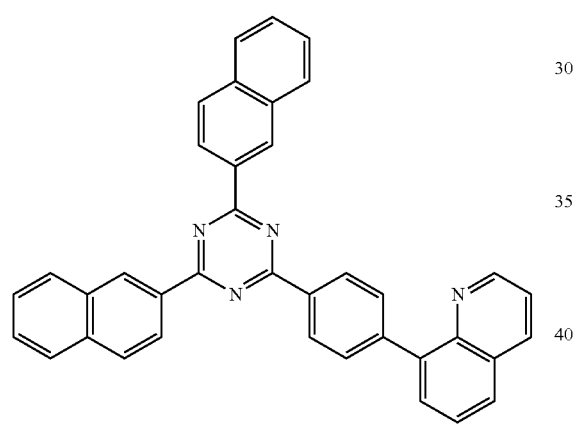
ET30
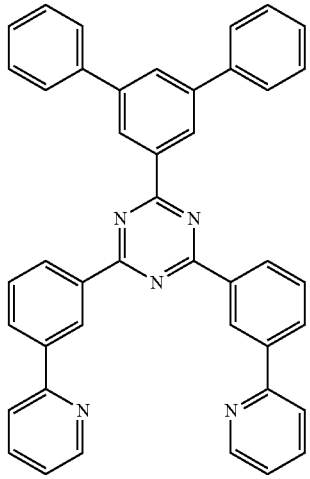
ET28
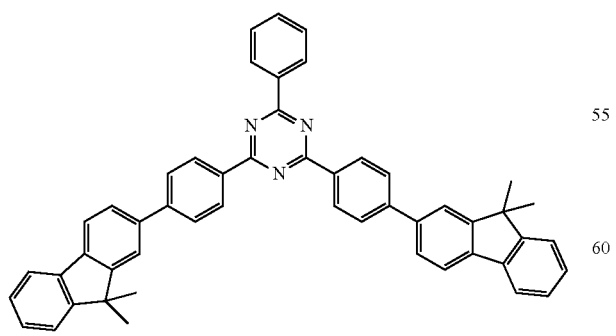
ET31
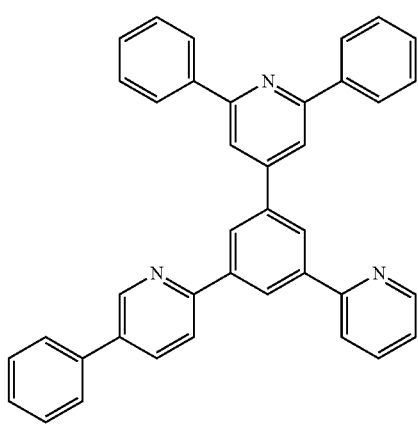

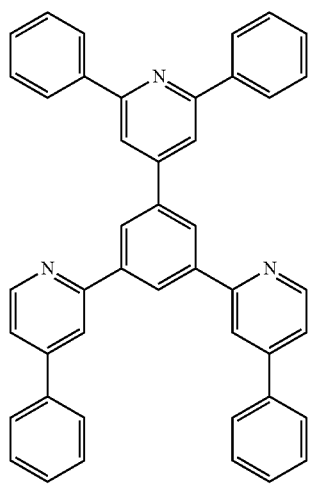
ET32
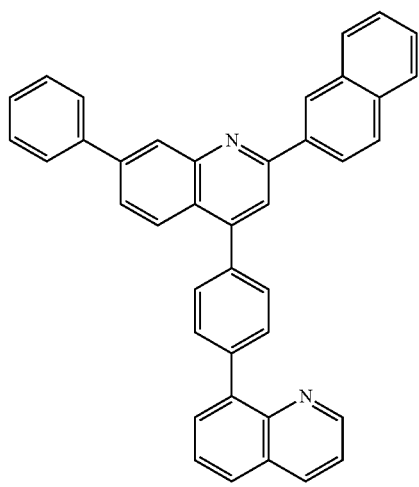
ET35
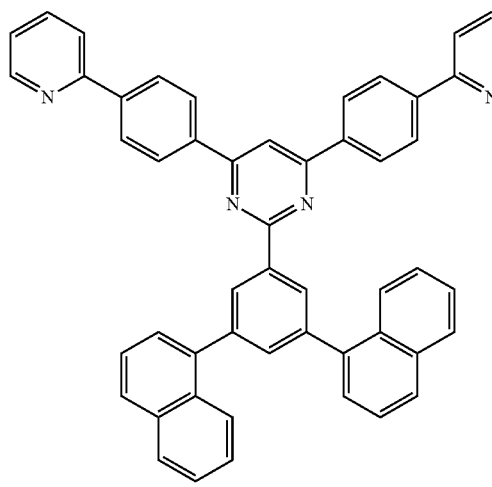
ET33
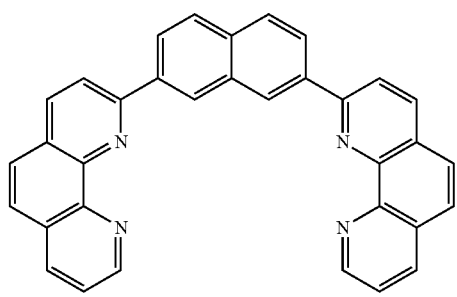
ET36
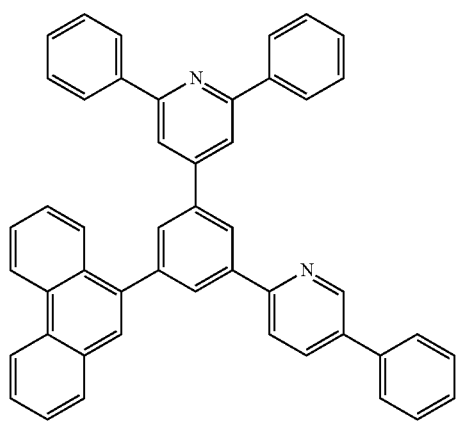
ET34
In one or more embodiments, the electron transport region 153-1, 153-2, or 153-3 may include at least one compound selected from 2,9-dimethyl-4,7-diphenyl-1,10-phenanthroline (BCP), 4,7-diphenyl-1,10-phenanthroline (Bphen), Alq$_3$, BAlq, 3-(biphenyl-4-yl)-5-(4-tert-butylphenyl)-4-phenyl-4H-1,2,4-triazole (TAZ), and NTAZ:
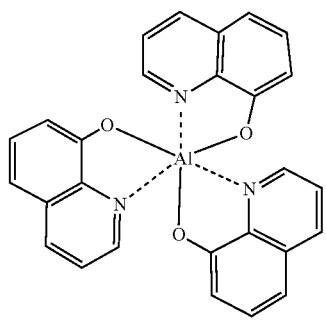
Alq$_3$ -continued

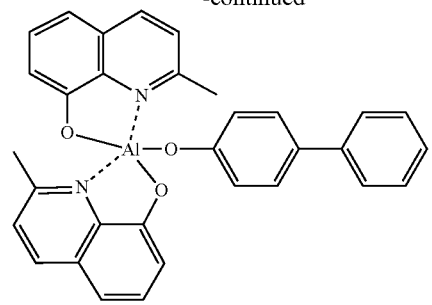

BAlq

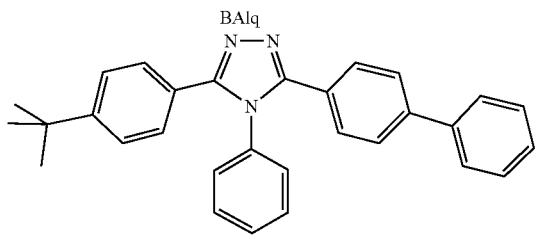

TAZ

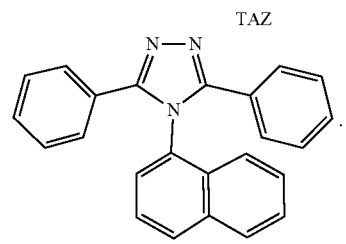

NTAZ

Thicknesses of the buffer layer 153-1a, 153-2a, or 153-3a, the hole blocking layer, and the electron control layer may each independently be in a range of about 20 Å to about 1,000 Å, for example, about 30 Å to about 300 Å. When the thicknesses of the buffer layer 153-1a, 153-2a, or 153-3a, the hole blocking layer, and the electron control layer are within any of these ranges, the electron transport region 153-1, 153-2, or 153-3 may have excellent (or suitable) hole blocking characteristics and/or electron control characteristics without a substantial increase in driving voltage.

A thickness of the electron transport layer 153-1b, 153-2b, or 153-3b may be in a range of about 100 Å to about 1,000 Å, for example, about 150 Å to about 500 Å. When the thickness of the electron transport layer 153-1b, 153-2b, or 153-3b is within the range described above, the electron transport layer 153-1b, 153-2b, or 153-3b may have satisfactory (or suitable) electron transport characteristics without a substantial increase in driving voltage.

The electron transport region 153-1, 153-2, or 153-3 (for example, the electron transport layer 153-1b, 153-2b, or 153-3b in the electron transport region 153-1, 153-2, or 153-3) may further include, in addition to the materials described above, a metal-containing material.

The metal-containing material may include at least one selected from alkali metal complex and alkaline earth-metal complex. The alkali metal complex may include a metal ion selected from a Li ion, a Na ion, a K ion, a Rb ion, and a Cs ion, and the alkaline earth-metal complex may include a metal ion selected from a Be ion, a Mg ion, a Ca ion, a Sr ion, and a Ba ion. A ligand coordinated with the metal ion of the alkali metal complex or the alkaline earth-metal complex may be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy phenyloxadiazole, a hydroxy phenylthiadiazole, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

For example, the metal-containing material may include a Li complex. The Li complex may include, for example, Compound ET-D1 (8-hydroxyquinolinolato-lithium, LiQ) and/or Compound ET-D2:

ET-D1

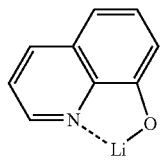

ET-D2

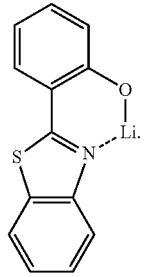

The electron transport region 153-1, 153-2, or 153-3 may include an electron injection layer 153-3c that facilitates electron injection from the second electrode 190. The electron injection layer 153-3c may be in direct contact with the second electrode 190.

The electron injection layer 153-3c may have i) a single-layered structure including a single layer including a single material, ii) a single-layered structure including a single layer including a plurality of different materials, or iii) a multi-layered structure having a plurality of layers including a plurality of different materials.

The electron injection layer 153-3c may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combination thereof.

The alkali metal may be selected from Li, Na, K, Rb, and Cs. In one embodiment, the alkali metal may be Li, Na, or Cs. In one or more embodiments, the alkali metal may be Li or Cs, but embodiments of the present disclosure are not limited thereto.

The alkaline earth metal may be selected from Mg, Ca, Sr, and Ba.

The rare earth metal may be selected from Sc, Y, Ce, Yb, Gd, and Tb.

The alkali metal compound, the alkaline earth-metal compound, and the rare earth metal compound may be selected from oxides and halides (for example, fluorides, chlorides, bromides, and/or iodides) of the alkali metal, the alkaline earth-metal, and the rare earth metal, respectively.

The alkali metal compound may be selected from alkali metal oxides (such as $Li_2O$, $Cs_2O$, and/or $K_2O$), and alkali metal halides (such as LiF, NaF, CsF, KF, LiI, NaI, CsI, KI, and/or RbI). In one embodiment, the alkali metal compound may be selected from LiF, Li$_2$O, NaF, LiI, NaI, CsI, and KI, but embodiments of the present disclosure are not limited thereto.

The alkaline earth-metal compound may be selected from alkaline earth-metal oxides, such as BaO, SrO, CaO, Ba$_x$Sr$_{1-x}$O (0<x<1), and/or Ba$_x$Ca$_{1-x}$O (0<x<1). In one embodiment, the alkaline earth-metal compound may be selected from BaO, SrO, and CaO, but embodiments of the present disclosure are not limited thereto.

The rare earth metal compound may be selected from YbF$_3$, ScF$_3$, Sc$_2$O$_3$, Y$_2$O$_3$, Ce$_2$O$_3$, GdF$_3$, and TbF$_3$. In one embodiment, the rare earth metal compound may be selected from YbF$_3$, ScF$_3$, TbF$_3$, YbI$_3$, ScI$_3$, and TbI$_3$, but embodiments of the present disclosure are not limited thereto.

The alkali metal complex, the alkaline earth-metal complex, and the rare earth metal complex may respectively include an ion of alkali metal, alkaline earth-metal, and rare earth metal as described above, and a ligand coordinated with a metal ion of the alkali metal complex, the alkaline earth-metal complex, or the rare earth metal complex may be selected from hydroxy quinoline, hydroxy isoquinoline, hydroxy benzoquinoline, hydroxy acridine, hydroxy phenanthridine, hydroxy phenyloxazole, hydroxy phenylthiazole, hydroxy phenyloxadiazole, hydroxy phenylthiadiazole, hydroxy phenylpyridine, hydroxy phenylbenzimidazole, hydroxy phenylbenzothiazole, bipyridine, phenanthroline, and cyclopentadiene, but embodiments of the present disclosure are not limited thereto.

The electron injection layer 153-3c may include (e.g., may consist of) an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combination thereof, as described above. In one or more embodiments, the electron injection layer 153-3c may further include an organic material. When the electron injection layer 153-3c further includes an organic material, the alkali metal, the alkaline earth metal, the rare earth metal, the alkali metal compound, the alkaline earth-metal compound, the rare earth metal compound, the alkali metal complex, the alkaline earth-metal complex, the rare earth metal complex, or any combination thereof may be homogeneously or non-homogeneously dispersed in a matrix including the organic material.

A thickness of the electron injection layer 153-3c may be in a range of about 1 Å to about 100 Å, for example, about 3 Å to about 90 Å. When the thickness of the electron injection layer 153-3c is within the range described above, the electron injection layer 153-3c may have satisfactory (or suitable) electron injection characteristics without a substantial increase in driving voltage.

Charge Generation Layer 154-1, 154-2, 154-1a, 154-1b, 154-2a, or 154-2b in Organic Layer 150

The charge generation layer 154-1, 154-2, 154-1a, 154-1b, 154-2a, or 154-2b may be understood by referring to the description presented in connection with the hole transport region 151-1, 151-2, or 151-3 and the electron transport region 153-1, 153-2, or 153-3.

For example, the charge generation layer 154-1, 154-2, 154-1a, 154-1b, 154-2a, or 154-2b may include a compound included in the hole transport region 151-1, 151-2, or 151-3 or the electron transport region 153-1, 153-2, or 153-3.

Second Electrode 190

The second electrode 190 may be positioned on the organic layer 150 having the structure according to embodiments of the present disclosure. The second electrode 190 may be a cathode, which is an electron injection electrode, and in this regard, a material for forming the second electrode 190 may be selected from a metal, an alloy, an electrically conductive compound, and combinations thereof, which have a relatively low work function.

The second electrode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but embodiments of the present disclosure are not limited thereto. The second electrode 190 may be a transmissive electrode, a semi-transmissive electrode, or a reflective electrode.

The second electrode 190 may have a single-layered structure, or a multi-layered structure including two or more layers.

In one embodiment, the organic light-emitting device 10 or 20 may further include at least one selected from a first capping layer under the first electrode 110 and a second capping layer above the second electrode 190.

In the organic layer 150 of each of the organic light-emitting devices 10 and 20, light generated in the emission layer 152-1, 152-2, or 152-3 may pass through the first electrode 110 and the first capping layer toward the outside, wherein the first electrode 110 may be a semi-transmissive electrode or a transmissive electrode. In one or more embodiments, light generated in the emission layer 152-1, 152-2, or 152-3 in the organic layer 150 may pass through the second electrode 190 and the second capping layer toward the outside, wherein the second electrode 190 may be a semi-transmissive electrode or a transmissive electrode.

The first capping layer and the second capping layer may increase external luminescence efficiency according to the principle of constructive interference.

The first capping layer and the second capping layer may each independently be an organic capping layer including an organic material, an inorganic capping layer including an inorganic material, or a composite capping layer including an organic material and an inorganic material.

At least one selected from the first capping layer and the second capping layer may each independently include at least one material selected from a carbocyclic compound, a heterocyclic compound, an amine-based compound, a porphine derivative, a phthalocyanine derivative, a naphthalocyanine derivative, an alkali metal complex, and an alkaline earth metal complex. The carbocyclic compound, the heterocyclic compound, and/or the amine-based compound may be optionally substituted with a substituent containing at least one element selected from O, N, S, Se, Si, F, Cl, Br, and I. In one embodiment, at least one selected from the first capping layer and the second capping layer may each independently include an amine-based compound.

In one embodiment, at least one selected from the first capping layer and the second capping layer may each independently include the compound represented by Formula 201 or the compound represented by Formula 202.

In one or more embodiments, at least one selected from the first capping layer and the second capping layer may each independently include a compound selected from Compounds HT28 to HT33 and Compounds CP1 to CP5, but embodiments of the present disclosure are not limited thereto:

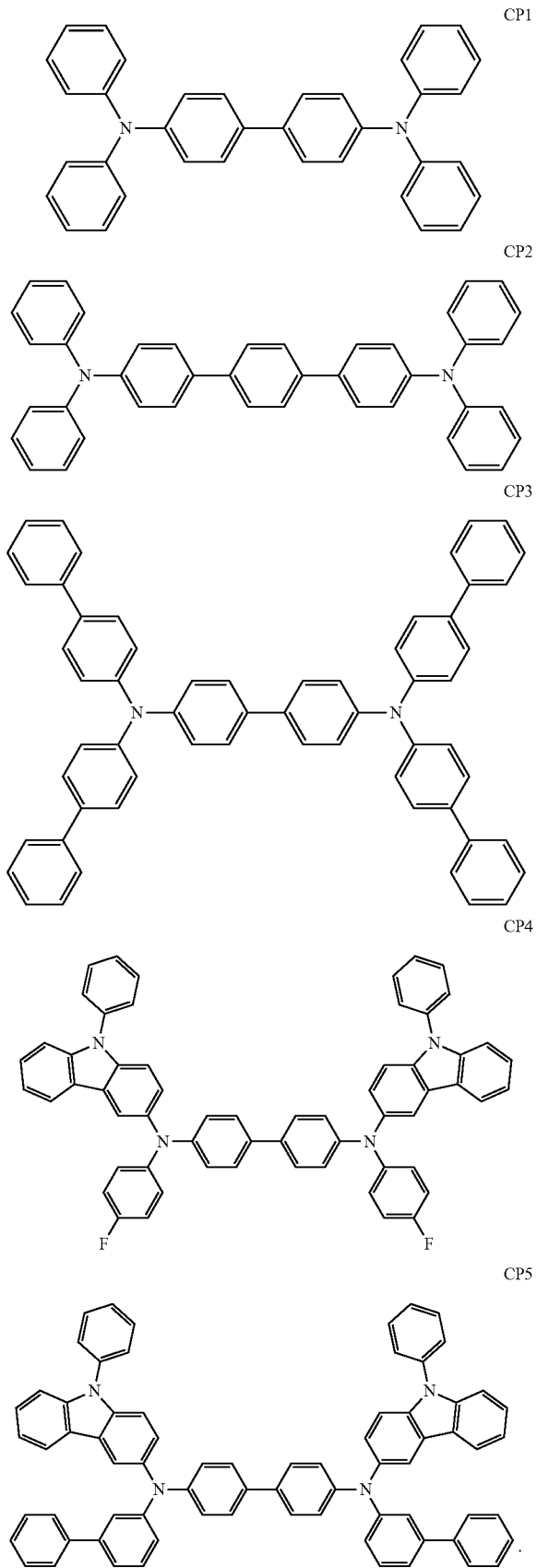

Hereinbefore, the organic light-emitting device according to an embodiment has been described in connection with FIGS. 1 and 2, but embodiments of the present disclosure are not limited thereto.

[Electronic Apparatus]

The light-emitting device may be included in various electronic apparatuses. In an embodiment, the electronic apparatus including the light-emitting device may be a light-emitting apparatus, an authentication apparatus, or the like.

The electronic apparatus (for example, light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. In an embodiment, light emitted from the light-emitting device may be blue light or white light. The light-emitting device may be the same as described above. In an embodiment, the color conversion layer may include quantum dots. The quantum dot may be, for example, a quantum dot as described herein.

The electronic apparatus may include a first substrate. The first substrate includes a plurality of subpixel areas, the color filter includes a plurality of color filter areas corresponding to the plurality of subpixel areas, respectively, and the color conversion layer may include a plurality of color conversion areas corresponding to the subpixel areas, respectively.

A pixel-defining film may be located between the plurality of subpixel areas to define each of the subpixel areas.

The color filter may further include the color filter areas and a light-blocking pattern located between adjacent color filter areas of the color filter areas, and the color conversion layer may further include the color conversion areas and a light-blocking pattern located between adjacent color conversion areas of the color conversion areas.

The color filter areas (or the color conversion areas) may include a first area emitting first color light, a second area emitting second color light, and/or a third area emitting third color light, and the first color light, the second color light, and/or the third color light may have different maximum emission wavelengths from one another. In an embodiment, the first color light may be red light, the second color light may be green light, and the third color light may be blue light. In an embodiment, the color filter areas (or the color conversion areas) may include quantum dots. In detail, the first area may include a red quantum dot, the second area may include a green quantum dot, and the third area may not include a quantum dot. The quantum dot is the same as described in the present specification. Each of the first area, the second area and/or the third area may further include a scattering body.

In an embodiment, the light-emitting device may emit first light, the first area may absorb the first light to emit first first-color light, the second area may absorb the first light to emit second first-color light, and the third area may absorb the first light to emit third first-color light. In this regard, the first first-color light, the second first-color light, and the third first-color light may have different maximum emission wavelengths from one another. In detail, the first light may be blue light, the first first-color light may be red light, the second first-color light may be green light, and the third first-color light may be blue light.

The electronic apparatus may further include a thin-film transistor in addition to the light-emitting device 1 as described above. The thin-film transistor may include a source electrode, a drain electrode, and an activation layer, wherein any one of the source electrode and the drain electrode may be eclectically connected to any one of the first electrode and the second electrode of the light-emitting device.

The thin-film transistor may further include a gate electrode, a gate insulation layer, or the like.

The active layer may include crystalline silicon, amorphous silicon, organic semiconductor, oxide semiconductor, or the like.

The electronic apparatus may further include a sealing portion for sealing the light-emitting device. The sealing portion may be located between the color filter and/or the color conversion layer and the light-emitting device. The sealing portion allows light from the light-emitting device 10 to be extracted to the outside, while simultaneously preventing external air and moisture from penetrating into the light-emitting device 10. The sealing portion may be a sealing substrate including a transparent glass substrate or a plastic substrate. The sealing portion may be a thin film encapsulation layer including at least one layer of a organic layer and/or a inorganic layer. When the sealing portion is a thin film encapsulation layer, the electronic apparatus may be flexible.

On the sealing portion, in addition to the color filter and/or color conversion layer, various functional layers may be further located according to the use of the electronic apparatus. The functional layers may include a touch screen layer, a polarizing layer, and the like. The touch screen layer may be a pressure-sensitive touch screen layer, a capacitive touch screen layer, or an infrared touch screen layer. The authentication apparatus may be, for example, a biometric authentication apparatus for authenticating an individual by using biometric information of a biometric body (for example, a finger tip, a pupil, or the like).

The authentication apparatus may further include, in addition to the light-emitting device, a biometric information collector.

The electronic apparatus may be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 8:
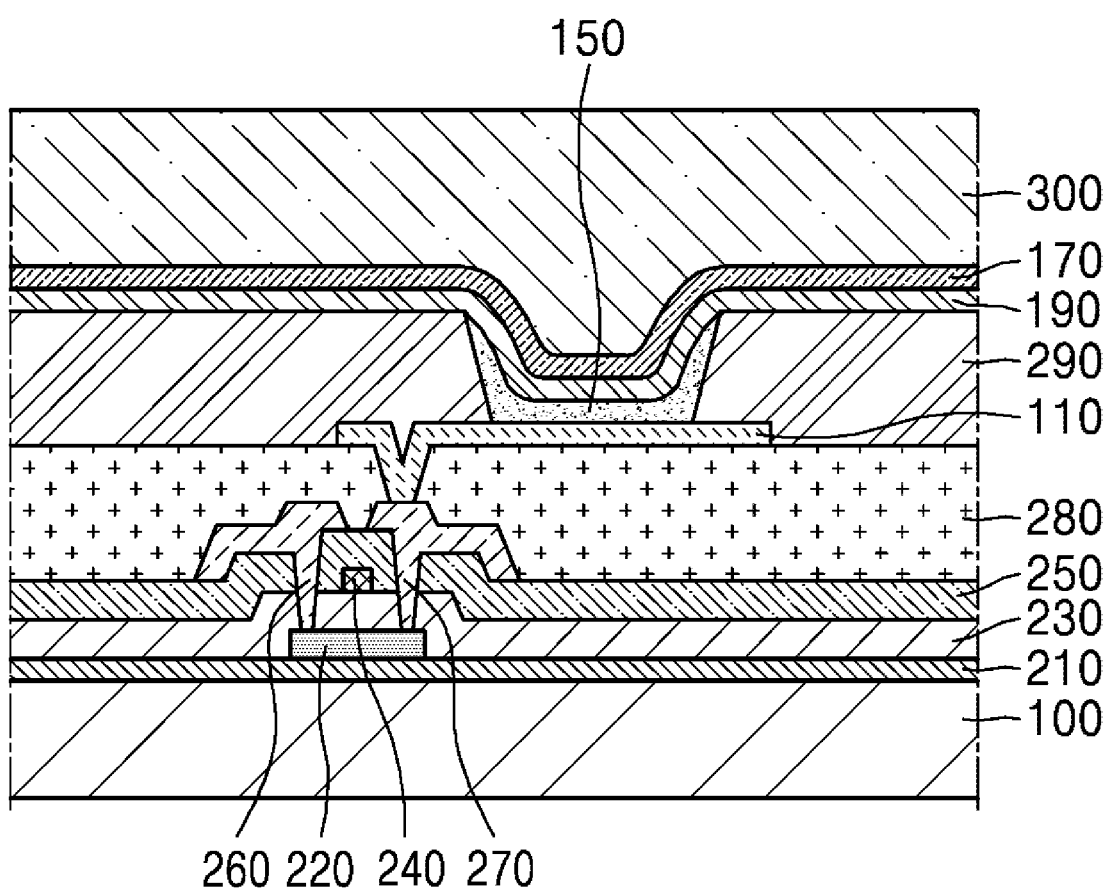
FIG. 8 is cross-sectional view showing a light-emitting apparatus according to an embodiment.

[Description of FIG. 8]

FIG. 8 is a cross-sectional view showing a light-emitting apparatus according to an embodiment of the present disclosure; and The light-emitting apparatus of FIG. 8 includes a substrate 100, a thin-film transistor (TFT), a light-emitting device, and an encapsulation portion 300 that seals light-emitting device.

The substrate 100 may be a flexible substrate, a glass substrate, or a metal substrate. A buffer layer 210 may be located on the substrate 100. The buffer layer 210 prevents the penetration of impurities through the substrate 100 and may provide a flat surface on the substrate 100.

A TFT may be located on the buffer layer 210. The TFT may include an activation layer 220, a gate electrode 240, a source electrode 260, and a drain electrode 270.

The activation layer 220 may include an inorganic semiconductor such as silicon or polysilicon, an organic semiconductor, or an oxide semiconductor, and may include a source region, a drain region and a channel region.

A gate insulating film 230 for insulating the activation layer 220 from the gate electrode 240 may be located on the activation layer 220, and the gate electrode 240 may be located on the gate insulating film 230.

An organic layer insulating film 250 may be located on the gate electrode 240. The organic layer insulating film 250 is located between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the organic layer insulating film 250. The organic layer insulating film 250 and the gate insulating film 230 may be formed to expose the source region and the drain region of the activation layer 220, and the source electrode 260 and the drain electrode 270 may be located to be in contact with the exposed portions of the source region and the drain region of the activation layer 220.

The TFT may be electrically connected to a light-emitting device to drive the light-emitting device, and is covered by a passivation layer 280. The passivation layer 280 may include an inorganic insulating film, an organic insulating film, or a combination thereof. A light-emitting device is provided on the passivation layer 280. The light-emitting device includes the first electrode 110, the organic layer 150, and the second electrode 190.

The first electrode 110 may be located on the passivation layer 280. The passivation layer 280 does not completely cover the drain electrode 270 and exposes a portion of the drain electrode 270, and the first electrode 110 may be connected to the exposed portion of the drain electrode 270.

A pixel defining layer 290 including an insulating material may be located on the first electrode 110. The pixel defining layer 290 may expose a certain region of the first electrode 110, and the organic layer 150 may be formed in the exposed region of the first electrode 110. The pixel defining layer 290 may be a polyimide or polyacryl-based organic film. Although not shown in FIG. 2, at least one some layers of the organic layer 150 may extend to the upper portion of the pixel defining layer 290 and may be located in the form of a common layer.

A second electrode 190 may be located on the organic layer 150, and a capping layer 170 may be additionally formed on the second electrode 190. The capping layer 170 may be formed to cover the second electrode 190.

An encapsulation portion 300 may be located on the capping layer 170. The encapsulation portion 300 may be located on a light-emitting device and protects the light-emitting device from moisture or oxygen. The encapsulation portion 300 may include: an inorganic film including silicon nitride (SiNx), silicon oxide (SiOx), indium tin oxide, indium zinc oxide, or a combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate or polyacrylic acid), an epoxy-based resin (for example, aliphatic glycidyl ether (AGE), or a combination thereof; or a combination of an inorganic film and an organic film.

Layers constituting the hole transport region, the emission layer, and layers constituting the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, the emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec by taking into account a material to be included in a layer to be formed, and the structure of a layer to be formed.

When layers constituting the hole transport region, the emission layer, and layers constituting the electron transport region are formed by spin coating, the spin coating may be performed at a coating speed of about 2,000 rpm to about 5,000 rpm and at a heat treatment temperature of about 80° C. to 200° C. by taking into account a material to be included in a layer to be formed, and the structure of a layer to be formed.

General Definition of Substituents

The term "$C_1$-$C_{60}$ alkyl group" as used herein refers to a linear or branched aliphatic saturated hydrocarbon monovalent group having 1 to 60 carbon atoms, preferably is a $C_1$-$C_{20}$ alkyl group, and non-limiting examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein may refer to a divalent group having the same structure as the $C_1$-$C_{60}$ alkyl group.

The term "$C_2$-$C_{60}$ alkenyl group" as used herein may refer to a hydrocarbon group having at least one carbon-carbon double bond in, for example, the middle and/or at the terminus of the $C_2$-$C_{60}$ alkyl group, and non-limiting examples thereof include an ethenyl group, a propenyl group, and a butenyl group. The term "$C_2$-$C_{60}$ alkenylene group" as used herein may refer to a divalent group having the same structure as the $C_2$-$C_{60}$ alkenyl group.

The term "$C_2$-$C_{60}$ alkynyl group" as used herein may refer to a hydrocarbon group having at least one carbon-carbon triple bond in, for example, the middle and/or at the terminus of the $C_2$-$C_{60}$ alkyl group, and non-limiting examples thereof include an ethynyl group, and a propynyl group. The term "$C_2$-$C_{60}$ alkynylene group" as used herein may refer to a divalent group having the same structure as the $C_2$-$C_{60}$ alkynyl group.

The term "$C_1$-$C_{60}$ alkoxy group" as used herein may refer to a monovalent group represented by —$OA_{101}$ (wherein $A_{101}$ is the $C_1$-$C_{60}$ alkyl group), preferably is a $C_1$-$C_{20}$ alkoxy group, and non-limiting examples thereof include a methoxy group, an ethoxy group, and an isopropyloxy group.

The term "$C_3$-$C_{10}$ cycloalkyl group" as used herein may refer to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein may refer to a divalent group having the same structure as the $C_3$-$C_{10}$ cycloalkyl group.

The term "$C_1$-$C_{10}$ heterocycloalkyl group" as used herein may refer to a monovalent monocyclic group having at least one heteroatom selected from N, O, Si, P, and S as a ring-forming atom and 1 to 10 carbon atoms as the remaining ring-forming atoms, and non-limiting examples thereof include a 1,2,3,4-oxatriazolidinyl group, a tetrahydrofuranyl group, and a tetrahydrothienyl group. The term "$C_1$-$C_{10}$ heterocycloalkylene group" as used herein may refer to a divalent group having the same structure as the $C_1$-$C_{10}$ heterocycloalkyl group.

The term "$C_3$-$C_{10}$ cycloalkenyl group" used herein may refer to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein may refer to a divalent group having the same structure as the $C_3$-$C_{10}$ cycloalkenyl group.

The term "$C_1$-$C_{10}$ heterocycloalkenyl group" as used herein may refer to a monovalent monocyclic group that has at least one heteroatom selected from N, O, Si, P, and S as a ring-forming atom, 1 to 10 carbon atoms as the remaining ring-forming atoms, and at least one double bond in its ring. Non-limiting examples of the $C_1$-$C_{10}$ heterocycloalkenyl group include a 4,5-dihydro-1,2,3,4-oxatriazolylgroup, a 2,3-dihydrofuranyl group, and a 2,3-dihydrothienyl group. The term "$C_1$-$C_{10}$ heterocycloalkenylene group" as used herein may refer to a divalent group having the same structure as the $C_1$-$C_{10}$ heterocycloalkenyl group.

The term "$C_6$-$C_{60}$ aryl group" as used herein may refer to a monovalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. The term "$C_6$-$C_{60}$ arylene group" used herein may refer to a divalent group having the same structure as the $C_6$-$C_{60}$ aryl group. When the $C_6$-$C_{60}$ aryl group and the $C_6$-$C_{60}$ arylene group each independently include two or more rings, the respective rings may be fused to each other.

The term "$C_1$-$C_{60}$ heteroaryl group" as used herein may refer to a monovalent group having a heterocyclic aromatic system that has at least one heteroatom selected from N, O, Si, P, and S as a ring-forming atom, in addition to 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. The term "$C_1$-$C_{60}$ heteroarylene group" as used herein may refer to a divalent group having the same structure as the $C_1$-$C_{60}$ heteroaryl group. When the $C_1$-$C_{60}$ heteroaryl group and the $C_1$-$C_{60}$ heteroarylene group each independently include two or more rings, the respective rings may be condensed (fused) with each other.

The term "$C_6$-$C_{60}$ aryloxy group" as used herein may refer to a group represented by —$OA_{102}$ (wherein $A_{102}$ is the $C_6$-$C_{60}$ aryl group), and the term "$C_6$-$C_{60}$ arylthio group" used herein may refer to a group represented by —$SA_{103}$ (wherein $A_{103}$ is the $C_6$-$C_{60}$ aryl group).

The term "monovalent non-aromatic condensed polycyclic group" as used herein may refer to a monovalent group having two or more rings condensed with each other, only carbon atoms as ring-forming atoms (for example, having 8 to 60 carbon atoms), and no aromaticity in its entire molecular structure (the overall structure is non-aromatic). A non-limiting example of the monovalent non-aromatic condensed polycyclic group is a fluorenyl group. The term "divalent non-aromatic condensed polycyclic group" as used herein may refer to a divalent group having the same structure as the monovalent non-aromatic condensed polycyclic group.

The term "monovalent non-aromatic condensed heteropolycyclic group" as used herein may refer to a monovalent group having two or more rings condensed to each other, at least one heteroatom selected from N, O, Si, P, and S, other than carbon atoms (for example, 1 to 60 carbon atoms), as a ring-forming atom, and no aromaticity in its entire molecular structure (the overall structure is non-aromatic). A non-limiting example of the monovalent non-aromatic condensed heteropolycyclic group is a carbazolyl group. The term "divalent non-aromatic condensed heteropolycyclic group" as used herein may refer to a divalent group having the same structure as the monovalent non-aromatic condensed heteropolycyclic group.

The term "$C_5$-$C_{60}$ carbocyclic group" as used herein may refer to a monocyclic or polycyclic group having 5 to 60 carbon atoms in which ring-forming atoms are carbon atom only. The term "$C_5$-$C_{60}$ carbocyclic group" as used herein may refer to an aromatic carbocyclic group or a non-aromatic carbocyclic group. The $C_5$-$C_{60}$ carbocyclic group may be a ring, such as benzene, a monovalent group, such as a phenyl group, or a divalent group, such as a phenylene group. In one or more embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group" as used herein may refer to a group having the same structure as the $C_5$-$C_{60}$ carbocyclic group, except that as a ring-forming atom, at least one heteroatom selected from N, O, Si, P, and S is used in addition to carbon atoms (the number of carbon atoms may be in a range of 1 to 60).

In the present specification, at least one substituent of the substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

The term "Ph" as used herein represents a phenyl group, the term "Me" as used herein represents a methyl group, the term "Et" as used herein represents an ethyl group, the term "tert-Bu" or "But" as used herein, represents a tert-butyl group, the term "OMe" as used herein represents a methoxy group, and "D" represents deuterium.

The term "biphenyl group" as used herein may refer to a "phenyl group substituted with a phenyl group. The "biphenyl group" may be a "substituted phenyl group" having a "$C_6$-$C_{60}$ aryl group" as a substituent.

The term "terphenyl group" as used herein may refer to a "phenyl group substituted with a biphenyl group. The "terphenyl group" may be a "substituted phenyl group" having, as a substituent, a "$C_6$-$C_{60}$ aryl group substituted with a $C_6$-$C_{60}$ aryl group".

* and *$^1$ as used herein, unless defined otherwise, each refer to a binding site to a neighboring atom in a corresponding formula.

Hereinafter, an organic light-emitting device according to an embodiment will be described in detail with reference to Synthesis Examples and Examples.

EXAMPLES

Comparative Example 1

As a substrate and an anode, a first glass substrate from Corning 15 Ω/cm² with ITO(100 Å), a second glass substrate with Ag(1,000 Å), and a third glass substrate from Corning 15 Ω/cm² with ITO(100 Å) was formed, and the substrates were cut to a size of 50 mm×50 mm×0.7 mm, sonicated with isopropyl alcohol and pure water each for 5 minutes, and then cleaned by exposure to ultraviolet rays and ozone for 30 minutes, respectively. Then, the first to third glass substrates were sequentially stacked in a vacuum deposition apparatus.

HT3 and HAT-CN were deposited on the anode at a ratio of 9:1 to form a hole injection layer having a thickness of 100 Å.

TCTA (100 Å), HAT-CN (50 Å), and NPB (100 Å) were sequentially deposited on the hole injection layer to form a hole transport layer.

HT1 was deposited on the hole transport layer to form an HT-auxiliary layer having a thickness of 100 Å, ADN and DPAVBi (an amount of DPAVBi was 5 wt %) were co-deposited to form an emission layer having a thickness of 200 Å, and BAlq was deposited to form an ET-auxiliary layer having a thickness of 50 Å.

BIPO and LiQ were deposited on the ET-auxiliary layer at a ratio of 5:5 to form an electron transport layer having a thickness of 200 Å, and Yb was deposited to form an electron injection layer having a thickness of 13 Å, thereby forming an electron transport region.

AgMg was deposited on the electron transport region to form a cathode having a thickness of 85 Å, and CP1 was deposited on the cathode to a thickness of 700 Å, thereby completing the manufacture of an organic light-emitting device.

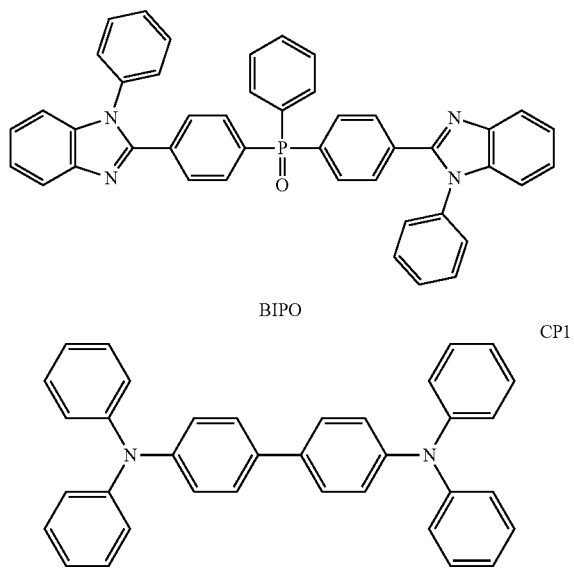

BIPO

CP1

Comparative Example 2

As a substrate and an anode, a first glass substrate from Corning 15 Ω/cm² with ITO(100 Å), a second glass substrate with Ag(1,000 Å), and a third glass substrate from Corning 15 Ω/cm² with ITO(100 Å), and the substrates were cut to a size of 50 mm×50 mm×0.7 mm, sonicated with isopropyl alcohol and pure water each for 5 minutes, and then cleaned by exposure to ultraviolet rays and ozone for 30 minutes, respectively. Then, the first to third glass substrates were sequentially stacked in a vacuum deposition apparatus.

HT3 and HAT-CN were deposited on the anode at a ratio of 9:1 to form a hole injection layer having a thickness of 100 Å.

TCTA (100 Å), HAT-CN (50 Å), and NPB (100 Å) were sequentially deposited on the hole injection layer to form a hole transport layer.

m-MTDATA was deposited on the hole transport layer to form a first HT-auxiliary layer having a thickness of 100 Å, ADN and DPAVBi (an amount of DPAVBi was 5 wt %) were co-deposited to form a first emission layer having a thickness of 200 Å, and BAlq was deposited to form a first ET-auxiliary layer having a thickness of 50 Å. BIPO and LiQ were deposited on the first ET-auxiliary layer at a ratio of 5:5 to form an electron transport layer having a thickness of 200 Å, thereby forming a first light-emitting unit.

BCP and Yb (an amount of Yb was 1 wt %) were co-deposited on the first light-emitting unit to form an n-type charge generation layer having a thickness of 150 Å, and HT3:HAT-CN (an amount of HAT-CN was 10 wt %, 100 Å) were deposited to form a p-type charge generation layer, thereby forming a charge generation layer.

HT3 was deposited on the charge generation layer to form a second HT-auxiliary layer having a thickness of 190 Å, ADN and DPAVBi (an amount of DPAVBi was 5 wt %) were co-deposited to form a second emission layer having a thickness of 200 Å, and BAlq was deposited to form a second ET-auxiliary layer having a thickness of 50 Å.

BIPO and LiQ were deposited on the second ET-auxiliary layer at a ratio of 5:5 to form an electron transport layer having a thickness of 50 Å, and Yb was deposited to form an electron injection layer having a thickness of 13 Å, thereby forming an electron transport region, and thereby forming a second light-emitting unit.

AgMg was deposited on the electron transport region to form a cathode having a thickness of 85 Å, and CP1 was deposited on the cathode to a thickness of 700 Å, thereby completing the manufacture of an organic light-emitting device.

Comparative Example 3

As a substrate and an anode, a first glass substrate from Corning 15 Ω/cm² with ITO(100 Å) was formed, a second glass substrate with Ag(1,000 Å) was formed, and a third glass substrate from Corning 15 Ω/cm² with ITO(100 Å) was formed, and the substrates were cut to a size of 50 mm×50 mm×0.7 mm, sonicated with isopropyl alcohol and pure water each for 5 minutes, and then cleaned by exposure to ultraviolet rays and ozone for 30 minutes, respectively. Then, the first to third glass substrates were sequentially stacked in a vacuum deposition apparatus.

HT3 and HAT-CN were deposited on the anode at a ratio of 9:1 to form a hole injection layer having a thickness of 100 Å.

TCTA (100 Å), HAT-CN (50 Å), and NPB (100 Å) were sequentially deposited on the hole injection layer to form a hole transport layer.

m-MTDATA was deposited on the hole transport layer to form a first HT-auxiliary layer having a thickness of 100 Å, ADN and DPAVBi (an amount of DPAVBi was 5 wt %) were co-deposited to form a first emission layer having a thickness of 200 Å, and BAlq was deposited to form a first ET-auxiliary layer having a thickness of 50 Å. BIPO and LiQ were deposited on the first ET-auxiliary layer at a ratio of 5:5 to form an electron transport layer having a thickness of 200 Å, thereby forming a first light-emitting unit.

BCP and Yb (an amount of Yb was 1 wt %) were co-deposited on the first light-emitting unit to form an n-type charge generation layer having a thickness of 150 Å, and HT3:HAT-CN (an amount of HAT-CN was 10 wt %, 100 Å) were co-deposited to form a p-type charge generation layer, thereby forming a first charge generation layer.

m-MTDATA was deposited on the first charge generation layer to form a second HT-auxiliary layer having a thickness of 100 Å, ADN and DPAVBi (an amount of DPAVBi was 5 wt %) were co-deposited to form a second emission layer having a thickness of 200 Å, and BAlq was deposited to form a second ET-auxiliary layer having a thickness of 50 Å. BIPO and LiQ were deposited on the second ET-auxiliary layer at a ratio of 5:5 to form an electron transport layer having a thickness of 200 Å, thereby forming an electron transport region, and thereby forming a second light-emitting unit.

BCP and Yb (an amount of Yb was 1 wt %) were co-deposited on the second light-emitting unit to form an n-type charge generation layer having a thickness of 150 Å, and HT3:HAT-CN (10%, 100 Å) were deposited to form a p-type charge generation layer, thereby forming a second charge generation layer.

m-MTDATA was deposited on the second charge generation layer to form a third HT-auxiliary layer having a thickness of 100 Å, ADN and DPAVBi (an amount of DPAVBi was 5 wt %) were co-deposited to form a third emission layer having a thickness of 200 Å, and BAlq was deposited to form a third ET-auxiliary layer having a thickness of 50 Å. BIPO and LiQ were deposited on the third ET-auxiliary layer at a ratio of 5:5 to a thickness of 200 Å, thereby forming an electron transport layer, and Yb was deposited to form an electron injection layer having a thickness of 13 Å, thereby forming an electron transport region, and thereby forming a third light-emitting unit.

AgMg was deposited on the electron transport region to form a cathode having a thickness of 85 Å, and CP1 was deposited on the cathode to a thickness of 700 Å, thereby completing the manufacture of an organic light-emitting device.

Example 1

As a substrate and an anode, a first glass substrate from Corning 15 Ω/cm² with ITO(100 Å) was formed, a second glass substrate with Ag(1,000 Å) was formed, and a third glass substrate from Corning 15 Ω/cm² with ITO(100 Å) was formed, and the substrates were cut to a size of 50 mm×50 mm×0.7 mm, sonicated with isopropyl alcohol and pure water each for 5 minutes, and then cleaned by exposure to ultraviolet rays and ozone for 30 minutes, respectively. Then, the first to third glass substrates were sequentially stacked in a vacuum deposition apparatus.

HT3 and HAT-CN were deposited on the anode at a ratio of 9:1 to form a hole injection layer having a thickness of 100 Å.

TCTA (100 Å), HAT-CN (50 Å), and NPB (100 Å) were sequentially deposited on the hole injection layer to form a hole transport layer.

m-MTDATA was deposited on the hole transport layer to form a first HT-auxiliary layer having a thickness of 100 Å, ADN and DPAVBi (an amount of DPAVBi was 5 wt %) were co-deposited to form a first emission layer having a thickness of 200 Å, BAlq was deposited to form a first ET-auxiliary layer having a thickness of 50 Å, and Compound 1 and LiQ were deposited on the first ET-auxiliary layer at a ratio of 5:5 to form a first electron layer having a thickness of 200 Å, thereby forming a first light-emitting unit.

BCP and Yb (an amount of Yb was 1 wt %) were co-deposited on the first light-emitting unit to form an n-type charge generation layer having a thickness of 150 Å, and HT3 was deposited to form a p-type charge generation layer having a thickness of 100 Å, thereby forming a first charge generation layer.

In this case, a LUMO energy level difference between the first electron layer and the n-type charge generation layer was 0.15 eV.

HT3 was deposited on the first charge generation layer to form a second HT-auxiliary layer having a thickness of 190 Å, ADN and DPAVBi (an amount of DPAVBi was 5 wt %) were co-deposited to form a second emission layer having a thickness of 200 Å, BAlq was deposited to form a second ET-auxiliary layer having a thickness of 50 Å, and Compound 1 and LiQ were deposited on the first ET-auxiliary layer at a ratio of 5:5 to form a second electron transport layer having a thickness of 200 Å, thereby forming a second light-emitting unit.

BCP and Yb (an amount of Yb was 1 wt %) were co-deposited on the second light-emitting unit to form an n-type charge generation layer having a thickness of 150 Å, and HT3:HAT-CN (an amount of HAT-CN was 10 wt %, 100 Å) were deposited to form a p-type charge generation layer having a thickness of 100 Å, thereby forming a second charge generation layer.

HT3 was deposited on the second charge generation layer to form a third HT-auxiliary layer having a thickness of 190 Å, ADN and DPAVBi (an amount of DPAVBi was 5 wt %) were co-deposited to form a third emission layer having a thickness of 200 Å, and BAlq was deposited to form a third ET-auxiliary layer having a thickness of 50 Å.

Compound 101 and LiQ were deposited on the third ET-auxiliary layer at a ratio of 5:5 to form a third electron transport layer having a thickness of 50 Å, and Yb was deposited to form an electron injection layer having a thickness of 13 Å, thereby forming an electron transport region, and thereby forming a third light-emitting unit.

AgMg was deposited on the electron transport region to form a cathode having a thickness of 85 Å, CP1 was deposited on the cathode to a thickness of 700 Å, thereby completing the manufacture of an organic light-emitting device.

In this case, a LUMO energy level difference between the third electron transport layer and ADN included in the third emission layer was 0.2 eV.

Comparative Example 4

As a substrate and an anode, a first glass substrate form Corning 15 Ω/cm² with ITO(100 Å), a second glass substrate with Ag(100 Å), and a third glass substrate form Corning 15 Ω/cm² with ITO(100 Å), and the substrates were cut to a size of 50 mm×50 mm×0.7 mm, sonicated with isopropyl alcohol and pure water each for 5 minutes, and then cleaned by exposure to ultraviolet rays and ozone for 30 minutes, respectively. Then, the first to third glass substrates were sequentially stacked in a vacuum deposition apparatus.

HT3 and HAT-CN were deposited on the anode at a ratio of 9:1 to form a hole injection layer having a thickness of 100 Å.

TCTA (100 Å), HAT-CN (50 Å), and NPB (100 Å) were sequentially deposited on the hole injection layer to form a hole transport layer.

m-MTDATA was deposited on the hole transport layer to form a first HT-auxiliary layer having a thickness of 100 Å, ADN and DPAVBi (an amount of DPAVBi was 5 wt %) were co-deposited to form a first emission layer having a thickness of 200 Å, BAlq was deposited to form a first ET-auxiliary layer having a thickness of 50 Å, and anthracene derivatives and LiQ were deposited on the first ET-auxiliary layer at a ratio of 5:5 to form an electron transport region having a thickness of 200 Å, thereby forming a first light-emitting unit.

Anthracene derivatives and Yb (an amount of Yb was 1 wt %) were co-deposited on the first light-emitting unit to form an n-type charge generation layer having a thickness of 150 Å, and HT3 was deposited to form a p-type charge generation layer having a thickness of 100 Å, thereby forming a first charge generation layer.

In this case, a LUMO energy level difference between the first ET-auxiliary layer and the n-type charge generation layer was 0.03 eV.

HT3 was deposited on the first charge generation layer to form a second HT-auxiliary layer having a thickness of 190 Å, ADN and DPAVBi (an amount of DPAVBi was 5 wt %) were co-deposited to form a second emission layer having a thickness of 200 Å, and BAlq was deposited to form a second ET-auxiliary layer having a thickness of 50 Å.

Compound 101 and LiQ were deposited on the second ET-auxiliary layer at a ratio of 5:5 to form an electron transport layer having a thickness of 50 Å, and Yb was deposited to form an electron injection layer having a thickness of 13 Å, thereby forming an electron transport region, and thereby forming a third light-emitting unit.

AgMg was deposited on the electron transport region to form a cathode having a thickness of 85 Å, and CP1 was deposited on the cathode to a thickness of 700 Å, thereby completing the manufacture of an organic light-emitting device.

Comparative Example 5

An organic light-emitting device was manufactured in substantially the same manner as in Example 1, except that ET1 was used instead of compound 1 to form the first electron transport layer. In this case, a LUMO absolute value difference between the first electron transport layer and the n-type charge generation layer was 0.4 eV.

Evaluation Example 1

Figure 3:
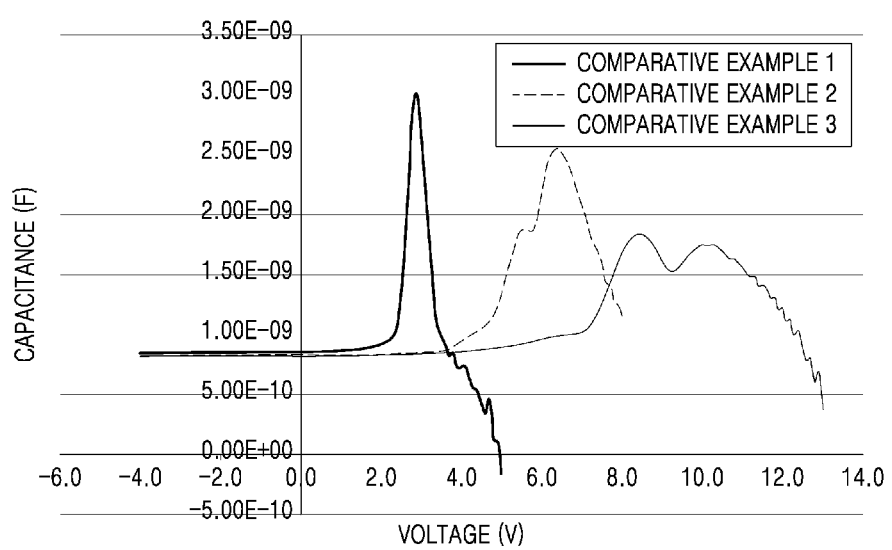
FIG. 3 is a capacitance-voltage graph of organic light-emitting devices manufactured according to Comparative Examples 1 to 3.
Figure 5:
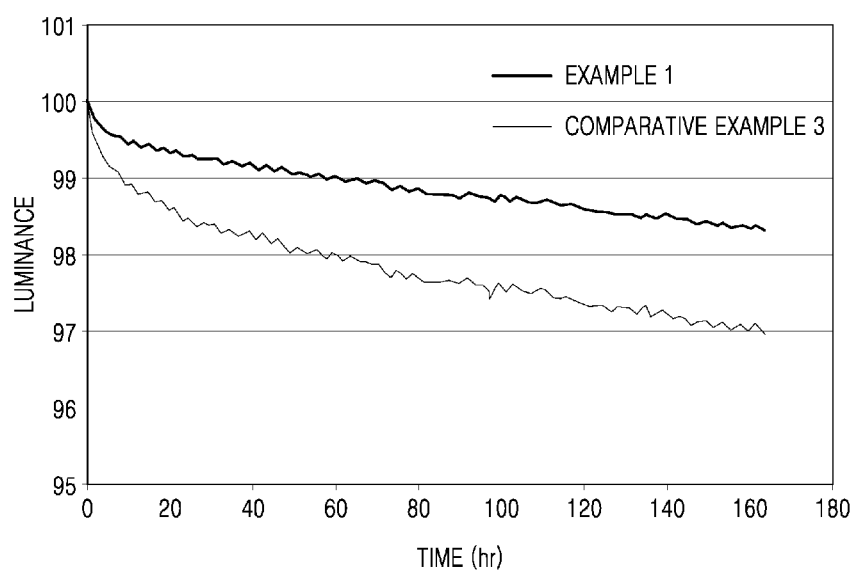
FIG. 5 is a graph showing lifespan of organic light-emitting devices manufactured according to Example 1 and Comparative Example 3.
Figure 6:
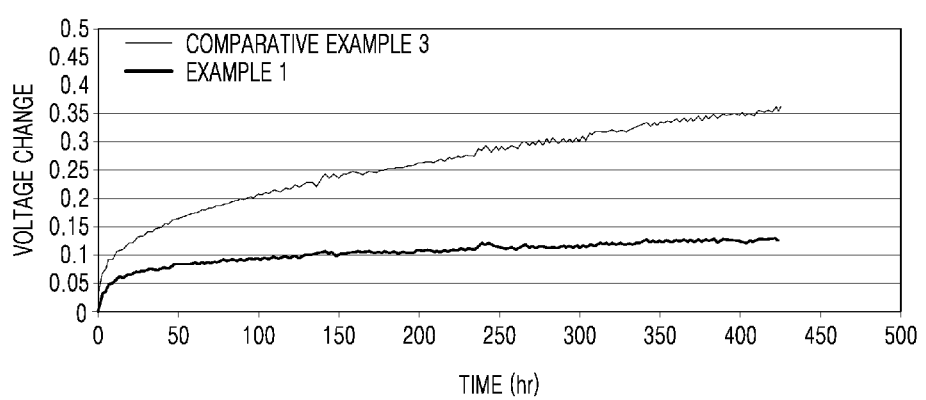
FIG. 6 is a graph showing a change in driving voltage at room temperature over time in organic light-emitting devices manufactured according to Example 1 and Comparative Example 3.
Figure 7:
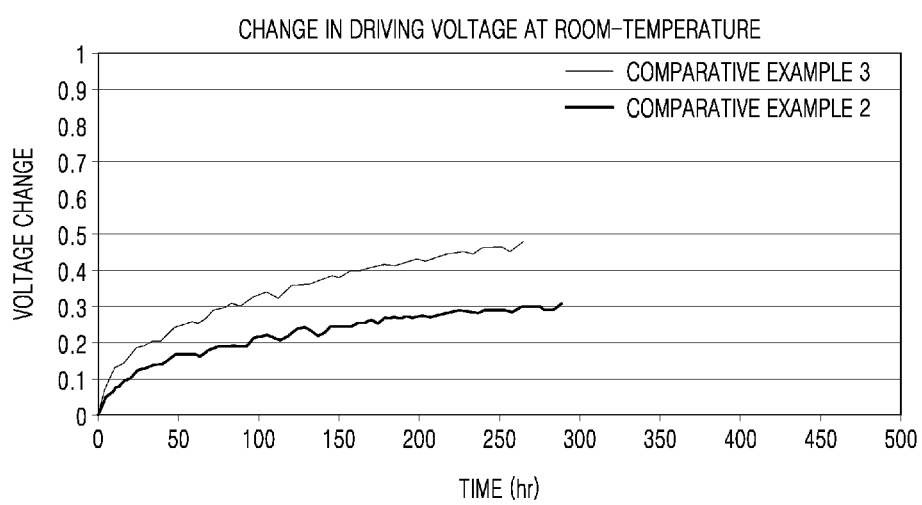
FIG. 7 is a graph showing a change in driving voltage at room temperature over time in organic light-emitting devices manufactured according to Comparative Example 2 and Comparative Example 3.

The capacitance-voltage of each of the organic light-emitting devices manufactured according to Example 1 and Comparative Examples 1 to 5 was measured, and results thereof are illustrated in FIGS. 3 and 4, and the driving voltage (V), the efficiency (cd/A) and the luminance (nit) at the same voltage (10.5 V) were measured, and results thereof are shown in FIGS. 5 to 7 and Table 1.

TABLE 1

| | Driving voltage (V) | Efficiency (cd/A) | luminance (nit) |
|---|---|---|---|
| Comparative Example 3 | 10.4 | 29.8 | 2,000 nit |
| Example 1 | 10.2 | 32.3 | 2,000 nit |
| Comparative Example 4 | 10.2 | 32.2 | 2,000 nit |
| Comparative Example 5 | 10.6 | 34.5 | 2,000 nit |

Referring to FIG. 3, in the case of the devices of Comparative Examples 2 and 3, inflection points not shown in the single device of Comparative Example 1 show that the balance of charges injected from individual charge generation layers has a non-uniform state.

Referring to FIG. 4 together, in the case of the organic light-emitting device of Example 1, it is confirmed that the charge balance is improved due to the application of initial injection characteristics at 6 V to 7 V and improved injection characteristics after 8.5 V. Furthermore, both initial injection characteristics at 6 V to 7 V and driving voltage characteristics after 8.5 V in which recombination is shown are improved.

Referring to FIGS. 5 and 6 and Table 1, the organic light-emitting device of Example 1 may have a low driving voltage and excellent efficiency, as compared with the organic light-emitting devices of Comparative Examples 3 to 5.

Referring to FIG. 7, it is confirmed that, as the number of charge generation layers increases, device instability increases, and thus, a difference in driving voltage change over time occurs.

Therefore, in order to eliminate (or reduce) such device instability, it is necessary (or desired) to ensure appropriateness of the configuration of each electron transport region as described in the present disclosure. The configuration according to one or more embodiments may improve the instability of the characteristics of electron injection occurring from the charge generation layer, thereby improving both the efficiency and the lifespan of the device.

The organic light-emitting device may have a low driving voltage, a high efficiency, and a long lifespan.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims and their equivalents.

What is claimed is:

1. An organic light-emitting device comprising:
   a first electrode;
   a second electrode facing the first electrode;
   light-emitting units in a number of m between the first electrode and the second electrode; and
   charge generation layers in a number of m−1 respectively between each pair of adjacent light-emitting units among the light-emitting units in the number of m, each charge generation layer comprising an n-type charge generation layer and a p-type charge generation layer,
   wherein m is an integer of 3 or more,
   the light-emitting units in the number of m each comprise a hole transport region, an emission layer, and an electron transport region, which are sequentially stacked,
   the electron transport regions in a number of m comprised in the light-emitting units in the number of m each comprise an electron transport material, and
   the electron transport materials in a number of m comprised in the electron transport regions in the number of m are each independently selected from a first compound, a second compound, and a third compound, and
   the first compound is selected from Compounds 1 to 17, the second compound is selected from Compounds 101 to 120, and the third compound is represented by Formula 3:

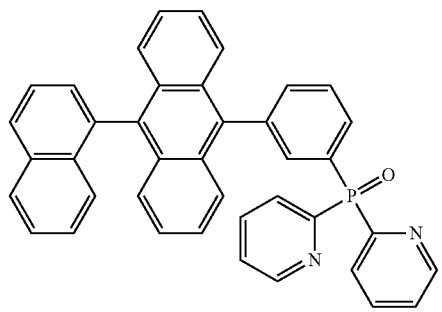

1

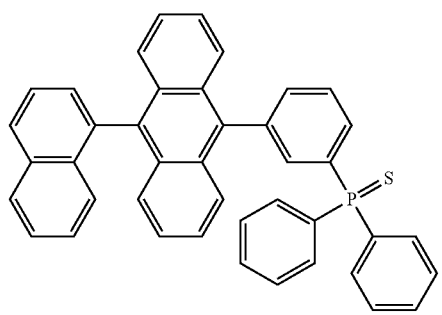

2

-continued

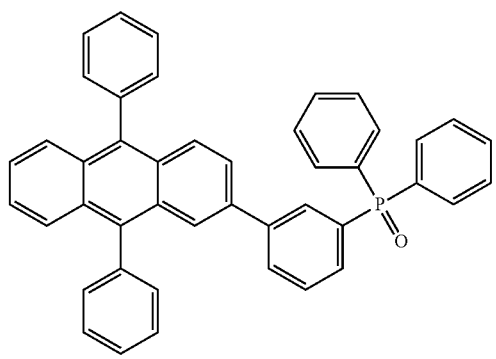

3

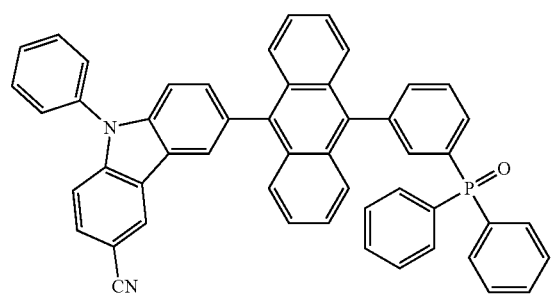

4

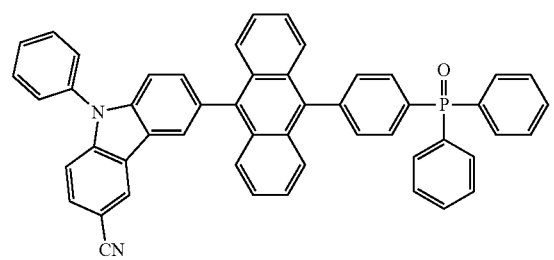

5

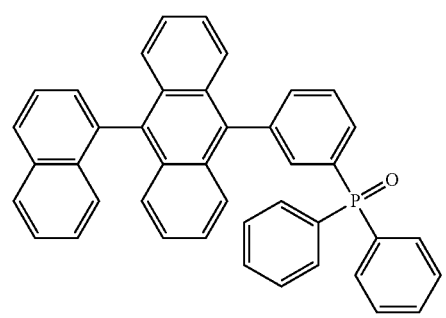

6

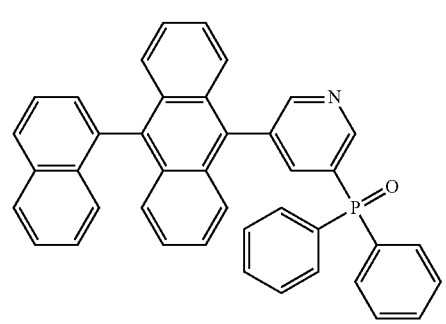

7

8
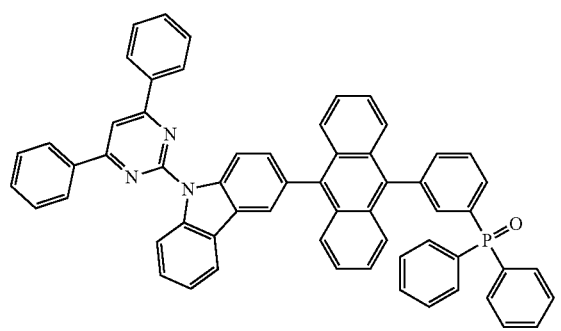
9
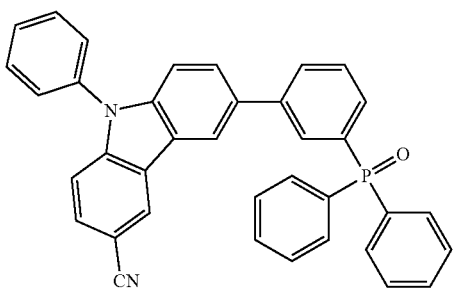
10
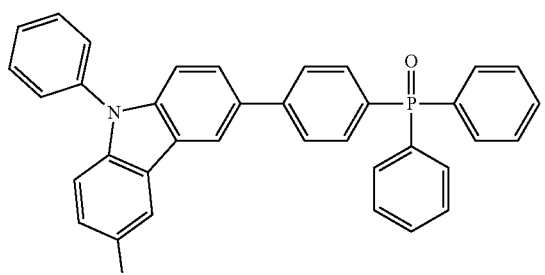
11
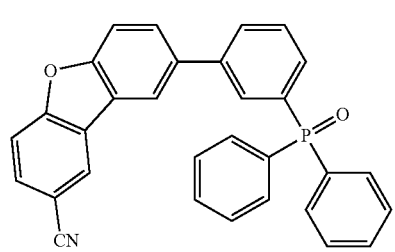
12
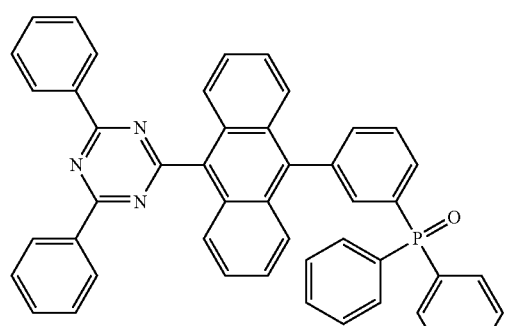
13
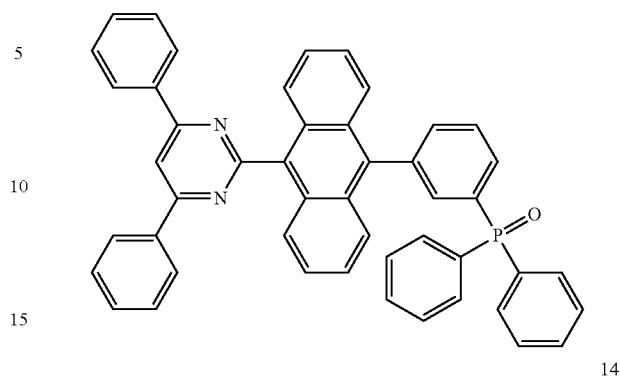
14
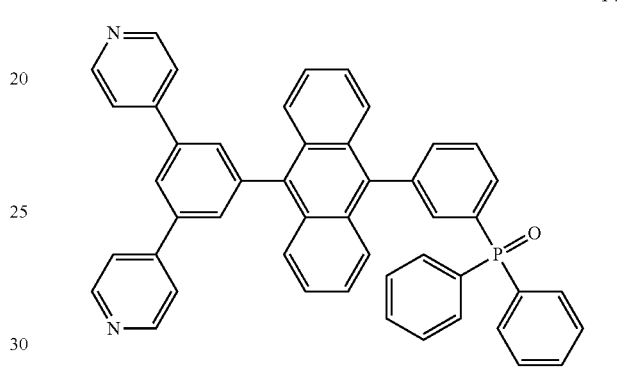
15
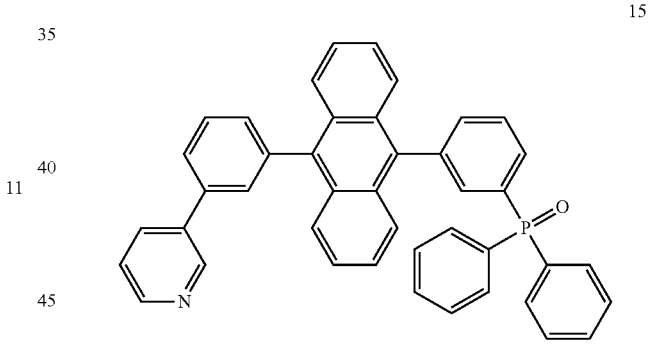
16
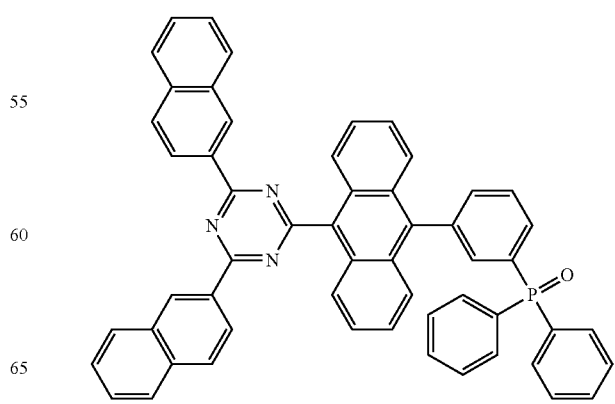

17
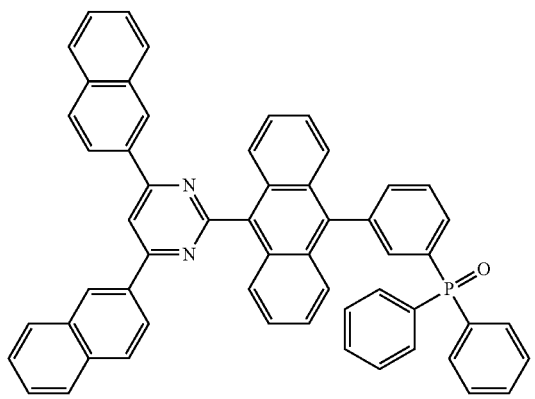
101
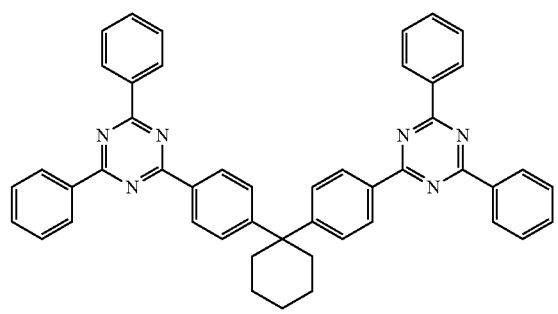
102
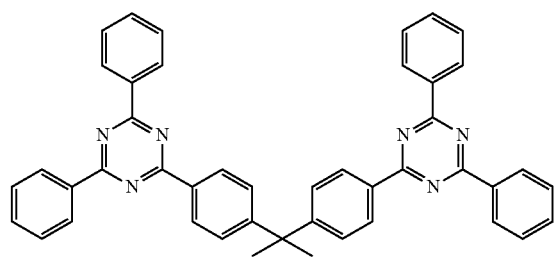
103
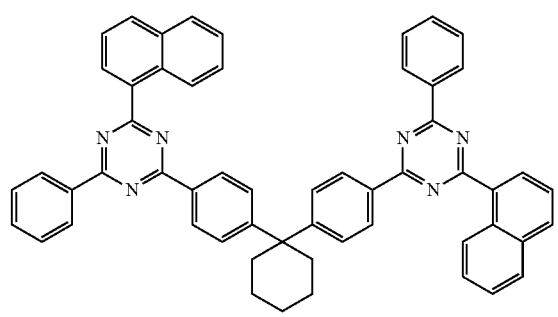
104
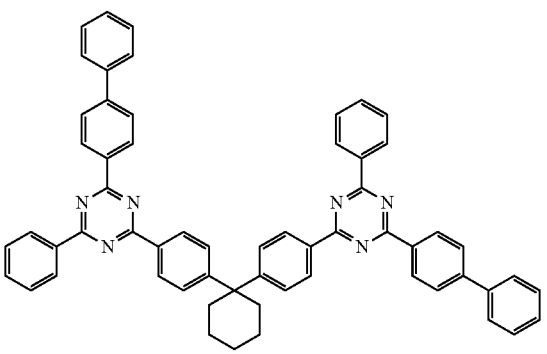
105
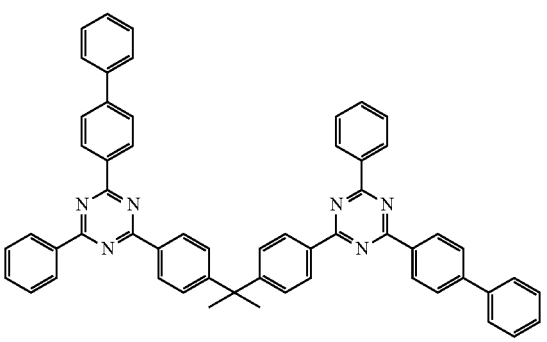
106
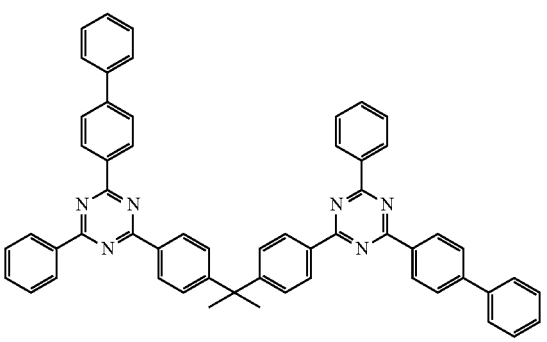
107
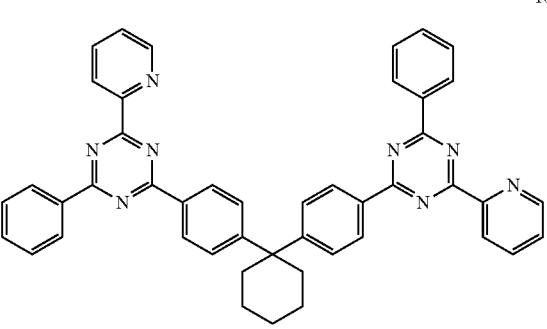

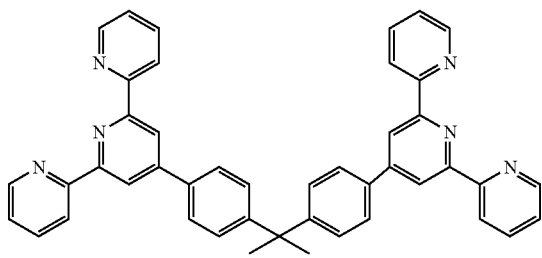
108
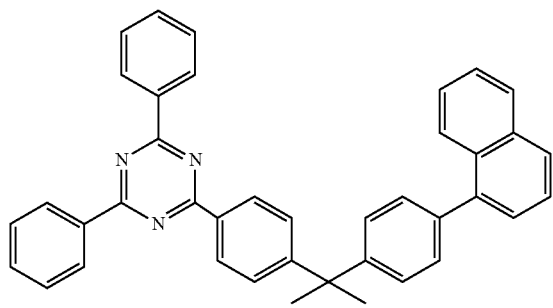
109
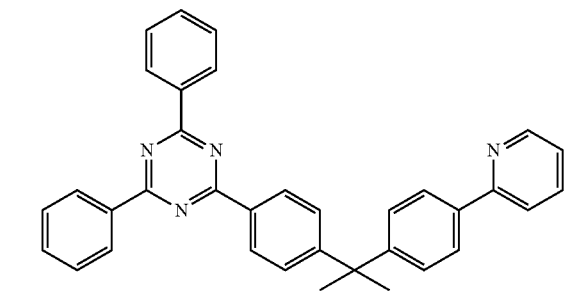
110
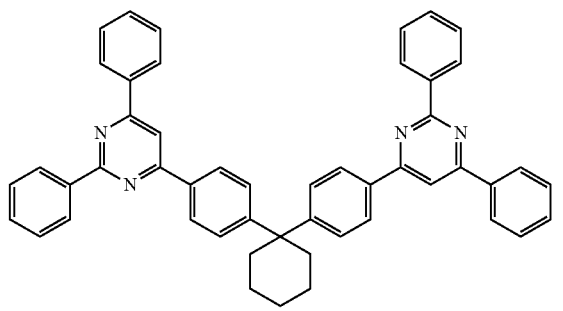
111
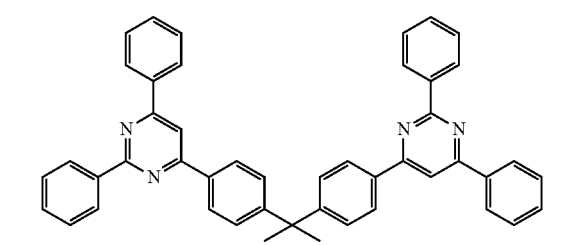
112
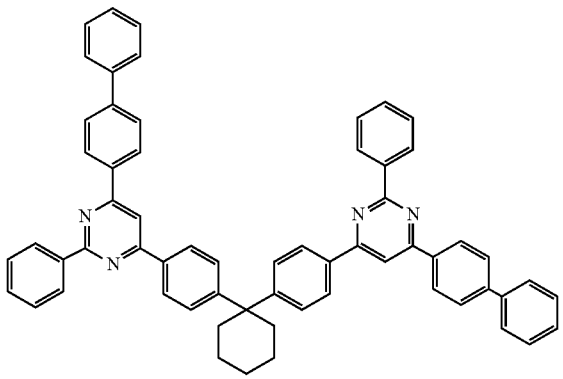
113
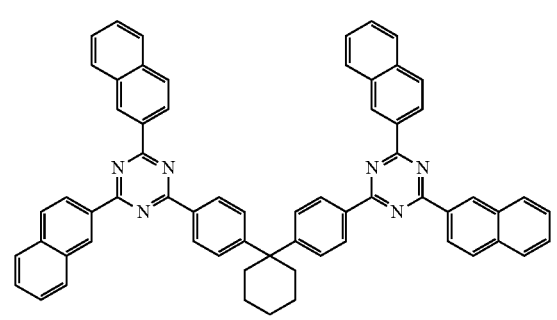
114
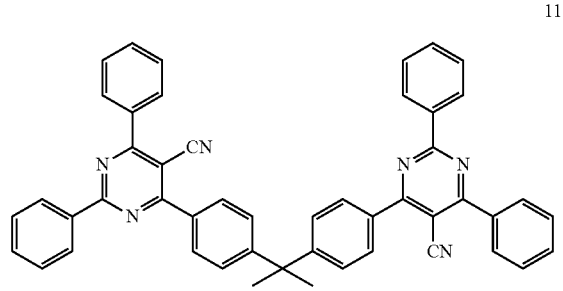
115
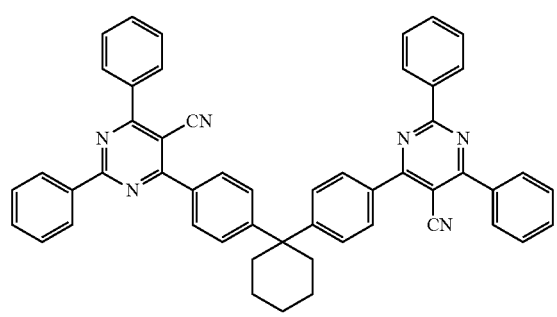
116
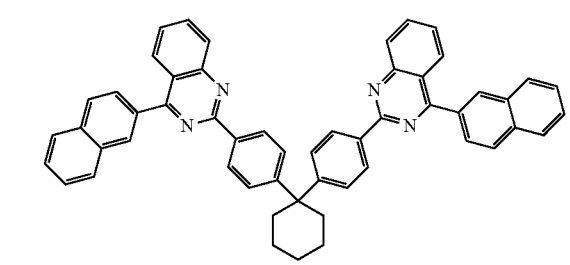
117

-continued

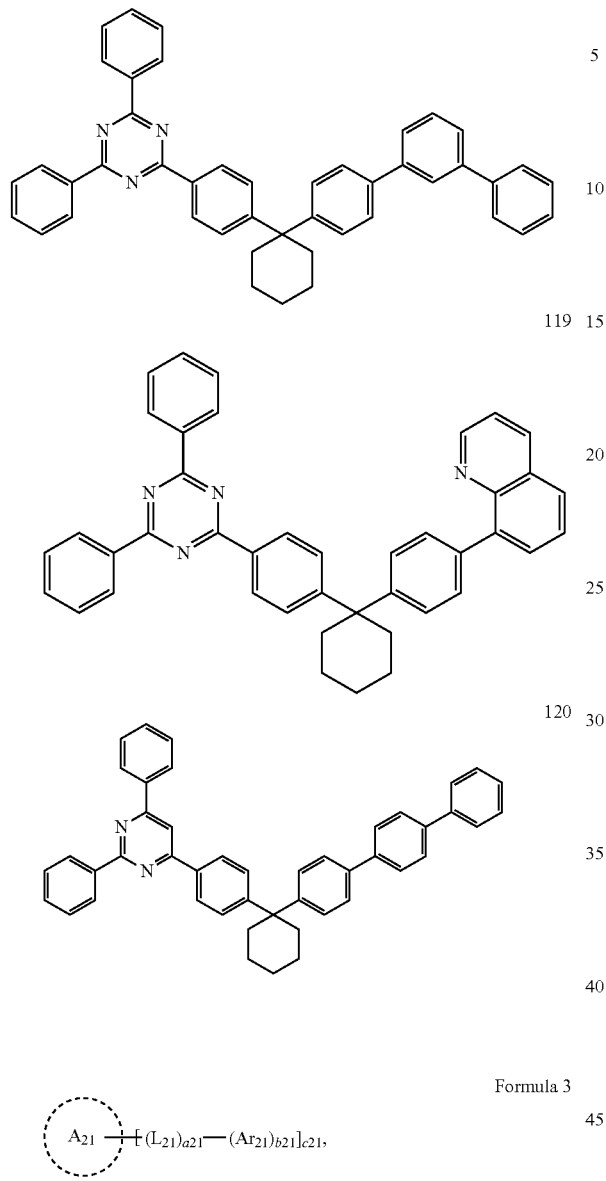

Formula 3

$$A_{21} \text{---}[(L_{21})_{a21}\text{---}(Ar_{21})_{b21}]_{c21},$$

and
wherein in Formula 3,
$A_{21}$ is a π electron-depleted nitrogen-containing ring,
$L_{21}$ is a substituted or unsubstituted $C_5$-$C_{60}$ carbocyclic group or a substituted or unsubstituted $C_1$-$C_{60}$ heterocyclic group,
a21 is an integer selected from 0 to 5,
$Ar_{21}$ is a substituted or unsubstituted $C_5$-$C_{60}$ carbocyclic group or a substituted or unsubstituted $C_1$-$C_{60}$ heterocyclic group,
b21 is an integer selected from 1 to 5,
c21 is an integer selected from 0 to 20,
at least one substituent selected from the substituted $C_5$-$C_{60}$ carbocyclic group and the substituted $C_1$-$C_{60}$ heterocyclic group is selected from:
deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;
a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —B($Q_{11}$)($Q_{12}$), —C(=O)($Q_{11}$), —S(=O)$_2$($Q_{11}$), and —P(=O)($Q_{11}$)($Q_{12}$);
a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;
a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{21}$)($Q_{22}$)($Q_{23}$), —B($Q_{21}$)($Q_{22}$), —C(=O)($Q_{21}$), —S(=O)$_2$($Q_{21}$), and —P(=O)($Q_{21}$)($Q_{22}$); and
—Si($Q_{31}$)($Q_{32}$)($Q_{33}$), —B($Q_{31}$)($Q_{32}$), —C(=O)($Q_{31}$), —S(=O)$_2$($Q_{31}$), and —P(=O)($Q_{31}$)($Q_{32}$),
$Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, and
indicates a binding site to a neighboring atom.

2. The organic light-emitting device of claim 1, wherein an $m^{th}$ electron transport region among the electron transport regions in the number of m is between an m$^{th}$ emission layer and the second electrode, and an electron transport material comprised in the m$^{th}$ electron transport region is different from an electron transport material comprised in at least one electron transport region among the other electron transport regions.

3. The organic light-emitting device of claim 1, wherein L$_{21}$ is selected from:

a benzene group, a pentalene group, an indene group, a naphthalene group, an azulene group, a heptalene group, an indacene group, an acenaphthalene group, a fluorene group, a spiro-bifluorene group, a spiro-benzofluorene-fluorene group, a benzofluorene group, a dibenzofluorene group, a phenalene group, a phenanthrene group, an anthracene group, a fluoranthene group, a pyrene group, a chrysene group, a naphthacene group, a picene group, a perylene group, a pyrrole group, a thiophene group, a furan group, a silole group, an imidazole group, a pyrazole group, a thiazole group, an isothiazole group, an oxazole group, an isoxazole group, a pyridine group, a pyrazine group, a pyrimidine group, a pyridazine group, a triazine group, a benzofuran group, a benzothiophene group, a benzosilole group, a dibenzosilole group, a quinoline group, an isoquinoline group, a benzimidazole group, an imidazopyridine group, an imidazopyrimidine group, a carbazole group, a dibenzofuran group, a dibenzothiophene group, and a quinazoline group; and a benzene group, a pentalene group, an indene group, a naphthalene group, an azulene group, a heptalene group, an indacene group, an acenaphthalene group, a fluorene group, a spiro-bifluorene group, a spiro-benzofluorene-fluorene group, a benzofluorene group, a dibenzofluorene group, a phenalene group, a phenanthrene group, an anthracene group, a fluoranthene group, a pyrene group, a chrysene group, a naphthacene group, a picene group, a perylene group, a pyrrole group, a thiophene group, a furan group, a silole group, an imidazole group, a pyrazole group, a thiazole group, an isothiazole group, an oxazole group, an isoxazole group, a pyridine group, a pyrazine group, a pyrimidine group, a pyridazine group, a triazine group, a benzofuran group, a benzothiophene group, a benzosilole group, a dibenzosilole group, a quinoline group, an isoquinoline group, a benzimidazole group, an imidazopyridine group, an imidazopyrimidine group, a carbazole group, a dibenzofuran group, a dibenzothiophene group, and a quinazoline group, each substituted with at least one selected from deuterium, —F, —Cl, —Br, —I, a hydroxyl group, a cyano group, a C$_1$-C$_{20}$ alkyl group, a C$_1$-C$_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thienyl group, a furanyl group, a pyridinyl group, a pyrazinyl group, a pyrimidinyl group, a pyridazinyl group, a quinolinyl group, an isoquinolinyl group, a benzofuranyl group, a benzothienyl group, a silolyl group, an imidazolyl group, a pyrazolyl group, a thiazolyl group, an isothiazolyl group, an oxazolyl group, an isoxazolyl group, a benzosilolyl group, a dibenzosilolyl group, —Si(Q$_{31}$)(Q$_{32}$)(Q$_{33}$), —N(Q$_{31}$)(Q$_{32}$), and —B(Q$_{31}$)(Q$_{32}$), wherein Q$_{31}$ to Q$_{33}$ are each independently selected from a C$_1$-C$_{20}$ alkyl group, a C$_1$-C$_{20}$ alkoxy group, a phenyl group, a biphenyl group, a terphenyl group, a naphthyl group, and a pyridinyl group.

4. The organic light-emitting device of claim 1, wherein Ar$_{21}$ is selected from:

a benzene group, a pentalene group, an indene group, a naphthalene group, an azulene group, a heptalene group, an indacene group, an acenaphthalene group, a fluorene group, a spiro-bifluorene group, a spiro-benzofluorene-fluorene group, a benzofluorene group, a dibenzofluorene group, a phenalene group, a phenanthrene group, an anthracene group, a fluoranthene group, a pyrene group, a chrysene group, a naphthacene group, a picene group, a perylene group, a pyrrole group, a thiophene group, a furan group, a silole group, an imidazole group, a pyrazole group, a thiazole group, an isothiazole group, an oxazole group, an isoxazole group, a pyridine group, a pyrazine group, a pyrimidine group, a pyridazine group, a triazine group, a benzofuran group, a dibenzofuran group, a benzothiophene group, a benzosilole group, a dibenzosilole group, a quinoline group, an isoquinoline group, a quinazoline group, a benzimidazole group, an imidazopyridine group, and an imidazopyrimidine group; and a benzene group, a pentalene group, an indene group, a naphthalene group, an azulene group, a heptalene group, an indacene group, an acenaphthalene group, a fluorene group, a spiro-bifluorene group, a spiro-benzofluorene-fluorene group, a benzofluorene group, a dibenzofluorene group, a phenalene group, a phenanthrene group, an anthracene group, a fluoranthene group, a pyrene group, a chrysene group, a naphthacene group, a picene group, a perylene group, a pyrrole group, a thiophene group, a furan group, a silole group, an imidazole group, a pyrazole group, a thiazole group, an isothiazole group, an oxazole group, an isoxazole group, a pyridine group, a pyrazine group, a pyrimidine group, a pyridazine group, a triazine group, a benzofuran group, a dibenzofuran group, a benzothiophene group, a benzosilole group, a dibenzosilole group, a quinoline group, an isoquinoline group, a quinazoline group, a benzimidazole group, an imidazopyridine group, and an imidazopyrimidine group, each substituted with at least one selected from deuterium, —F, —Cl, —Br, —I, a hydroxyl group, a cyano group, a C$_1$-C$_{20}$ alkyl group, a C$_1$-C$_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thienyl group, a furanyl group, a pyridinyl group, a pyrazinyl group, a pyrimidinyl group, a pyridazinyl group, a quinolinyl group, an isoquinolinyl group, a benzofuranyl group, a benzothienyl group, —Si($Q_{31}$)($Q_{32}$)($Q_{33}$), —N($Q_{31}$)($Q_{32}$), and —B($Q_{31}$)($Q_{32}$), wherein $Q_{31}$ to $Q_{33}$ are each independently selected from a $C_1$-$C_{20}$ alkyl group, a $C_1$-$C_{20}$ alkoxy group, a phenyl group, a biphenyl group, a terphenyl group, a naphthyl group, and a pyridinyl group.

5. The organic light-emitting device of claim 1, wherein $A_{21}$ is selected from a pyridine group, a pyrimidine group, a pyrazine group, a triazine group, an aziridine group, an imidazole group, an indole group, an isoindole group, a purine group, a quinoline group, a quinazoline group, a phenothiazine group, an acridine group, a phenazine group, a phenanthroline group, a carbazole group, an oxadiazole group, a triazole group, an imidazole group, and a benzimidazole group.

6. The organic light-emitting device of claim 1, wherein
i) one electron transport material among the electron transport materials in the number of m is the second compound, and the other electron transport materials are the first compound;
ii) one electron transport material among the electron transport materials in the number of m is the first compound, and the other electron transport materials are the second compound;
iii) each of the electron transport materials in the number of m is the third compound, wherein one electron transport material among the electron transport materials comprises a triazine group, and the other electron transport materials comprise a carbazole group; or
iv) each of the electron transport materials in the number of m is the third compound, wherein one electron transport material among the electron transport materials comprises a carbazole group, and the other electron transport materials comprise a triazine group.

7. The organic light-emitting device of claim 1, wherein an $m^{th}$ electron transport region among the electron transport regions in the number of m is between an $m^{th}$ emission layer and the second electrode, and
an absolute value of a lowest unoccupied molecular orbital energy level of the $m^{th}$ electron transport region is in a range between an absolute value of a lowest unoccupied molecular orbital energy level of a host comprised in the $m^{th}$ emission layer and an absolute value of a work function of an inorganic material comprised in the second electrode.

8. The organic light-emitting device of claim 7, wherein the absolute value of the lowest unoccupied molecular orbital energy level of the $m^{th}$ electron transport region and the absolute value of the lowest unoccupied molecular orbital energy level of the host satisfy Equation 1:

$$||E_{LUMO\_ETL(m)}|-|E_{LUMO\_Host}||\le 0.2 \text{ eV}. \qquad \text{Equation 1}$$

wherein, in Equation 1, $|E_{LUMO\_ETL(m)}|$ is the absolute value of the lowest unoccupied molecular orbital energy level of the $m^{th}$ electron transport region, and $|E_{Lumo\_Host}|$ the absolute value of the lowest unoccupied molecular orbital energy level of the host.

9. The organic light-emitting device of claim 1, wherein an $n^{th}$ charge generation layer among the charge generation layers in the number of m−1 is between an electron transport region of an $n^{th}$ light-emitting unit and a hole transport region of an $(n+1)^{th}$ light-emitting unit among the light-emitting units in the number of m, and
n is an integer selected from 1 to m−1.

10. The organic light-emitting device of claim 9, wherein an absolute value of a lowest unoccupied molecular orbital energy level of the electron transport region of the $n^{th}$ light-emitting unit and an absolute value of a lowest unoccupied molecular orbital energy level of the $n^{th}$ charge generation layer satisfy Equation 2:

$$||E_{LUMO\_ETL(n)}|-|E_{LUMO\_CGL(n)}||\le 0.15 \text{ eV}. \qquad \text{Equation 2}$$

wherein, in Equation 2, $|E_{LUMO\_ETL(n)}|$ is the absolute value of the lowest unoccupied molecular orbital energy level of the electron transport region of the nthlight-emitting unit, and $|E_{Lumo\_CGL(n)}|$ is the absolute value of the lowest unoccupied molecular orbital energy level of the $n^{th}$ charge generation layer.

11. The organic light-emitting device of claim 1, wherein the hole transport regions in a number of m among the light-emitting units in the number of m each independently comprise a hole injection layer, a hole transport layer, an electron blocking layer, or any combination thereof, and
the electron transport regions in the number of m each independently comprise a hole blocking layer, an electron transport layer, an electron injection layer, a buffer layer, or any combination thereof.

12. The organic light-emitting device of claim 1, wherein m is 3 or 4.

13. The organic light-emitting device of claim 1, wherein the first electrode is an anode,
the second electrode is a cathode,
the organic light-emitting device further comprises:
an $m^{th}$ light-emitting unit between the first electrode and the second electrode;
an $(m-1)^{th}$ light-emitting unit between the first electrode and the $m^{th}$ light-emitting unit; and
an $(m-1)^{th}$ charge generation layer between the $m^{th}$ light-emitting unit and the $(m-1)^{th}$ light-emitting unit,
the $m^{th}$ light-emitting unit comprises an $m^{th}$ emission layer,
the $(m-1)^{th}$ light-emitting unit comprises an $(m-1)^{th}$ emission layer,
the organic light-emitting device further comprises an $(m-1)^{th}$ hole transport region between the first electrode and the $(m-1)^{th}$ emission layer, the organic light-emitting device further comprises an $(m-1)^{th}$ electron transport region between the $(m-1)^{th}$ emission layer and the $(m-1)^{th}$ charge generation layer,
the organic light-emitting device further comprises an $m^{th}$ hole transport region between the $(m-1)^{th}$ charge generation layer and the $m^{th}$ emission layer,
the organic light-emitting device further comprises an $m^{th}$ electron transport region between the $m^{th}$ emission layer and the second electrode,
an electron transport material comprised in the $m^{th}$ electron transport region is different from the electron transport material comprised in the $(m-1)^{th}$ electron transport region,
the $(m-1)^{th}$ and $m^{th}$ hole transport regions each comprise a hole injection layer, a hole transport layer, an electron blocking layer, or any combination thereof, and
the $(m-1)^{th}$ and $m^{th}$ electron transport regions each comprise a hole blocking layer, an electron transport layer, an electron injection layer, a buffer layer, or any combination thereof.

14. The organic light-emitting device of claim 1, wherein the light-emitting units in the number of m are to emit blue light having a maximum emission wavelength of about 440 nm or more and about 490 nm or less.

15. A flat display apparatus comprising: a thin-film transistor comprising a source electrode, a drain electrode, and an activation layer; and the organic light-emitting device of claim 1, wherein the first electrode of the organic light-emitting device is in electrical connection with one of the source electrode and the drain electrode of the thin-film transistor.

\* \* \* \* \*